US012813144B2

(12) United States Patent
Ikeda et al.

(10) Patent No.: US 12,813,144 B2
(45) Date of Patent: Nov. 24, 2026

(54) DISPLAY APPARATUS AND ELECTRONIC DEVICE

(71) Applicant: Semiconductor Energy Laboratory Co., Ltd., Kanagawa-ken (JP)

(72) Inventors: Hisao Ikeda, Zama (JP); Daiki Nakamura, Atsugi (JP); Ryo Hatsumi, Hadano (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 265 days.

(21) Appl. No.: 18/294,845

(22) PCT Filed: Jul. 26, 2022

(86) PCT No.: PCT/IB2022/056863
§ 371 (c)(1),
(2) Date: Feb. 2, 2024

(87) PCT Pub. No.: WO2023/012578
PCT Pub. Date: Feb. 9, 2023

(65) Prior Publication Data

US 2024/0334791 A1 Oct. 3, 2024

(30) Foreign Application Priority Data

Aug. 5, 2021 (JP) ................................ 2021-129082

(51) Int. Cl.
*H10K 59/80* (2023.01)
*H10K 59/65* (2023.01)

(52) U.S. Cl.
CPC .......... *H10K 59/879* (2023.02); *H10K 59/65* (2023.02)

(58) Field of Classification Search
CPC ...... H10K 59/879; H10K 59/65; H10K 50/00; H10K 59/00; H10K 30/81; H10K 39/34;
(Continued)

(56) References Cited

U.S. PATENT DOCUMENTS 8,344,603 B2 1/2013 Sakaguchi et al.
11,588,137 B2 2/2023 Yamazaki et al.
(Continued)

FOREIGN PATENT DOCUMENTS

CN 102376742 A 3/2012
CN 109950291 A 6/2019
(Continued)

OTHER PUBLICATIONS

International Search Report (Application No. PCT/IB2022/056863), dated Oct. 11, 2022.
Written Opinion (Application No. PCT/IB2022/056863), dated Oct. 11, 2022.

*Primary Examiner* — Joe E. Schoenholtz
(74) *Attorney, Agent, or Firm* — Husch Blackwell LLP

(57) ABSTRACT

A display apparatus with high display quality is provided. The display apparatus includes a light-emitting device, a light-receiving device, a first plano-convex lens, and a second plano-convex lens. The light-emitting device and the first plano-convex lens have an overlap region. The light-receiving device and the second plano-convex lens have an overlap region. The light-emitting device and the light-receiving device each include a pair of electrodes and an organic compound provided between the pair of electrodes. One of the pair of electrodes is a conductive film having a light-transmitting property with respect to visible light. The first plano-convex lens and the second plano-convex lens are provided so that a surface opposite to a convex surface is in
(Continued)

contact with the conductive film. A refractive index of the plano-convex lenses is greater than a refractive index of the conductive film.

12 Claims, 37 Drawing Sheets

(58) Field of Classification Search
CPC ............. H10K 59/122; H10K 59/8051; H10K 59/80524; G09F 9/30; H05B 33/02; H05B 33/12; H05B 33/22; H05B 33/28
See application file for complete search history.

(56) References Cited

U.S. PATENT DOCUMENTS

| | | | | |
|---|---|---|---|---|
| 11,659,728 | B2 * | 5/2023 | Yuan | H10K 59/879 257/40 |
| 12,063,802 | B2 | 8/2024 | Kubota et al. | |
| 2012/0032590 | A1 | 2/2012 | Sakaguchi et al. | |
| 2019/0006630 | A1 * | 1/2019 | Chen | H10K 59/35 |
| 2019/0341581 | A1 | 11/2019 | Chang et al. | |
| 2020/0227600 | A1 | 7/2020 | Watanabe et al. | |
| 2020/0321559 | A1 | 10/2020 | Kong et al. | |
| 2020/0335723 | A1 * | 10/2020 | Yuan | H10K 59/40 |
| 2023/0200142 | A1 * | 6/2023 | Go | H10K 59/878 257/91 |
| 2024/0381745 | A1 | 11/2024 | Ikeda et al. | |

FOREIGN PATENT DOCUMENTS

| | | | |
|---|---|---|---|
| CN | 110429104 | A | 11/2019 |
| DE | 102019110412 | | 11/2019 |
| JP | 10-123980 | A | 5/1998 |
| JP | 10-172756 | A | 6/1998 |
| JP | 2001-135477 | A | 5/2001 |
| JP | 2004-039360 | A | 2/2004 |
| JP | 2007-280699 | A | 10/2007 |
| JP | 2011-048937 | A | 3/2011 |
| JP | 2012-059692 | A | 3/2012 |
| JP | 2013-008625 | A | 1/2013 |
| JP | 2013-114772 | A | 6/2013 |
| JP | 2020-101659 | A | 7/2020 |
| JP | 2020-177795 | A | 10/2020 |
| JP | 2020-177796 | A | 10/2020 |
| KR | 2006-0114086 | A | 11/2006 |
| WO | WO-2018/087625 | | 5/2018 |
| WO | WO-2021/074738 | | 4/2021 |

* cited by examiner

DISPLAY APPARATUS AND ELECTRONIC DEVICE

This application is a 371 of international application PCT/IB2022/056863 filed on Jul. 26, 2022, which is incorporated herein by reference.

TECHNICAL FIELD

One embodiment of the present invention relates to a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method of driving any of them, and a method of manufacturing any of them.

BACKGROUND ART

In recent years, display apparatuses have been used in various applications. Examples of uses for a large display apparatus include a television device for home use, digital signage, and a PID (Public Information Display). In addition, display apparatuses have been used for a smartphone, a tablet terminal, and the like each including a touch panel.

Furthermore, display apparatuses have been required to have higher resolution. For example, devices for virtual reality (VR), augmented reality (AR), substitutional reality (SR), or mixed reality (MR) are given as devices required by high-resolution display apparatuses and have been actively developed.

Light-emitting apparatuses including light-emitting devices (also referred to as light-emitting elements) have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

Patent Document 1 discloses a display apparatus using an organic EL device (also referred to as organic EL element) for VR.

In addition, some display apparatuses employ a structure where light from a light-emitting device is extracted through a micro lens to increase the light extraction efficiency. Patent Document 2 discloses a method for forming a micro lens using a radiation sensitive resin composition.

REFERENCE

Patent Document

[Patent Document 1] PCT International Publication No. 2018/087625

[Patent Document 2] Japanese Published Patent Application No. 2020-101659

SUMMARY OF THE INVENTION

Problems to be Solved by the Invention

An object of one embodiment of the present invention is to provide a display apparatus with high display quality. An object of one embodiment of the present invention is to provide a high-resolution display apparatus. An object of one embodiment of the present invention is to provide a high-definition display apparatus. An object of one embodiment of the present invention is to provide a high-luminance display apparatus. An object of one embodiment of the invention is to provide a display apparatus having an image capturing function. An object of one embodiment of the invention is to provide a display apparatus having an authentication function. An object of one embodiment of the present invention is to provide a highly reliable display apparatus.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a light-emitting device and a lens. The light-emitting device and the lens have an overlap region. The light-emitting device includes a pair of electrodes and an organic compound provided between the pair of electrodes. One of the pair of electrodes is a conductive film having a light-transmitting property with respect to visible light. The lens is provided in contact with the conductive film. A refractive index of the lens is greater than a refractive index of the conductive film.

The lens is a plano-convex lens and can be provided so that a surface opposite to a convex surface is in contact with the conductive film.

Another embodiment of the present invention is a display apparatus including a first light-emitting device, a second light-emitting device, a first lens, and a second lens. The first light-emitting device and the second light-emitting device are provided adjacent to each other. An organic insulating layer is provided in a region including a space between the first light-emitting device and the second light-emitting device. The first light-emitting device and the first lens have an overlap region. The second light-emitting device and the second lens have an overlap region. The first light-emitting device and the second light-emitting device each include a pair of electrodes and an organic compound provided between the pair of electrodes. One of the pair of electrodes is a common electrode formed over the organic compound and the organic insulating layer, and is a conductive film having a light-transmitting property with respect to visible light. The first lens and the second lens are provided in contact with the conductive film. Refractive indices of the first lens and the second lens are each greater than a refractive index of the conductive film.

Another embodiment of the present invention is a display apparatus including a light-emitting device, alight-receiving device, a first lens, and a second lens. The light-emitting device and the light-receiving device are provided adjacent to each other. An organic insulating layer is provided in a region including a space between the light-emitting device and the light-receiving device. The light-emitting device and the first lens have an overlap region. The light-receiving device and the second lens have an overlap region. The light-emitting device and the light-receiving device each include a pair of electrodes and an organic compound provided between the pair of electrodes. One of the pair of electrodes is a common electrode formed over the organic compound and the organic insulating layer, and is a conductive film having a light-transmitting property with respect to visible light. The first lens and the second lens are provided in contact with the conductive film. Refractive indices of the first lens and the second lens are each greater than a refractive index of the conductive film.

The organic insulating layer, the first lens, and the second lens are preferably formed using the same material.

The first lens and the second lens are each a plano-convex lens and can be provided so that a surface opposite to a convex surface is in contact with the conductive film.

An inorganic insulating layer is preferably provided between the organic compound and the organic insulating layer.

A top surface of the organic insulating layer preferably has a convex curved shape.

Another embodiment of the present invention is an electronic device including the above display apparatus and an optical member. The display apparatus can project display on the optical member. The optical member can transmit light. Viewing the optical member allows visual recognition of an image obtained by overlapping the display and an image transmitted through the optical member.

Effect of the Invention

One embodiment of the present invention can provide a display apparatus with high display quality. One embodiment of the present invention can provide a high-resolution display apparatus. One embodiment of the present invention can provide a high-definition display apparatus. One embodiment of the present invention can provide a high-luminance display apparatus. One embodiment of the present invention can provide a display apparatus having an image capturing function. One embodiment of the present invention can provide a display apparatus having an authentication function. One embodiment of the present invention can provide a highly reliable display apparatus.

Note that the description of these effects does not preclude the existence of other effects. One embodiment of the present invention does not necessarily have all of these effects. Other effects can be derived from the description of the specification, the drawings, and the claims.

MODE FOR CARRYING OUT THE INVENTION

Figure 1A:
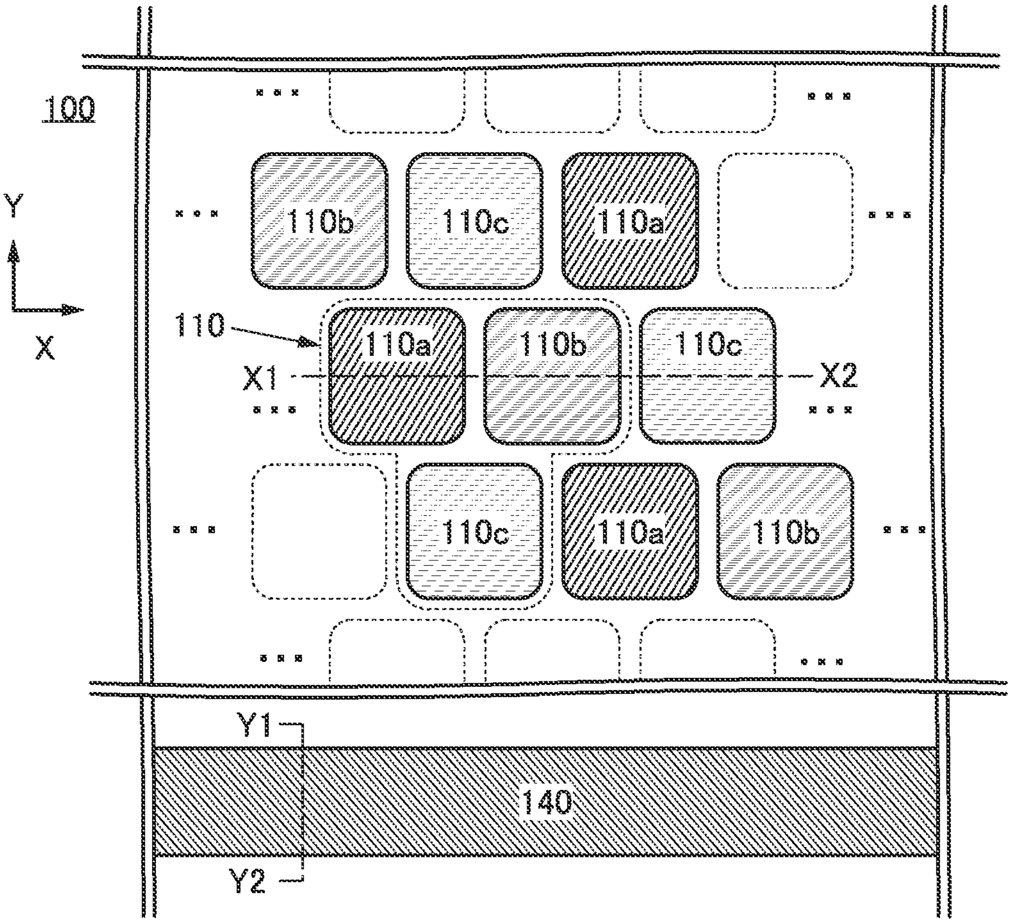
FIG. 1A is a top view illustrating an example of a display apparatus.

Embodiments will be described in detail with reference to the drawings. Note that the present invention is not limited to the following description, and it will be readily understood by those skilled in the art that the modes and details of the present invention can be modified in various ways without departing from the spirit and scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or the circumstances. For example, the term "conductive layer" can be replaced with the term "conductive film". As another example, the term "insulating film" can be replaced with the term "insulating layer".

In this specification and the like, a device manufactured using a metal mask or an FMM (a fine metal mask, a high-resolution metal mask) is sometimes referred to as a device having an MM (metal mask) structure. In addition, in this specification and the like, a device manufactured without using a metal mask or an FMM is sometimes referred to as a device having an MML (metal maskless) structure.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be distinguished from each other on the basis of the cross-sectional shape or properties in some cases. Furthermore, one layer may have two or three functions of the carrier-injection layer, the carrier-transport layer, and the carrier-blocking layer in some cases.

In this specification and the like, a light-emitting device (a light-emitting element) includes an EL layer between a pair of electrodes. The EL layer includes at least a light-emitting layer. Examples of the layers included in the EL layer (also referred to as functional layers) include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In this specification and the like, the light-receiving device (also referred to as a light-receiving element) includes at least an active layer that functions as a photoelectric conversion layer between a pair of electrodes. In this specification and the like, one of the pair of electrodes may be referred to as a pixel electrode and the other may be referred to as a common electrode.

In this specification and the like, a tapered shape indicates a shape in which at least part of a side surface of a structure is inclined to a substrate surface. For example, a tapered shape preferably includes a region where the angle between the inclined side surface and the substrate surface (such an angle is also referred to as a taper angle) is less than 90°. Note that the side surface and the substrate surface of the structure are not necessarily completely flat and may be substantially flat with a slight curvature or substantially flat with slight unevenness.

Embodiment 1

In this embodiment, a display apparatus of one embodiment of the present invention will be described with reference to drawings.

A display apparatus of one embodiment of the present invention includes light-emitting devices of different colors, which are separately formed, and can perform full-color display.

A structure in which light-emitting layers in light-emitting devices of different colors (e.g., blue (B), green (G), and red (R)) are separately formed or separately patterned is sometimes referred to as an SBS (Side By Side) structure. The SBS structure allows optimization of materials and structures of light-emitting devices and thus can extend freedom of choice of the materials and the structures, which makes it easy to improve the luminance and the reliability.

In the case of manufacturing a display apparatus including a plurality of light-emitting devices emitting light of different colors, light-emitting layers different in emission color each need to be formed in an island shape.

Note that in this specification and the like, an island shape refers to a state where two or more layers formed using the same material in the same step are physically separated from each other. For example, "island-shaped light-emitting layer" means a state where the light-emitting layer and its adjacent light-emitting layer are physically separated from each other.

An island-shaped light-emitting layer can be formed by a vacuum evaporation method using a metal mask. However, this method causes a deviation from the designed shape and position of an island-shaped light-emitting layer due to various influences such as the accuracy of the metal mask, the positional deviation between the metal mask and a substrate, a warp of the metal mask, and the vapor-scattering-induced expansion of outline of the deposited film; accordingly, it is difficult to achieve high resolution and high aperture ratio of the display apparatus. In addition, the outline of the layer may blur during vapor deposition, whereby the thickness of an end portion may be small.

That is, the thickness of the island-shaped light-emitting layer may vary from area to area. In the case of manufacturing a display apparatus with a large size, high definition, or high resolution, the manufacturing yield might be reduced because of low dimensional accuracy of the metal mask and deformation due to heat or the like.

In view of this, in manufacture of the display apparatus of one embodiment of the present invention, fine patterning of a light-emitting layer is performed by a lithography step and an etching step without using a metal mask. Specifically, a pixel electrode is formed for each subpixel, and then, a light-emitting layer is formed across a plurality of pixel electrodes. After that, the light-emitting layer is processed by a lithography step and an etching step, so that one island-shaped light-emitting layer is formed per pixel electrode. Thus, the light-emitting layer can be divided for the respective subpixels, so that island-shaped light-emitting layers can be formed for the respective subpixels.

In the case of processing the light-emitting layer into an island shape, the light-emitting layer might be damaged through a lithography step and an etching step, resulting in significant degradation of the reliability. In view of this, in manufacture of the display apparatus of one embodiment of the present invention, a mask layer (also referred to as a sacrificial layer, a protective layer, or the like) or the like is preferably formed over a functional layer (e.g., a carrier-blocking layer, a carrier-transport layer, or a carrier-injection layer, more specifically, a hole-blocking layer, an electron-transport layer, an electron-injection layer, or the like) positioned above the light-emitting layer, followed by the processing of the light-emitting layer and the functional layer into an island shape. Such a method can inhibit the light-emitting layer from being exposed on the outermost surface during the manufacturing process of the display apparatus and can reduce damage to the light-emitting layer.

Note that in this specification and the like, each of the mask film and the mask layer is positioned above at least the light-emitting layer (more specifically, a layer processed into an island shape among layers included in an EL layer) and has a function of protecting the light-emitting layer in the manufacturing process.

In the case where the light-emitting layer is processed into an island shape, a layer positioned below the light-emitting layer (e.g., a carrier-injection layer, a carrier-transport layer, or a carrier-blocking layer, more specifically a hole-injection layer, a hole-transport layer, an electron-blocking layer, or the like) is preferably processed into an island shape with the same pattern as the light-emitting layer. Processing a layer positioned below the light-emitting layer into an island shape with the same pattern as the light-emitting layer can reduce a leakage current (sometimes referred to as a horizontal-direction leakage current, a horizontal leakage current, or a lateral leakage current) that might be generated between adjacent subpixels.

For example, in the case where the hole-injection layer is used as a common layer between adjacent subpixels, a horizontal leakage current might be generated due to the hole-injection layer. In contrast, in the display apparatus of one embodiment of the present invention, the hole-injection layer can be processed into an island shape with the same pattern as the light-emitting layer; hence, a horizontal leakage current is not substantially generated between adjacent subpixels or the amount of horizontal leakage current can be extremely small.

In the case where the EL layer is processed using a photolithography step, a wet etching step, and a dry etching process, the EL layer might be damaged in each step. The influence of heating is especially large; thus, when steps after film formation of the EL layer are performed at temperatures higher than the upper temperature limit of the EL layer, deterioration of the EL layer proceeds, which might result in a decrease in the emission efficiency and reliability of the light-emitting device.

Thus, in one embodiment of the present invention, the upper temperature limit of a compound contained in the light-emitting device is preferably higher than or equal to 100° C. and lower than or equal to 180° C., further preferably higher than or equal to 120° C. and lower than or equal to 180° C., still further preferably higher than or equal to 140° C. and lower than or equal to 180° C.

Examples of indicators of the upper temperature limit include the glass transition point (Tg), the softening point, the melting point, the thermal decomposition temperature, and the 5% weight loss temperature. For example, as an indicator of the upper temperature limit of a layer included in the EL layer, a glass transition point of a material contained in the layer can be used. In the case where the layer is a mixed layer formed of a plurality of materials, a glass transition point of a material contained in the highest proportion can be used. Alternatively, the lowest temperature among the glass transition points of the materials may be used.

In particular, the upper temperature limits of the light-emitting layer and the functional layer provided over the light-emitting layer are preferably high. Increasing the upper temperature limit of the light-emitting layer can inhibit a reduction in light emission efficiency due to damage to the light-emitting layer by heating and a decrease in lifetime. In addition, increase of the upper temperature limit of the functional layer enables protecting the light-emitting layer effectively, and thus the damage to the light-emitting layer can be reduced.

Increasing the upper temperature limit of the light-emitting device can increase the reliability of the light-emitting device. Furthermore, increasing the upper temperature limit can widen the allowable temperature range in the manufacturing process of the display apparatus, thereby improving the manufacturing yield and the reliability.

Some layers included in the EL layers can be formed in the same step between light-emitting devices emitting light of different colors. In the method for manufacturing the display apparatus of one embodiment of the present invention, some layers included in the EL layer are formed into an island shape separately for each emission color, and then part of the mask layer is removed. After that, the other layers (sometimes referred to as common layers) included in the EL layers and a common electrode (also referred to as an upper electrode) are formed (as one film) to be shared by the light-emitting devices of respective colors. For example, the carrier-injection layer and the common electrode can be formed to be shared by the light-emitting devices of respective colors.

The carrier-injection layer is often a layer having relatively high conductivity in the EL layer. Therefore, when the carrier-injection layer is in contact with a side surface of any layer included in the EL layer formed in an island shape or a side surface of the pixel electrode, the light-emitting device might be short-circuited. Note that also in the case where the carrier-injection layer is formed in an island shape and the common electrode is formed to be shared by the light-emitting devices of respective colors, the light-emitting device might be short-circuited when the common electrode is in contact with the side surface of the EL layer or the side surface of the pixel electrode.

In view of this, the display apparatus of one embodiment of the present invention includes an insulating layer covering at least the side surface of the island-shaped light-emitting layer. The insulating layer preferably covers part of the top surface of the island-shaped light-emitting layer.

Thus, at least some layers in the EL layer formed in an island shape and the pixel electrode can be prevented from being in contact with the carrier-injection layer or the common electrode. Hence, a short circuit in the light-emitting device is inhibited, and the reliability of the light-emitting device can be improved.

In a cross-sectional view, an end portion of the insulating layer preferably has a tapered shape with a taper angle less than 90°. In this case, step disconnection of the common layer and the common electrode provided over the insulating layer can be prevented. Thus, connection defects caused by step disconnection can be inhibited. In addition, an increase in electric resistance, which is caused by local thinning of the common electrode due to a step, can be inhibited.

Note that in this specification and the like, step disconnection refers to a phenomenon in which a layer, a film, or an electrode is split because of the shape of the formation surface (e.g., a step).

Thus, an island-shaped light-emitting layer manufactured by the method for manufacturing a display apparatus of one embodiment of the present invention is formed by processing a light-emitting layer that has been formed over an entire surface, not by using a fine metal mask. Accordingly, a high-resolution display apparatus or a display apparatus with a high aperture ratio, which has been difficult to be formed so far, can be achieved. Moreover, light-emitting layers can be formed separately for respective color, enabling the display apparatus to perform extremely clear display with high contrast and high display quality. Moreover, providing the mask layer over the light-emitting layer can reduce damage to the light-emitting layer in the manufacturing process of the display apparatus, resulting in an increase in reliability of the light-emitting device.

It is difficult to reduce the distance between adjacent light-emitting devices to less than 10 μm with a formation method using a fine metal mask. However, the method using a lithography method according to one embodiment of the present invention can shorten the distance between adjacent light-emitting devices, the distance between adjacent EL layers, or the distance between adjacent pixel electrodes to less than 10 μm, less than or equal to 5 μm, less than or equal to 3 μm, less than or equal to 2 μm, less than or equal to 1.5 μm, less than or equal to 1 μm, or even less than or equal to 0.5 μm in a process over a glass substrate.

In addition, using a light exposure apparatus for LSI can further shorten the distance between adjacent light-emitting devices, the distance between adjacent EL layers, or the distance between adjacent pixel electrodes to less than or equal to 500 nm, less than or equal to 200 nm, less than or equal to 100 nm, or even less than or equal to 50 nm in a process over a Si wafer. Accordingly, the area of a non-light-emitting region that may exist between two light-emitting devices can be significantly reduced, and the aperture ratio can be close to 100%. In the display apparatus of one embodiment of the present invention, an aperture ratio higher than or equal to 40%, higher than or equal to 50%, higher than or equal to 60%, higher than or equal to 70%, higher than or equal to 80%, or higher than or equal to 90%, and lower than 100% can be achieved.

Increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% has a lifetime 3.25 times longer than the reference, and a display apparatus having an aperture ratio of 40% has a lifetime 10.6 times longer than the reference. Thus, the density of a current flowing to the organic EL device can be reduced with an increasing aperture ratio, and accordingly the lifetime of the display apparatus can be increased.

The display apparatus of one embodiment of the present invention can have a higher aperture ratio and thus can have higher display quality. Furthermore, the display apparatus of one embodiment of the present invention has excellent effect that the reliability (especially the lifetime) can be significantly improved with an increasing aperture ratio.

Furthermore, a pattern of the light-emitting layer itself can be made much smaller than that in the case of using a fine metal mask. In the case of using a metal mask for forming light-emitting layers separately, a variation in the thickness occurs between the center and the edge of the pattern. This causes a reduction in an effective area that can be used as a light-emitting region with respect to the area of the entire pattern.

In contrast, in the above manufacturing method, the film deposited to have a uniform thickness is processed, so that island-shaped light-emitting layers can be formed to have a uniform thickness. Accordingly, even with a fine pattern, almost all the area of the light-emitting layer can be used as a light-emitting region. Thus, a display apparatus having both a high resolution and a high aperture ratio can be manufactured. Furthermore, the display apparatus can be reduced in size and weight.

Specifically, the display apparatus of one embodiment of the present invention can have a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Furthermore, the display apparatus of one embodiment of the present invention includes a convex-lens-shaped structure body over the light-emitting device. By providing the structure body over the light-emitting device, the extraction efficiency of light emitted from the light-emitting device to the outside can be increased.

The light-emitting device used for one embodiment of the present invention has a top-emission structure where light is extracted to the outside through a visible-light-transmitting conductive film which is one of electrodes of the light-emitting device. In that case, part of light emitted from the light-emitting device proceeds in the lateral direction through the light-transmitting conductive film as a waveguide, causing a reduction in the light extraction efficiency. In one embodiment of the present invention, a convex-lens-shaped structure body provided over the light-transmitting conductive film can inhibit light from proceeding in the lateral direction, whereby the light extraction efficiency can be increased.

In the case where the display apparatus includes a light-receiving device in one embodiment of the present invention, a convex-lens-shaped structure body can be provided over the light-receiving device. The structure body provided over the light-receiving device is made to have a larger diameter than an effective area of a light-receiving portion, in which case light condensing capability is improved, and accordingly the light-receiving device can have improved sensitivity to light.

Note that although a convex-lens-shaped structure body can be provided over each of the light-emitting device and the light-receiving device, a convex-lens-shaped structure body may be provided over one of the light-emitting device and the light-receiving device.

In this specification, the convex-lens-shaped structure body is referred to as a lens or a microlens simply in some cases. The lenses which are regularly arranged are sometimes referred to as a microlens array (MLA).

In this embodiment, cross-sectional structures of the display apparatus of one embodiment of the present invention are mainly described, and a method for manufacturing the display apparatus of one embodiment of the present invention will be described in detail in Embodiment 2.

FIG. 1A is a top view of a display apparatus 100. The display apparatus 100 includes a display portion in which a plurality of pixels 110 are arranged, and a connection portion

140 outside the display portion. A plurality of subpixels are arranged at regular intervals in the display portion. FIG. 1A illustrates part of subpixels and a pixel is formed with a plurality of subpixels. The connection portion 140 can also be referred to as a cathode contact portion.

In this specification and the like, the row direction is referred to as X direction and the column direction is referred to as Y direction, in some cases. The X direction and the Y direction intersect with each other and are orthogonal or substantially orthogonal to each other (see FIG. 1A).

The top surface shape of the subpixel illustrated in FIG. 1A corresponds to the top surface shape of a light-emitting region. Examples of the top surface shape of the subpixel include polygons such as a triangle, a tetragon (including a rectangle and a square), and a pentagon; polygons with rounded corners; an ellipse; and a circle. In this specification and the like, a top surface shape refers to a shape in a plan view, i.e., a shape seen from above.

The range of the circuit layout for forming the subpixels is not limited to the range of the subpixels illustrated in FIG. 1A, and the layout may be placed outside the range of the subpixels. For example, transistors included in a subpixel 110*a* may be positioned within the range of a subpixel 110*b* illustrated in FIG. 1A, or some or all of the transistors may be positioned outside the range of the subpixel 110*a.*

Although the subpixels 110*a*, 110*b*, and 110*c* have the same or substantially the same aperture ratio (also referred to as the same size or the same size of a light-emitting region) in FIG. 1A, one embodiment of the present invention is not limited thereto. Note that the aperture ratio of each of the subpixels 110*a*, 110*b*, and 110*c* can be determined as appropriate. The subpixels 110*a*, 110*b*, and 110*c* may have different aperture ratios, or two or more of the subpixels 110*a*, 110*b*, and 110*c* may have the same or substantially the same aperture ratio.

The pixel 110 illustrated in FIG. 1A employs delta arrangement. The pixel 110 illustrated in FIG. 1A includes three subpixels of the subpixel 110*a*, 110*b*, and 110*c*. The subpixels 110*a*, 110*b*, and 110*c* include light-emitting devices that emit light of different colors. The subpixels 110*a*, 110*b*, and 110*c* can be of three colors of red (R), green (G), and blue (B) or three colors of yellow (Y), cyan (C), and magenta (M), for example. The number of types of subpixels is not limited to three, and four or more types of subpixels may be used. As the four subpixels, subpixels of four colors of R, G, B, and white (W), subpixels of four colors of R, G, B, and Y, or four subpixels of R, G, B, and infrared light (IR) can be given, for example.

Although the top view in FIG. 1A illustrates an example where the connection portion 140 is positioned in the lower side of the display portion, the position of the connection portion 140 is not limited thereto. The connection portion 140 may be provided in at least one of the upper side, the right side, the left side, and the lower side of the display portion in the top view, or may be provided so as to surround the four sides of the display portion. The top surface shape of the connection portion 140 can be a belt-like shape, an L shape, a U shape, a frame-like shape, or the like. The number of the connection portions 140 can be one or more.

Figure 1B:
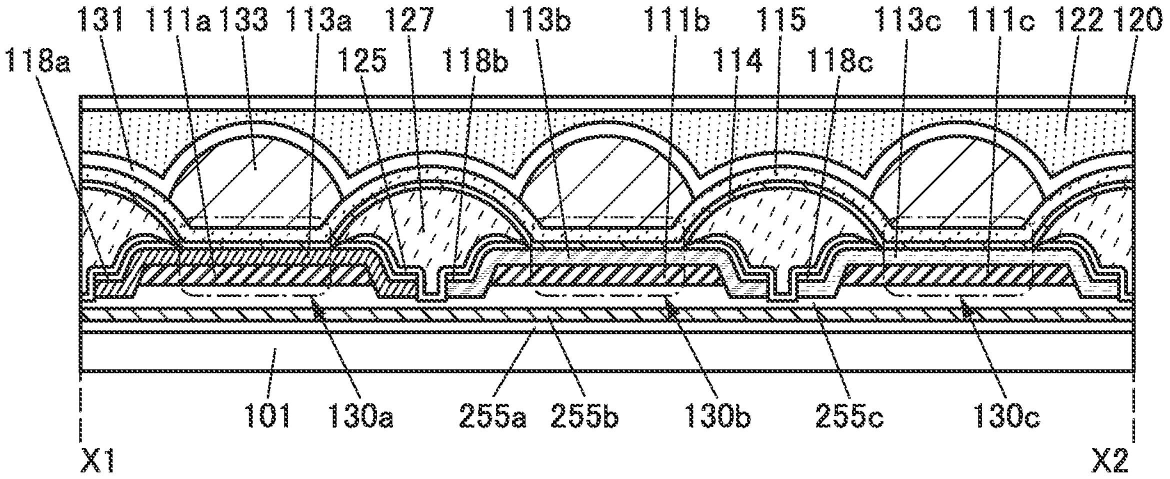
FIG. 1B is a cross-sectional view illustrating an example of the display apparatus.
Figure 2A:
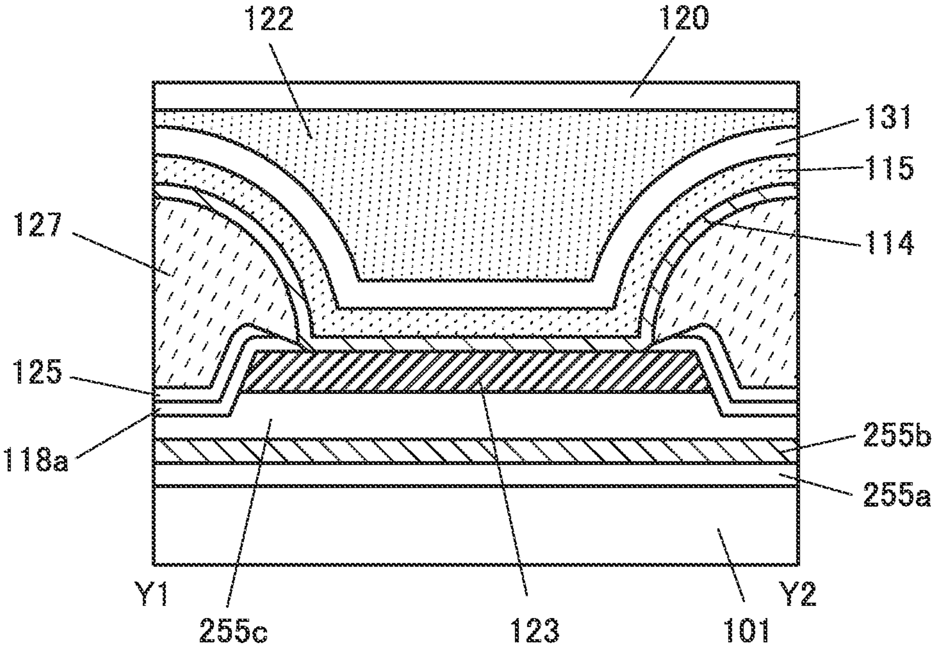
FIG. 2A and FIG. 2B are cross-sectional views illustrating examples of a display apparatus.
Figure 2B:
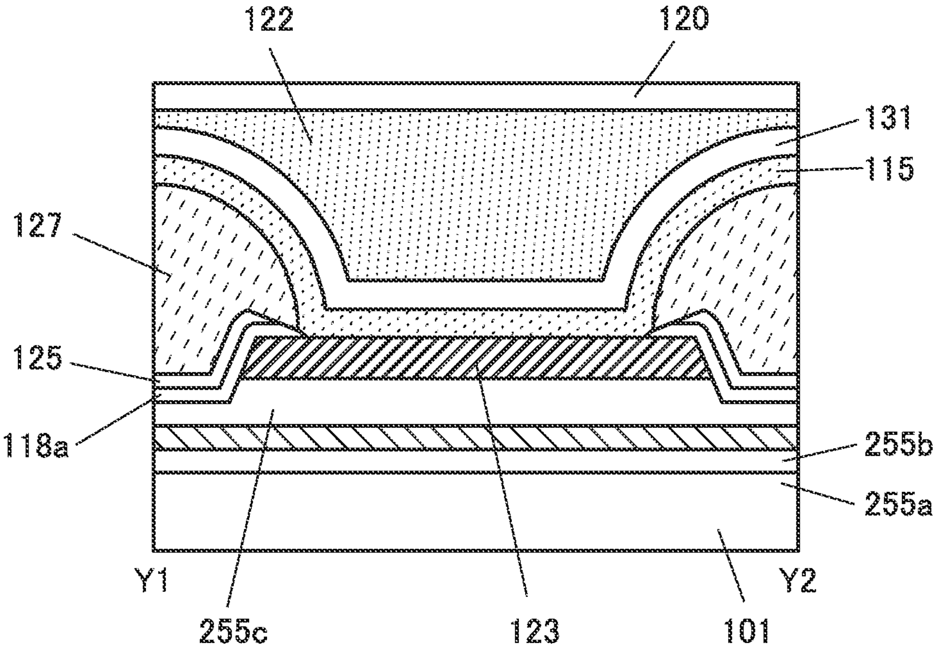

FIG. 1B is a cross-sectional view along dashed-dotted line X1-X2 in FIG. 1A. FIG. 2A and FIG. 2B each illustrate a cross-sectional view along the dashed-dotted line Y1-Y2 in FIG. 1A.

As illustrated in FIG. 1B, the display apparatus 100 includes an insulating layer over a layer 101 including transistors, the light-emitting devices 130*a*, 130*b*, and 130*c* are provided over the insulating layers, and lenses 133 are provided over these light-emitting devices. A protective layer 131 is provided to cover the lens 133. A substrate 120 is bonded over the protective layer 131 with a resin layer 122. In a region between adjacent light-emitting devices, an insulating layer 125 and an insulating layer 127 over the insulating layer 125 are provided.

Although FIG. 1B illustrates a plurality of cross sections of the insulating layer 125 and the insulating layer 127, the insulating layer 125 and the insulating layer 127 are each a continuous layer when the display apparatus 100 is seen from above. In other words, the display apparatus 100 can have a structure including one insulating layer 125 and one insulating layer 127. Note that the display apparatus 100 may include a plurality of insulating layers 125 that are separated from each other and a plurality of insulating layers 127 that are separated from each other.

The display apparatus of one embodiment of the present invention has a top-emission structure in which light is emitted in a direction opposite to the substrate where the light-emitting device is formed.

The layer 101 including transistors can employ a stacked-layer structure in which a plurality of transistors are provided over a substrate and an insulating layer is provided to cover these transistors. The insulating layer over the transistors may have a single-layer structure or a stacked-layer structure. In FIG. 1B, an insulating layer 255*a*, an insulating layer 255*b* over the insulating layer 255*a*, and an insulating layer 255*c* over the insulating layer 255*b* are illustrated as the insulating layer over the transistors. These insulating layers may have a depressed portion between adjacent light-emitting devices. In the example illustrated in FIG. 1B and the like, the insulating layer 255*c* has a depressed portion. Note that the insulating layers (the insulating layer 255*a* to the insulating layer 255*c*) over the transistors can be regarded as part of the layer 101 including transistors.

As each of the insulating layer 255*a*, the insulating layer 255*b*, and the insulating layer 255*c*, any of a variety of inorganic insulating films such as an oxide insulating film, a nitride insulating film, an oxynitride insulating film, and a nitride oxide insulating film can be suitably used. As the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. More specifically, it is preferable that a silicon oxide film be used as the insulating layer 255*a* and the insulating layer 255*c* and a silicon nitride film be used as the insulating layer 255*b*. The insulating layer 255*b* preferably has a function of an etching protective film.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

Structure examples of the layer 101 including transistors will be described later in Embodiment 4.

The light-emitting devices 130*a*, 130*b*, and 130*c* emit light of different colors. Preferably, the light-emitting devices 130*a*, 130*b*, and 130*c* emit light of three colors, red (R), green (G), and blue (B), for example.

As the light-emitting device, an OLED (Organic Light Emitting Diode) or a QLED (Quantum-dot Light Emitting Diode) is preferably used. Examples of a light-emitting substance contained in the light-emitting device include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescent (TADF) material). In addition, an LED (Light Emitting Diode) such as a micro-LED can also be used as the light-emitting device.

The light-emitting device can emit infrared light or visible light (e.g., red, green, blue, cyan, magenta, yellow, or white). When the light-emitting device has a microcavity structure, the color purity can be increased.

Description in Embodiment 5 can be referred to for the structure and the materials of the light-emitting device.

One of pair of electrodes of the light-emitting device functions as a cathode, and the other electrode functions as an anode. The case where the pixel electrode functions as an anode and the common electrode functions as a cathode is described below as an example in some cases.

The light-emitting device 130*a* includes a pixel electrode 111*a* over the insulating layer 255*c*, an island-shaped first layer 113*a* over the pixel electrode 111*a*, a common layer 114 over the island-shaped first layer 113*a*, and a common electrode 115 over the common layer 114. In the light-emitting device 130*a*, the first layer 113*a* and the common layer 114 can be collectively referred to as an EL layer.

The light-emitting device 130*b* includes a pixel electrode 111*b* over the insulating layer 255*c*, an island-shaped second layer 113*b* over the pixel electrode 111*b*, the common layer 114 over the island-shaped second layer 113*b*, and the common electrode 115 over the common layer 114. In the light-emitting device 130*b*, the second layer 113*b* and the common layer 114 can be collectively referred to as an EL layer.

The light-emitting device 130*c* includes a pixel electrode 111*c* over the insulating layer 255*c*, an island-shaped third layer 113*c* over the pixel electrode 111*c*, the common layer 114 over the island-shaped third layer 113*c*, and the common electrode 115 over the common layer 114. In the light-emitting device 130*c*, the third layer 113*c* and the common layer 114 can be collectively referred to as an EL layer.

In this specification and the like, in the EL layers included in the light-emitting devices, the island-shaped layer provided in each light-emitting device is referred to as the first layer 113*a*, the second layer 113*b*, or the third layer 113*c*, and the layer shared by the plurality of light-emitting devices is referred to as the common layer 114. Note that in this specification and the like, only the first layer 113*a*, the second layer 113*b*, and the third layer 113*c* are sometimes referred to as island-shaped EL layers, EL layers formed in an island shape, or the like, in which case the common layer 114 is not included in the EL layer.

The first layer 113*a*, the second layer 113*b*, and the third layer 113*c* are isolated from each other. When the EL layer is provided in an island shape for each light-emitting device, a leakage current flowing between adjacent light-emitting devices can be inhibited. This can prevent crosstalk due to unintended light emission, so that a display apparatus with extremely high contrast can be obtained. Specifically, a display apparatus having high current efficiency at low luminance can be obtained.

End portions of the pixel electrode 111*a*, the pixel electrode 111*b*, and the pixel electrode 111*c* each preferably have a tapered shape. Specifically, the end portions of the pixel electrode 111*a*, the pixel electrode 111*b*, and the pixel electrode 111*c* each preferably have a tapered shape with a taper angle less than 90°. In the case where the end portions of the pixel electrodes have a tapered shape, the first layer 113*a*, the second layer 113*b*, and the third layer 113*c* provided along side surfaces of the pixel electrodes also have a tapered shape. When the side surface of the pixel electrode has a tapered shape, coverage with the EL layer provided along the side surface of the pixel electrode can be improved. Furthermore, when the side surface of the pixel electrode has a tapered shape, a foreign matter (also referred to as dust or particles) in the manufacturing process is easily removed by processing such as cleaning, which is preferable.

In FIG. 1B, an insulating layer covering an end portion of the top surface of the pixel electrode 111*a* is not provided between the pixel electrode 111*a* and the first layer 113*a*. An insulating layer covering an end portion of the top surface of the pixel electrode 111*b* is not provided between the pixel electrode 111*b* and the second layer 113*b*. Thus, the distance between adjacent light-emitting devices can be extremely shortened. Accordingly, the display apparatus can have a high resolution or a high definition. In addition, a mask for forming the insulating layer is not needed, which leads to a reduction in manufacturing cost of the display apparatus.

Furthermore, light emitted from the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display apparatus of one embodiment of the present invention can significantly reduce the viewing angle dependence. A reduction in the viewing angle dependence leads to an increase in visibility of an image on the display apparatus. In the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction.

The light-emitting device of this embodiment may have either a single structure (a structure including only one light-emitting unit) or a tandem structure (a structure including a plurality of light-emitting units). The light-emitting unit includes at least one light-emitting layer.

Each of the first layer 113*a*, the second layer 113*b*, and the third layer 113*c* includes at least a light-emitting layer. For example, the first layer 113*a* can include a light-emitting layer emitting red light, the second layer 113*b* can include a light-emitting layer emitting green light, and the third layer 113*c* can include a light-emitting layer emitting blue light.

In the case where a light-emitting device having a tandem structure is used, it is preferable that the first layer 113*a* include a plurality of light-emitting units emitting red light, the second layer 113*b* include a plurality of light-emitting units emitting green light, and the third layer 113*c* include a plurality of light-emitting units emitting blue light. A charge-generation layer is preferably provided between the light-emitting units.

The first layer 113*a*, the second layer 113*b*, and the third layer 113*c* may each include one or more of a hole-injection layer, a hole-transport layer, a hole-blocking layer, a charge-generation layer, an electron-blocking layer, an electron-transport layer, and an electron-injection layer.

The first layer 113*a*, the second layer 113*b*, and the third layer 113*c* may each include a hole-injection layer, a hole-transport layer, a light-emitting layer, and an electron-transport layer in this order. In addition, an electron-blocking layer may be provided between the hole-transport layer and the light-emitting layer. In addition, a hole-blocking layer may be provided between the electron-transport layer and the light-emitting layer. Furthermore, an electron-injection layer may be provided over the electron-transport layer.

The first layer 113*a*, the second layer 113*b*, and the third layer 113*c* may each include an electron-injection layer, an electron-transport layer, a light-emitting layer, and a hole-transport layer in this order. In addition, a hole-blocking layer may be provided between the electron-transport layer and the light-emitting layer. In addition, an electron-blocking layer may be provided between the hole-transport layer and the light-emitting layer. Furthermore, a hole-injection layer may be provided over the hole-transport layer.

Thus, the first layer 113*a*, the second layer 113*b*, and the third layer 113*c* each preferably include a light-emitting layer and a carrier-transport layer (an electron-transport layer or a hole-transport layer) over the light-emitting layer. Alternatively, the first layer 113*a*, the second layer 113*b*, and the third layer 113*c* each preferably include a light-emitting layer and a carrier-blocking layer (a hole-blocking layer or an electron-blocking layer) over the light-emitting layer. Alternatively, the first layer 113*a*, the second layer 113*b*, and the third layer 113*c* each preferably include a light-emitting layer, a carrier-blocking layer over the light-emitting layer, and a carrier-transport layer over the carrier-blocking layer. Since the surfaces of the first layer 113*a*, the second layer 113*b*, and the third layer 113*c* are exposed in the manufacturing process of the display apparatus, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be improved.

The upper temperature limits of compounds contained in the first layer 113*a*, the second layer 113*b*, and the third layer 113*c* are higher than or equal to 100° C. and lower than or equal to 180° C., preferably higher than or equal to 120° C. and lower than or equal to 180° C., further preferably higher than or equal to 140° C. and lower than or equal to 180° C. For example, the glass transition points (Tg) of these compounds are higher than or equal to 100° C. and lower than or equal to 180° C., preferably higher than or equal to 120° C. and lower than or equal to 180° C., further preferably higher than or equal to 140° C. and lower than or equal to 180° C.

In particular, the upper temperature limit of the functional layer provided over the light-emitting layer is preferably high. It is further preferable that the upper temperature limit of the functional layer provided over and in contact with the light-emitting layer be high. When the functional layer has high heat resistance, the light-emitting layer can be effectively protected and less damaged.

The first layer 113*a*, the second layer 113*b*, and the third layer 113*c* can each include a first light-emitting unit, a charge-generation layer, and a second light-emitting unit.

The second light-emitting unit preferably includes a light-emitting layer and a carrier-transport layer (an electron-transport layer or a hole-transport layer) over the light-emitting layer. Alternatively, the second light-emitting unit preferably includes a light-emitting layer and a carrier-blocking layer (a hole-blocking layer or an electron-blocking layer) over the light-emitting layer. Alternatively, the second light-emitting unit preferably includes a light-emitting layer, a carrier-blocking layer over the light-emitting layer, and a carrier-transport layer over the carrier-blocking layer.

Since the surface of the second light-emitting unit is exposed in the manufacturing process of the display apparatus, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be improved. Note that in the case where three or more light-emitting units are provided, the uppermost light-emitting unit preferably includes a light-emitting layer and one or both of a carrier-transport layer and a carrier-blocking layer over the light-emitting layer.

The common layer 114 can include an electron-injection layer or a hole-injection layer. Alternatively, the common layer 114 may be a stack of an electron-transport layer and an electron-injection layer, or may be a stack of a hole-transport layer and a hole-injection layer. The common layer 114 is shared by the light-emitting devices 130*a*, 130*b*, and 130*c*.

FIG. 1B illustrates an example where an end portion of the first layer 113*a* is positioned on the outer side of the end portion of the pixel electrode 111*a*. Note that although the pixel electrode 111*a* and the first layer 113*a* are given as an example, the following description applies to the pixel electrode 111*b* and the second layer 113*b*, and the pixel electrode 111*c* and the third layer 113*c*.

In FIG. 1B, the first layer 113*a* is formed to cover the end portion of the pixel electrode 111*a*. Such a structure enables the entire top surface of the pixel electrode to be a light-emitting region, and the aperture ratio can be easily increased as compared with the structure where an end portion of the island-shaped EL layer is positioned inward from the end portion of the pixel electrode.

Covering the side surface of the pixel electrode with the EL layer inhibits contact between the pixel electrode and the common electrode 115, thereby inhibiting a short circuit of the light-emitting device. Furthermore, the distance between the light-emitting region (i.e., the region overlapping with the pixel electrode) in the EL layer and the end portion of the EL layer can be increased. Since the end portion of the EL layer might be damaged by processing, the use of a region away from the end portion of the EL layer as a light-emitting region can improve the reliability of the light-emitting device in some cases.

The common electrode 115 is shared by the light-emitting devices 130*a*, 130*b*, and 130*c*. The common electrode 115 shared by the plurality of light-emitting devices is electrically connected to a conductive layer 123 provided in the connection portion 140 (see FIG. 2A and FIG. 2B). The conductive layer 123 is preferably formed using a conductive layer formed using the same material and in the same step as the pixel electrode 111*a*, 111*b*, and 111*c*.

Note that FIG. 2A illustrates an example where the common layer 114 is provided over the conductive layer 123, and the conductive layer 123 and the common electrode 115 are electrically connected to each other through the common layer 114. The common layer 114 is not necessarily provided in the connection portion 140. In FIG. 2B, the conductive layer 123 and the common electrode 115 are directly connected to each other. For example, by using a mask for specifying a film formation area (also referred to as an area mask or a rough metal mask to be distinguished from a fine metal mask), the common layer 114 and the common electrode 115 can be formed in different regions.

In FIG. 1B, a mask layer 118*a* is positioned over the first layer 113*a* included in the light-emitting device 130*a*, a mask layer 118*b* is positioned over the second layer 113*b* included in the light-emitting device 130*b*, and a mask layer 118*c* is positioned over the third layer 113*c* included in the light-emitting device 130*c*.

The mask layer 118*a* is a remaining part of a mask layer provided in contact with the top surface of the first layer 113*a* at the time of processing the first layer 113*a*. Similarly, the mask layer 118*b* and the mask layer 118*c* are remaining part of mask layers provided at the time of processing the second layer 113*b* and the third layer 113*c*, respectively.

In the display apparatus of one embodiment of the present invention, the mask layer used to protect the EL layer in manufacture of the display apparatus may partly remain. For any two or all of the mask layer 118*a* to the mask layer 118*c*, the same material or different materials may be used. Note that the mask layer 118*a*, the mask layer 118*b*, the mask layer 118*c* are sometimes collectively referred to as a mask layer 118 below.

In FIG. 1B, one end portion of the mask layer 118*a* is aligned or substantially aligned with the end portion of the first layer 113*a*, and the other end portion of the mask layer 118*a* is positioned over the first layer 113*a*. Here, the other end portion of the mask layer 118*a* preferably overlaps with the first layer 113*a* and the pixel electrode 111*a*.

In this case, the other end portion of the mask layer 118*a* is easily formed over a flat or substantially flat surface of the first layer 113*a*. Note that the same applies to the mask layer 118*b* and the mask layer 118*c*. The mask layer 118 remains between the top surface of the EL layer processed into an island shape (the first layer 113*a*, the second layer 113*b*, or the third layer 113*c*) and the insulating layer 125. The mask layer will be described in detail in Embodiment 2.

In the case where end portions are aligned or substantially aligned with each other and the case where top surface shapes are the same or substantially the same, it can be said that outlines of stacked layers at least partly overlap with each other in a top view. For example, the case of processing the upper layer and the lower layer with the use of the same mask pattern or mask patterns that are partly the same is included. The expression "end portions are aligned or substantially aligned with each other" or "top surface shapes are the same or substantially the same" also includes the case where the outlines of the stacked layers do not completely overlap each other; for instance, the edge of the upper layer may be positioned on the inner side or the outer side of the edge of the lower layer.

Side surfaces of the first layer 113*a*, the second layer 113*b*, and the third layer 113*c* are covered with the insulating layer 125. The insulating layer 127 overlaps with the side surfaces of the first layer 113*a*, the second layer 113*b*, and the third layer 113*c* with the insulating layer 125 therebetween.

Part of the top surfaces of the first layer 113*a*, the second layer 113*b*, and the third layer 113*c* are covered with the mask layer 118. The insulating layer 125 and the insulating layer 127 overlap with part of the top surfaces of the first layer 113*a*, the second layer 113*b*, and the third layer 113*c* with the mask layer 118 therebetween. Note that the top surface of each of the first layer 113*a*, the second layer 113*b*, and the third layer 113*c* is not limited to the top surface of a flat portion overlapping with the top surface of the pixel electrode, and can include the top surfaces of the inclined portion and the flat portion (see a region 103 in FIG. 7A) which are positioned on the outer side of the top surface of the pixel electrode.

The side surface and part of the top surface of each of the first layer 113*a*, the second layer 113*b*, and the third layer 113*c* is covered with at least one of the insulating layer 125, the insulating layer 127, and the mask layer 118, so that the common layer 114 (or the common electrode 115) can be inhibited from being in contact with the side surfaces of the pixel electrodes 111*a*, 111*b*, and 111*c* and the first layer 113*a*, the second layer 113*b*, and the third layer 113*c*, leading to inhibition of a short circuit of the light-emitting devices. Accordingly, the reliability of the light-emitting device can be improved.

Although the first layer 113*a* to the third layer 113*c* have the same thickness in FIG. 1, the present invention is not limited thereto. The thicknesses of the first layer 113*a* to the third layer 113*c* may be different from each other. For example, each of the thicknesses is preferably set in accordance with an optical path length for intensifying light emitted from the first layer 113*a* to the third layer 113*c*. A microcavity structure can be achieved in this manner, and the color purity of each light-emitting device can be increased.

Figure 3A:
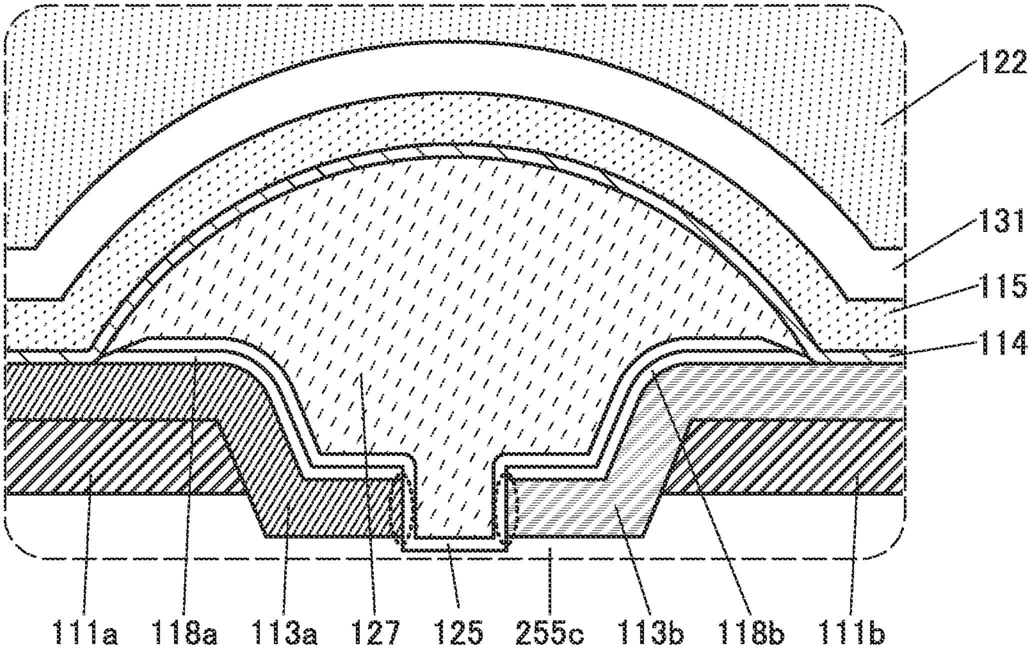
FIG. 3A and FIG. 3B are cross-sectional views illustrating an example of a display apparatus.

The insulating layer 125 is preferably in contact with the side surfaces of the first layer 113*a*, the second layer 113*b*, and the third layer 113*c* (see portions surrounded by dashed line in the end portions of the first layer 113*a* and the second layer 113*b* and the vicinity thereof illustrated in FIG. 3A). When the insulating layer 125 is in contact with the first layer 113*a*, the second layer 113*b*, and the third layer 113*c*, peeling of the first layer 113*a*, the second layer 113*b*, and the third layer 113*c* can be prevented.

When the insulating layer is in close contact with the first layer 113*a*, the second layer 113*b*, and the third layer 113*c*, the first layer 113*a* and the like which are adjacent to each other can be fixed or attached to each other by the insulating layer. Accordingly, the reliability of the light-emitting device can be improved. The manufacturing yield of the light-emitting devices can also be improved.

As illustrated in FIG. 1B, the insulating layer 125 and the insulating layer 127 cover the side surface and part of the top surface of each of the first layer 113*a*, the second layer 113*b*, and the third layer 113*c*, whereby peeling of the EL layers can be prevented and the reliability of the light-emitting devices can be improved. The manufacturing yield of the light-emitting devices can also be improved.

FIG. 1B illustrates the example where the first layer 113*a*, the mask layer 118*a*, the insulating layer 125, and the insulating layer 127 are stacked over the end portion of the pixel electrode 111*a*. Similarly, the second layer 113*b*, the mask layer 118*b*, the insulating layer 125, and the insulating layer 127 are stacked over the end portion of the pixel electrode 111*b*; and the third layer 113*c*, the mask layer 118*c*, the insulating layer 125, and the insulating layer 127 are stacked over the end portion of the pixel electrode 111*c*.

In FIG. 1B, the end portion of the pixel electrode 111*a* is covered with the first layer 113*a*, and the insulating layer 125 is in contact with the side surface of the first layer 113*a*. Similarly, the end portion of the pixel electrode 111*b* is covered with the second layer 113*b*, the end portion of the pixel electrode 111*c* is covered with the third layer 113*c*, and the insulating layer 125 is in contact with the side surface of the second layer 113*b* and the side surface of the third layer 113*c*.

The insulating layer 127 is provided over the insulating layer 125 to fill a depressed portion formed along the insulating layer 125. The insulating layer 127 can overlap with the side surface and part of the top surface of each of the first layer 113*a*, the second layer 113*b*, and the third layer 113*c* with the insulating layer 125 therebetween. The insulating layer 127 preferably covers at least part of a side surface of the insulating layer 125.

The insulating layer 125 and the insulating layer 127 can fill a gap between adjacent island-shaped layers; hence, extreme unevenness of the formation surface of the layers (e.g., the carrier-injection layer and the common electrode) provided over the island-shaped layers can be reduced, and the formation surface can be made flatter. Consequently, coverage with the carrier-injection layer, the common electrode, and the like can be improved.

The common layer 114 and the common electrode 115 are provided over the first layer 113*a*, the second layer 113*b*, the third layer 113*c*, the mask layer 118, the insulating layer 125, and the insulating layer 127. Before the insulating layer 125 and the insulating layer 127 are provided, a step is generated owning to a region where the pixel electrode and the island-shaped EL layer are provided and a region where neither the pixel electrode nor the island-shaped EL layer is provided (region between the light-emitting devices).

In the display apparatus of one embodiment of the present invention, the step can be planarized with the insulating layer 125 and the insulating layer 127, and the coverage with the common layer 114 and the common electrode 115 can be improved. Thus, connection defects caused by step disconnection can be inhibited. In addition, an increase in electric resistance, which is caused by local thinning of the common electrode 115 due to the step, can be inhibited.

The top surface of the insulating layer 127 preferably has higher flatness, but may include a projection portion, a convex curved surface, a concave curved surface, or a depressed portion. For example, the top surface of the insulating layer 127 preferably has a convex curved shape with a smooth surface.

In the display apparatus of one embodiment of the present invention, the insulating layer 127 is provided over the insulating layer 125 so as to fill the depressed portion formed along the insulating layer 125. The insulating layer 127 is provided between the island-shaped EL layers. In other words, in the display apparatus of one embodiment of the present invention, a process in which the insulating layer 127 is provided to overlap with the end portion of the island-shaped EL layer after formation of an island-shaped EL layer (hereinafter referred to as a process 1) is employed.

Meanwhile, as a process different from the process 1, a process in which after the pixel electrode is formed in an island shape, an insulating film (also referred to as a wall or a structure body) covering the end portion of the pixel electrode is formed, and then the island-shaped EL layer is formed over the pixel electrode and the insulating film (hereinafter referred to as a process 2) can be given.

The above process 1 is suitable as compared to the process 2 because the margin can be made wider. More specifically, the process 1 has a wider margin with respect to alignment accuracy between different patterning steps than the process 2 and can provide a display apparatus with less variations. Therefore, since the method for manufacturing the display apparatus of one embodiment of the present invention is based on the process 1, a display apparatus with less variation and high display quality can be provided.

Next, examples of materials for the insulating layer 125 and the insulating layer 127 are described.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer in forming the insulating layer 127 which is to be described later.

In particular, when an inorganic insulating film such as an aluminum oxide film, a hafnium oxide film, or a silicon oxide film formed by an atomic layer deposition (ALD) method is used as the insulating layer 125, the insulating layer 125 having few pin holes and an excellent function of protecting the EL layer can be formed. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating film against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as a function of less easily transmitting the substance). Alternatively, a barrier property refers to a function of capturing or fixing (also referred to as gettering) a particular substance.

When the insulating layer 125 has a function of the barrier insulating layer or a gettering function, entry of impurities (typically, at least one of water and oxygen) that would diffuse into the light-emitting devices from the outside can be inhibited. With this structure, a highly reliable light-emitting device and a highly reliable display apparatus can be provided.

The insulating layer 125 preferably has a low impurity concentration. Accordingly, deterioration of the EL layer, which is caused by entry of impurities into the EL layer from the insulating layer 125, can be inhibited. In addition, when the impurity concentration is reduced in the insulating layer 125, a barrier property against at least one of water and oxygen can be increased. For example, it is desirable that one or both of the hydrogen concentration and the carbon concentration in the insulating layer 125 be sufficiently low.

Note that the same material are can be used for the insulating layer 125, the mask layer 118*a*, the mask layer 118*b*, and the mask layer 118*c*. In this case, the boundary between the insulating layer 125 and any of the mask layers

118*a*, 118*b*, and 118*c* is unclear and thus the layers cannot be distinguished from each other in some cases. Thus, the insulating layer 125 and any of the mask layers 118*a*, 118*b*, and 118*c* are observed as one layer in some cases. That is, observation, in some cases, shows that one layer appears to be provided in contact with the side surface and part of the top surface of each of the first layer 113*a*, the second layer 113*b*, and the third layer 113*c*, and the insulating layer 127 appears to cover at least part of a side surface of the one layer.

The insulating layer 127 provided over the insulating layer 125 has a function of reducing extreme unevenness of the insulating layer 125, which is formed between the adjacent light-emitting devices. In other words, the insulating layer 127 has an effect of improving the flatness of the formation surface of the common electrode 115.

As the insulating layer 127, an insulating layer containing an organic material can be suitably used. As the organic material, a photosensitive organic resin is preferably used, and for example, a photosensitive resin composition containing an acrylic resin is used. Note that in this specification and the like, an acrylic resin refers to not only a polymethacrylic acid ester or a methacrylic resin, but also all the acrylic polymer in a broad sense in some cases.

Alternatively, for the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like may be used. Alternatively, for the insulating layer 127, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used. A photoresist may be used for the photosensitive resin. As the photosensitive organic resin, either a positive material or a negative material may be used.

A material absorbing visible light may be used for the insulating layer 127. When the insulating layer 127 absorbs light emitted from the light-emitting device, leakage of light (stray light) from the light-emitting device to the adjacent light-emitting device through the insulating layer 127 can be inhibited. Thus, the display quality of the display apparatus can be improved. Since the display quality of the display apparatus can be improved without using a polarizing plate, the weight and thickness of the display apparatus can be reduced.

Examples of the material absorbing visible light include materials containing pigment of black or the like, materials containing dye, light-absorbing resin materials (e.g., polyimide), and resin materials that can be used for color filters (color filter materials). Using a resin material obtained by stacking or mixing color filter materials of two or three or more colors is particularly preferred to enhance the effect of blocking visible light. In particular, mixing color filter materials of three or more colors enables the formation of a black or nearly black resin layer.

A material used for the insulating layer 127 preferably has the low volume shrinkage rate. This facilitates formation of the insulating layer 127 into a desired shape. In addition, the volume shrinkage rate of the insulating layer 127 after curing is preferably low. Accordingly, the shape of the insulating layer 127 is easily maintained in various steps after the formation of the insulating layer 127. Specifically, the volume shrinkage rate of the insulating layer 127 after thermal curing, after light curing, or after light curing and thermal curing is preferably less than or equal to 10%, further preferably less than or equal to 5%, still further preferably less than or equal to 1%. Here, as the volume shrinkage rate, either a value of the volume shrinkage rate by light irradiation or a value of the volume shrinkage rate by heating, or the sum of these can be used.

Next, a structure of the insulating layer 127 and the vicinity thereof will be described with reference to FIG. 3A and FIG. 3B. FIG. 3A is an enlarged cross-sectional view of the insulating layer 127 between the light-emitting device 130*a* and the light-emitting device 130*b* and some components around the insulating layer 127. Although the insulating layer 127 between the light-emitting device 130*a* and the light-emitting device 130*b* is described as an example below, the same applies to the insulating layer 127 between the light-emitting device 130*b* and the light-emitting device 130*c*, the insulating layer 127 between the light-emitting device 130*c* and the light-emitting device 130*a*, and the like.

Figure 3B:
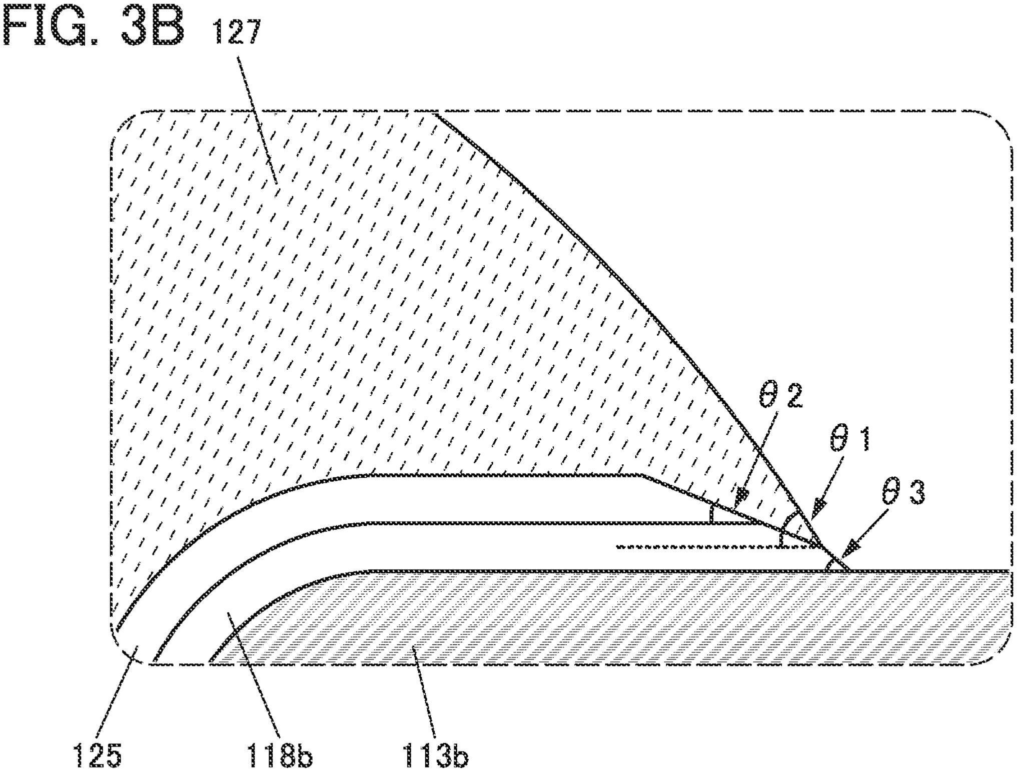

FIG. 3B is an enlarged view of an end portion of the insulating layer 127 over the second layer 113*b* and the vicinity thereof illustrated in FIG. 3A. The description made below sometimes using the end portion of the insulating layer 127 over the second layer 113*b* as an example applies to an end portion of the insulating layer 127 over the first layer 113*a*, an end portion of the insulating layer 127 over the third layer 113*c*, and the like.

As illustrated in FIG. 3A, the first layer 113*a* is provided to cover the pixel electrode 111*a* and the second layer 113*b* is provided to cover the pixel electrode 111*b*. The mask layer 118*a* is provided in contact with part of the top surface of the first layer 113*a*, and the mask layer 118*b* is provided in contact with part of the top surface of the second layer 113*b*. The insulating layer 125 is provided in contact with the top surface and a side surface of the mask layer 118*a*, the side surface of the first layer 113*a*, the top surface of the insulating layer 255*c*, the top surface and a side surface of the mask layer 118*b*, and the side surface of the second layer 113*b*. The insulating layer 125 covers part of the top surface of the first layer 113*a* and part of the top surface of the second layer 113*b*. The insulating layer 127 is provided in contact with the top surface of the insulating layer 125. The insulating layer 127 overlaps with part of the top surface and the side surface of the first layer 113*a* and part of the top surface and the side surface of the second layer 113*b* with the insulating layer 125 therebetween and is in contact with at least part of the side surface of the insulating layer 125. The common layer 114 is provided to cover the first layer 113*a*, the mask layer 118*a*, the second layer 113*b*, the mask layer 118*b*, the insulating layer 125, and the insulating layer 127, and the common electrode 115 is provided over the common layer 114.

The insulating layer 127 is formed in a region between two island-shaped EL layers (a region between the first layer 113*a* and the second layer 113*b* in FIG. 3A). At this time, at least part of the insulating layer 127 is positioned between an end portion of a side surface of one of the EL layers (the first layer 113*a* in FIG. 3A) and an end portion of a side surface of the other of the EL layers (the second layer 113*b* in FIG. 3A). Providing such an insulating layer 127 can prevent formation of a disconnected portion and a locally thinned portion in the common layer 114 and the common electrode 115 that are formed over the island-shaped EL layers and the insulating layer 127.

As illustrated in FIG. 3B, the end portion of the insulating layer 127 preferably has a tapered shape with a taper angle θ1 in a cross-sectional view of the display apparatus. The taper angle θ1 is an angle formed by a side surface of the insulating layer 127 and the substrate surface. Note that the taper angle θ1 is not limited to the angle with the substrate surface, and may be an angle formed by the side surface of the insulating layer 127 and the top surface of a flat portion of the second layer 113*b* or the top surface of a flat portion of the pixel electrode 111*b*.

The taper angle θ1 of the insulating layer 127 is less than 90°, preferably less than or equal to 60°, further preferably less than or equal to 45°, still further preferably less than or equal to 20°. When the end portion of the insulating layer 127 has such a forward tapered shape, the common layer 114 and the common electrode 115 that are provided over the insulating layer 127 can be formed with favorable coverage, thereby inhibiting step disconnection, local thinning, or the like. Accordingly, the in-place uniformity of the common layer 114 and the common electrode 115 can be improved, leading to higher display quality of the display apparatus.

As illustrated in FIG. 3A, in a cross-sectional view of the display apparatus, the top surface of the insulating layer 127 preferably has a convex curved shape. The convex curved top surface of the insulating layer 127 preferably has a shape that bulges gently toward the center. It is also preferable that the convex curved portion in the center portion of the top surface of the insulating layer 127 be smoothly connected to the tapered portion of the end portion. When the insulating layer 127 has such a shape, the common layer 114 and the common electrode 115 can be formed with good coverage over the whole insulating layer 127.

As illustrated in FIG. 3B, the end portion of the insulating layer 127 is preferably positioned outward from an end portion of the insulating layer 125. In this case, unevenness of the formation surface of the common layer 114 and the common electrode 115 can be reduced and coverage with the common layer 114 and the common electrode 115 can be improved.

As illustrated in FIG. 3B, the end portion of the insulating layer 125 preferably has a tapered shape with a taper angle θ2 in the cross-sectional view of the display apparatus. The taper angle θ2 is an angle formed by the side surface of the insulating layer 125 and the substrate surface. Note that the taper angle θ2 is not limited to the angle with the substrate surface, and may be an angle formed by the side surface of the insulating layer 125 and the top surface of the flat portion of the second layer 113*b* or the top surface of the flat portion of the pixel electrode 111*b*.

The taper angle θ2 of the insulating layer 125 is less than 90°, preferably less than or equal to 60°, further preferably less than or equal to 45°, still further preferably less than or equal to 20°.

As illustrated in FIG. 3B, an end portion of the mask layer 118*b* preferably has a tapered shape with a taper angle θ3 in the cross-sectional view of the display apparatus. The taper angle θ3 is an angle formed by the side surface of the mask layer 118*b* and the substrate surface. Note that the taper angle θ3 is not limited to the angle with the substrate surface, and may be an angle formed by the side surface of the insulating layer 127 and the top surface of the flat portion of the second layer 113*b* or the top surface of the flat portion of the pixel electrode 111*b*.

The taper angle θ3 of the mask layer 118*b* is less than 90°, preferably less than or equal to 60°, further preferably less than or equal to 45°, still further preferably less than or equal to 20°. When the mask layer 118*b* has such a forward tapered shape, the common layer 114 and the common electrode 115 that are provided over the mask layer 118*b* can be formed with favorable coverage.

The end portion of the mask layer 118*a* and the end portion of the mask layer 118*b* are each preferably positioned outward from the end portion of the insulating layer 125. In this case, unevenness of the formation surface of the common layer 114 and the common electrode 115 can be reduced and coverage with the common layer 114 and the common electrode 115 can be improved.

Although the details will be described in Embodiment 2, when the insulating layer 125 and the mask layer 118 are collectively etched, the insulating layer 125 and the mask layer below the end portion of the insulating layer 127 are eliminated by side etching and accordingly a cavity is formed in some cases. The cavity causes unevenness in the formation surface of the common layer 114 and the common electrode 115, so that step disconnection is likely to occur in the common layer 114 and the common electrode 115. Thus, the etching treatment is performed in two separate steps with heat treatment performed between the two etching steps, whereby even when a cavity is formed by the first etching treatment, the cavity can be filled with the insulating layer 127 deformed by the heat treatment.

In addition, since the second etching treatment etches a thin film, the amount of side etching is small and thus a cavity is not easily formed or formed to be extremely small. Thus, generation of unevenness in the formation surface of the common layer 114 and the common electrode 115 can be inhibited and accordingly step disconnection of the common layer 114 and the common electrode 115 can be inhibited.

Since the etching treatment is performed twice in this manner, the taper angle θ2 and the taper angle θ3 are different from each other in some cases. The taper angle θ2 and the taper angle θ3 may be the same. Furthermore, the taper angle θ2 and the taper angle θ3 may each be smaller than the taper angle θ1.

The insulating layer 127 covers at least part of the side surface of the mask layer 118*a* and at least part of the side surface of the mask layer 118*b* in some cases. FIG. 3B illustrates an example where the insulating layer 127 covers and is in contact with an inclined surface at the end portion of the mask layer 118*b* which is formed by the first etching treatment, and an inclined surface at the end portion of the mask layer 118*b* which is formed by the second etching treatment is exposed. In some cases, these two inclined surfaces can be distinguished from each other because of their different taper angles. There might be almost no difference between the taper angles made at the side surfaces by the etching treatment performed twice; in this case, the inclined surfaces cannot be distinguished from each other.

Figure 4A:
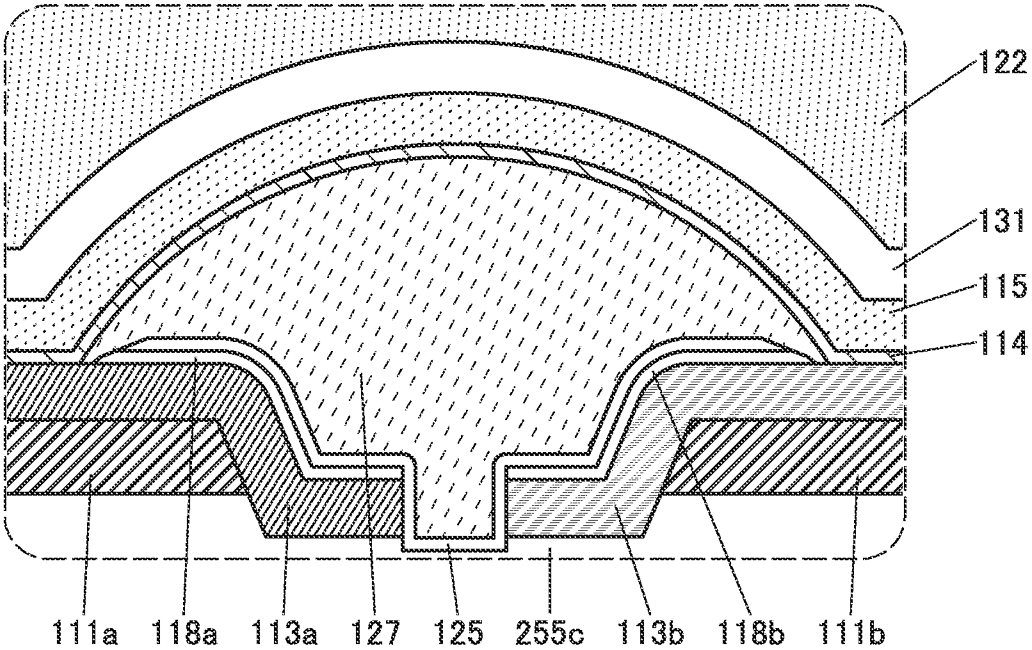
FIG. 4A and FIG. 4B are cross-sectional views illustrating an example of a display apparatus.
Figure 4B:
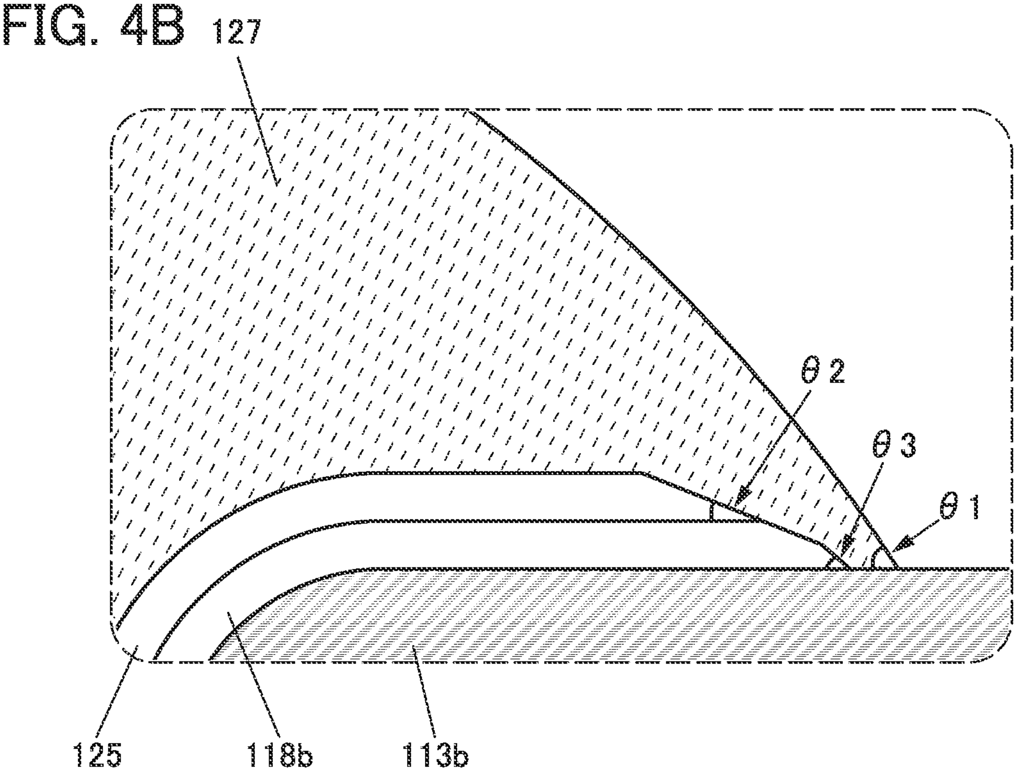

FIG. 4A and FIG. 4B illustrate an example in which the insulating layer 127 covers the entire side surface of the mask layer 118*a* and the entire side surface of the mask layer 118*b*. Specifically, in FIG. 4B, the insulating layer 127 covers and is in contact with both of the two inclined surfaces. This is preferable because unevenness of the formation surface of the common layer 114 and the common electrode 115 can be further reduced. FIG. 4B illustrates an example where the end portion of the insulating layer 127 is positioned outward from the end portion of the mask layer 118*b*. As illustrated in FIG. 3B, the end portion of the insulating layer 127 may be positioned on the inner side of the end portion of the mask layer 118*b*, or may be aligned or substantially aligned with the end portion of the mask layer 118*b*. As illustrated in FIG. 4B, the insulating layer 127 is in contact with the second layer 113*b* in some cases.

FIG. 5A, FIG. 5B, FIG. 6A, and FIG. 6B illustrate an example where the side surface of the insulating layer 127 has a concave curved shape (also referred to as a narrowed portion, a depressed portion, a dent, a hollow, or the like). Depending on the materials and the formation conditions (e.g., heating temperature, heating time, and heating atmosphere) of the insulating layer 127, the side surface of the insulating layer 127 has a concave curved shape in some cases.

Figure 5A:
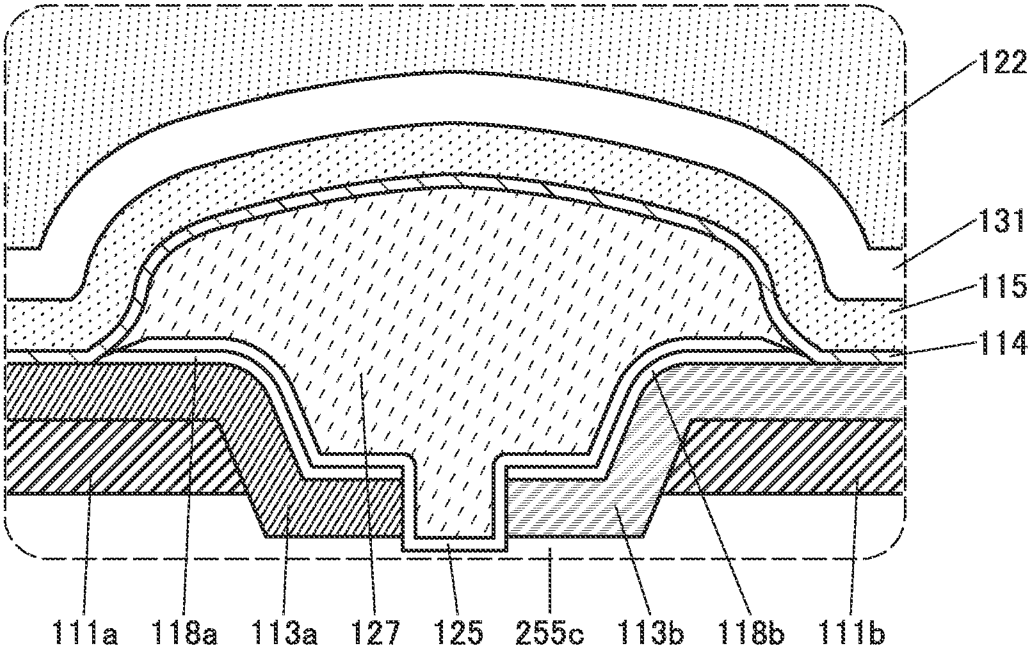
FIG. 5A and FIG. 5B are cross-sectional views illustrating an example of a display apparatus.
Figure 5B:
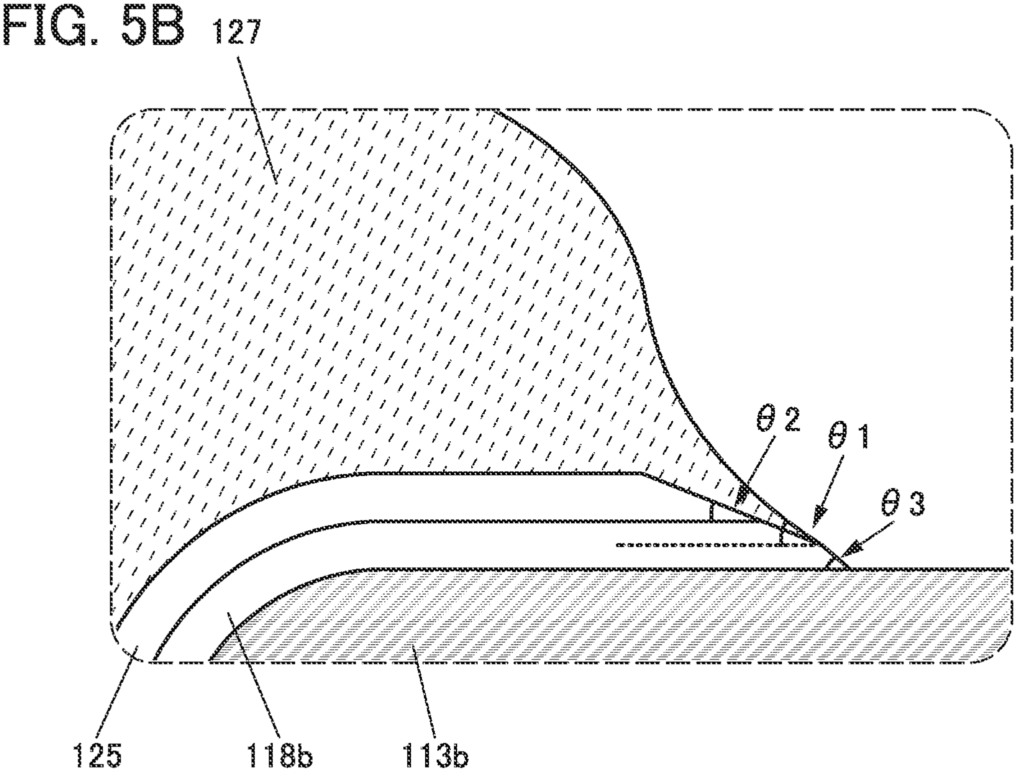
Figure 6A:
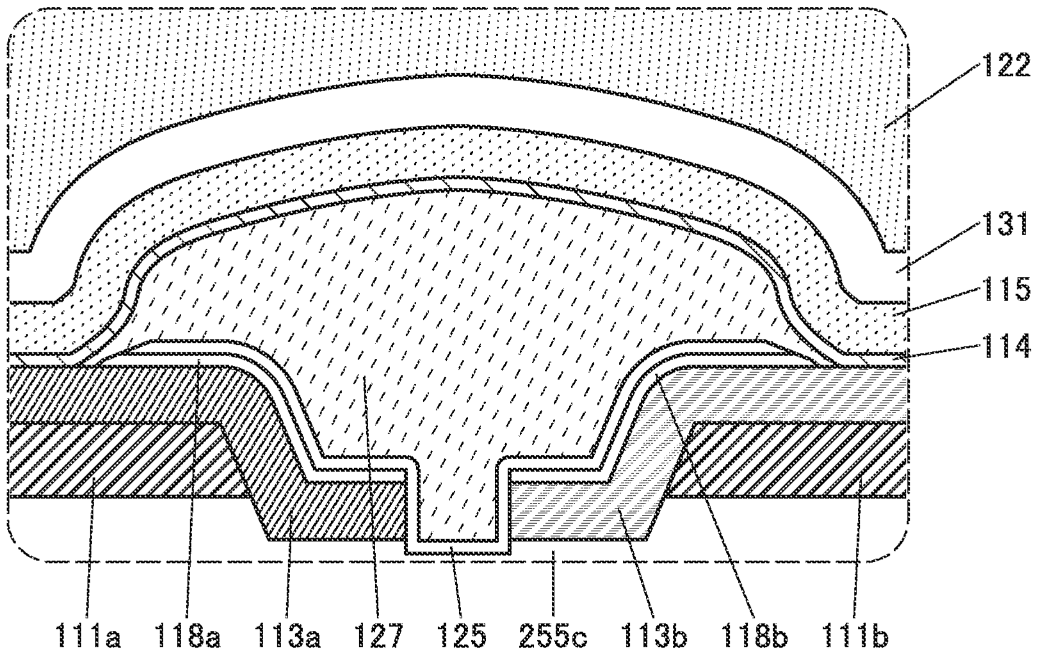
FIG. 6A and FIG. 6B are cross-sectional views illustrating an example of a display apparatus.
Figure 6B:
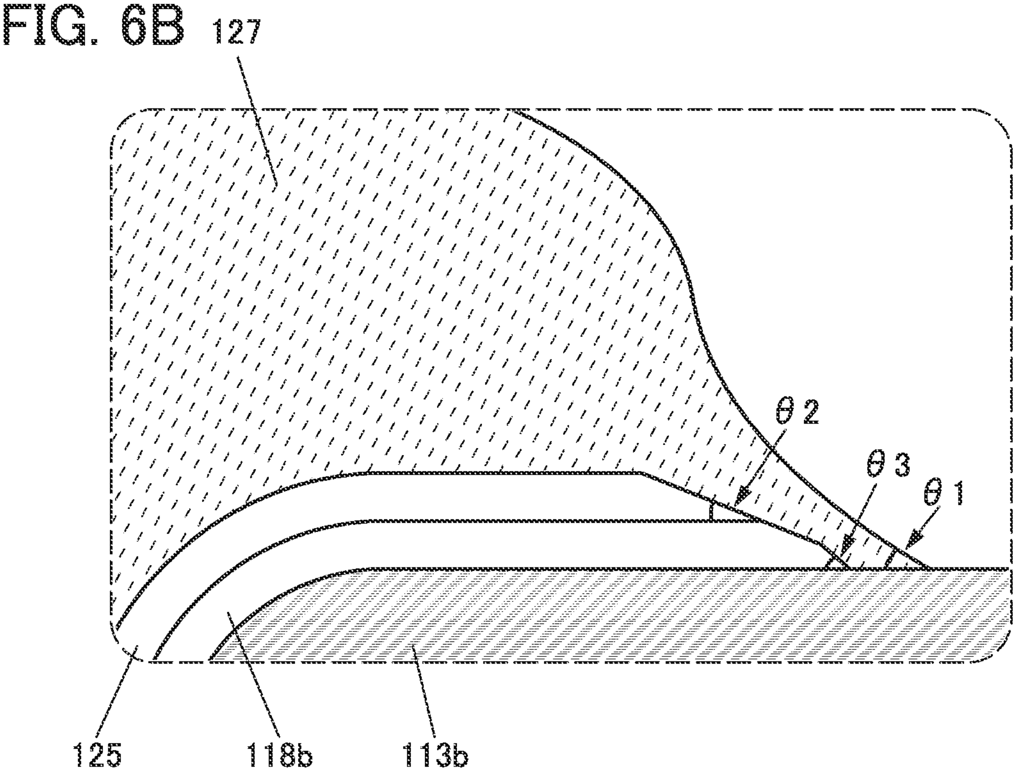

FIG. 5A and FIG. 5B illustrate an example where the insulating layer 127 covers part of the side surface of the mask layer 118*b* and the other part of the side surface of the mask layer 118*b* is exposed. FIG. 6A and FIG. 6B illustrate an example in which the insulating layer 127 covers and is in contact with the entire side surface of the mask layer 118*a* and the entire side surface of the mask layer 118*b*.

The taper angle θ1 to the taper angle θ3 in FIG. 4 to FIG. 6 are also preferably within the above range.

As illustrated in FIG. 3 to FIG. 6, one end portion of the insulating layer 127 preferably overlaps with the top surface of the pixel electrode 111*a* and the other end portion of the insulating layer 127 preferably overlaps with the top surface of the pixel electrode 111*b*. Such a structure enables the end portions of the insulating layer 127 to be formed over substantially flat regions of the first layer 113*a* and second layer 113*b*.

This makes it relatively easy to form a tapered shape in each of the insulating layer 127, the insulating layer 125, and the mask layer 118. Furthermore, peeling of the pixel electrodes 111*a* and 111*b*, the first layer 113*a*, and the second layer 113*b* can be inhibited. Meanwhile, a portion where the top surface of the pixel electrode and the insulating layer 127 overlap with each other is preferably smaller because the light-emitting region of the light-emitting device can be wider and the aperture ratio can be higher.

Figure 7A:
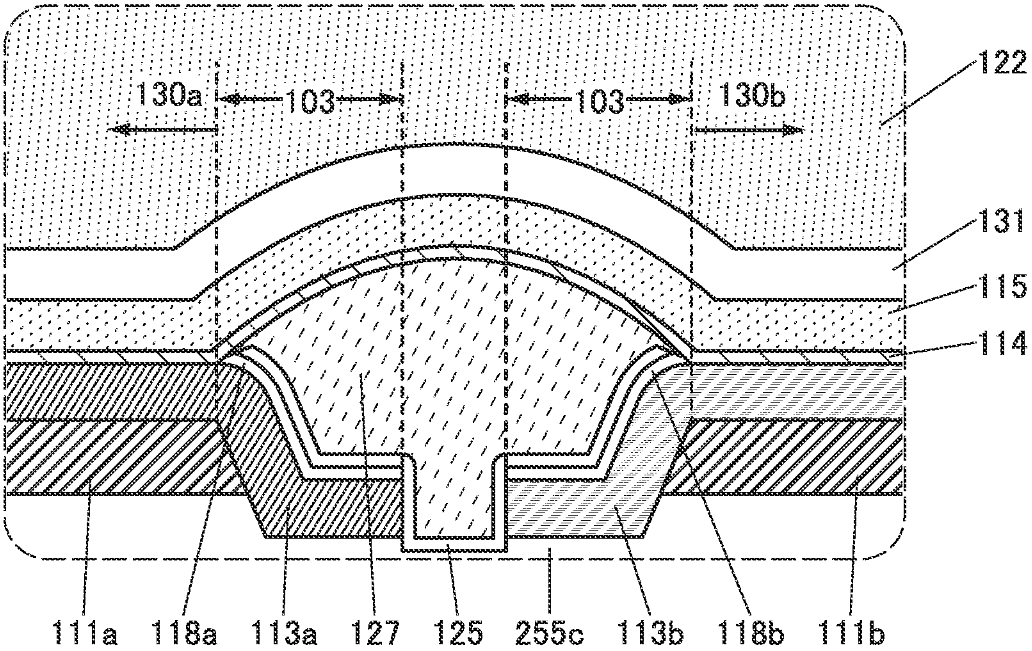
FIG. 7A and FIG. 7B are cross-sectional views illustrating examples of a display apparatus.
Figure 7B:
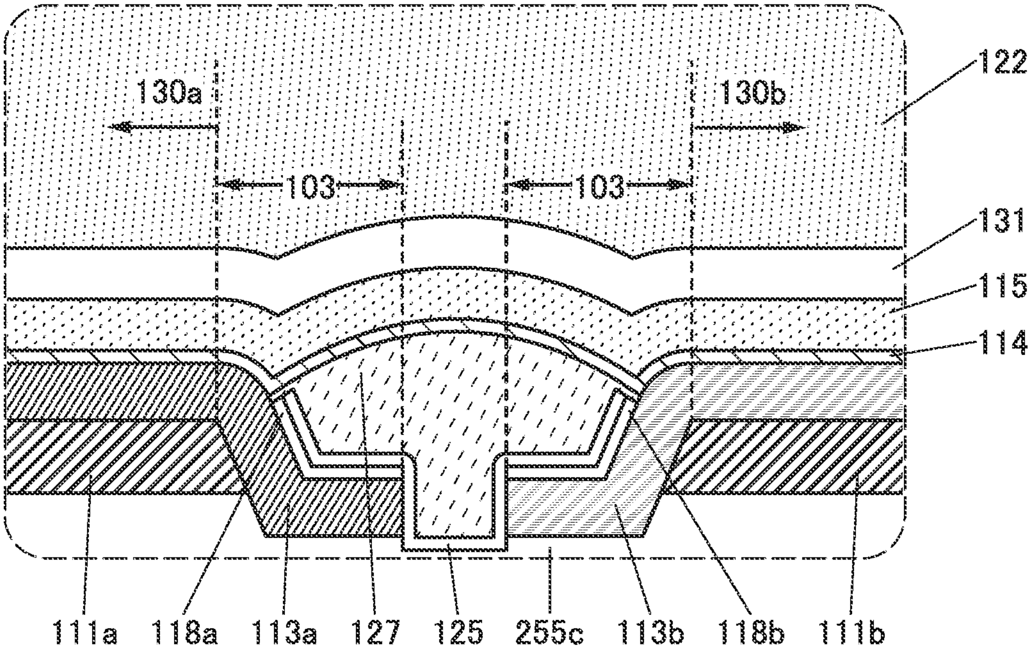

Note that the insulating layer 127 does not necessarily overlap with the top surface of the pixel electrode. As illustrated in FIG. 7A, the insulating layer 127 does not necessarily overlap with the top surface of the pixel electrode, and one end portion of the insulating layer 127 may overlap with the side surface of the pixel electrode 111*a* and the other end portion of the insulating layer 127 may overlap with the side surface of the pixel electrode 111*b*. As illustrated in FIG. 7B, the insulating layer 127 does not necessarily overlap with the pixel electrode, and may be provided in a region interposed between the pixel electrode 111*a* and the pixel electrode 111*b*.

In FIG. 7A and FIG. 7B, part or the whole of the top surfaces of the first layer 113*a* and the second layer 113*b* in the inclined portion and the flat portion (the region 103) positioned on the outer side of the top surface of the pixel electrode is covered with the mask layer 118, the insulating layer 125, and the insulating layer 127. Even such a structure can reduce unevenness of the formation surface of the common layer 114 and the common electrode 115 and improve the coverage with the common layer 114 and the common electrode 115, as compared with the structure where the mask layer 118, the insulating layer 125, and the insulating layer 127 are not provided.

Figure 8A:
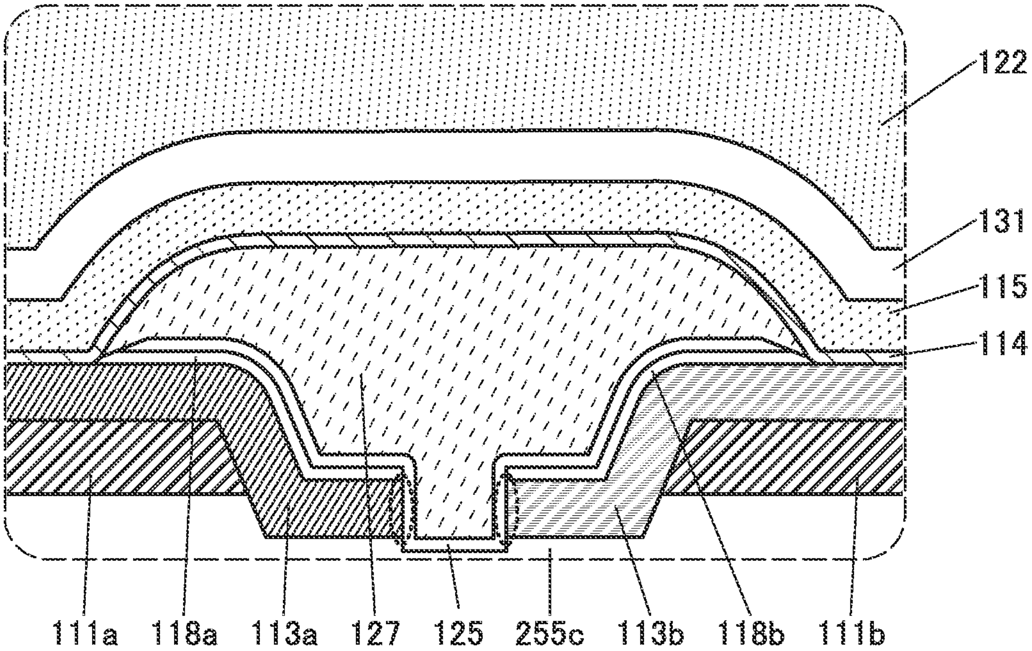
FIG. 8A and FIG. 8B are cross-sectional views illustrating examples of a display apparatus.
Figure 8B:
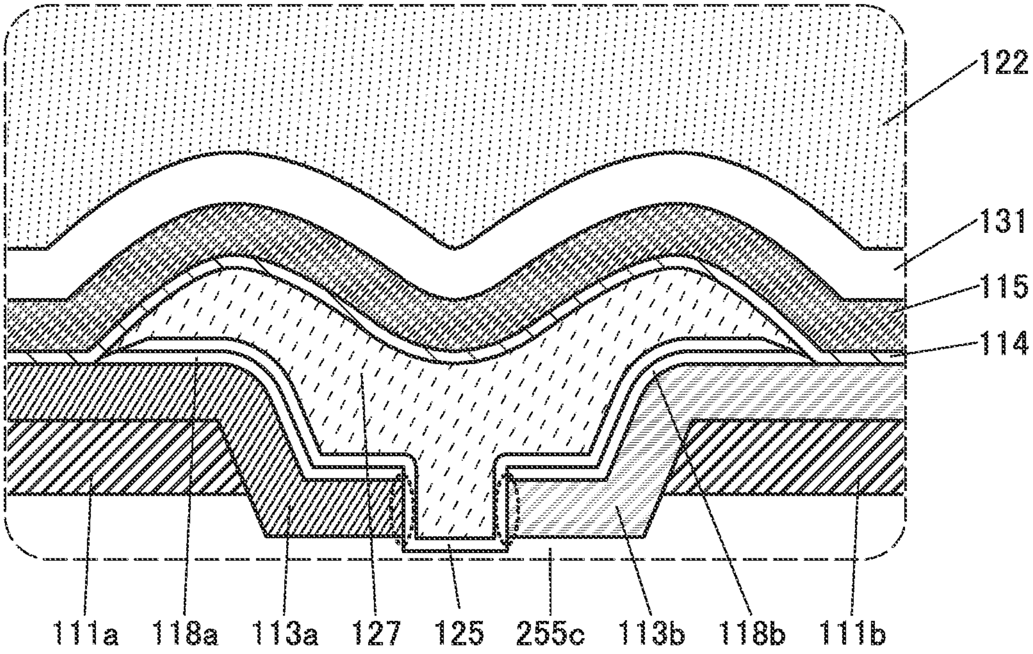

As illustrated in FIG. 8A, the top surface of the insulating layer 127 may have a flat shape in a cross-sectional view of the display apparatus. As illustrated in FIG. 8B, the top surface of the insulating layer 127 may have a concave curved shape. In FIG. 8B, the top surface of the insulating layer 127 has a shape that bulges gently toward the center, i.e., has a convex curved surface, and has a depressed shape in the center and its vicinity, i.e., has a concave curved surface. In FIG. 8B, the convex curved portion of the top surface of the insulating layer 127 can be smoothly connected to the tapered portion of the end portion. Even when the insulating layer 127 has such a shape, the common layer 114 and the common electrode 115 can be formed with good coverage over the whole insulating layer 127.

When the insulating layer 127 has a concave curved surface in the center portion as illustrated in FIG. 8B, stress of the insulating layer 127 can be relieved. More specifically, with a structure including a concave curved surface in the center portion of the insulating layer 127, local stress generated at the end portion of the insulating layer 127 can be relieved, so that one or more of peeling between the first layer 113*a* and the mask layer 118*a*, peeling between the mask layer 118*a* and the insulating layer 125, and peeling of the insulating layer 125 and the insulating layer 127 can be inhibited.

As described above, in each of the structures illustrated in FIG. 3 to FIG. 8, provision of the insulating layer 127, the insulating layer 125, the mask layer 118*a*, and the mask layer 118*b* enables the common layer 114 and the common electrode 115 to be formed with high coverage in a range from the substantially flat region of the first layer 113*a* to the substantially flat region of the second layer 113*b*. It is also possible to prevent formation of a disconnected portion and a locally thinned portion in the common layer 114 and the common electrode 115.

Thus, between the light-emitting devices, a connection defect caused by the disconnected portion and an increase in electric resistance caused by the locally thinned portion can be inhibited from occurring in the common layer 114 and the common electrode 115. Thus, the display quality of the display apparatus of one embodiment of the present invention can be improved.

Next, the lens 133 provided over each of the light-emitting devices 130*a* to 130*c* is described with reference to cross-sectional views of FIG. 9A to FIG. 10B. Note that FIG. 9A, FIG. 9B, FIG. 10A, and FIG. 11 illustrate examples of components typically included in the light-emitting device 130*a*. FIG. 10B illustrates examples of components typically included in the light-emitting devices 130*a* and 130*b*.

Figure 9A:
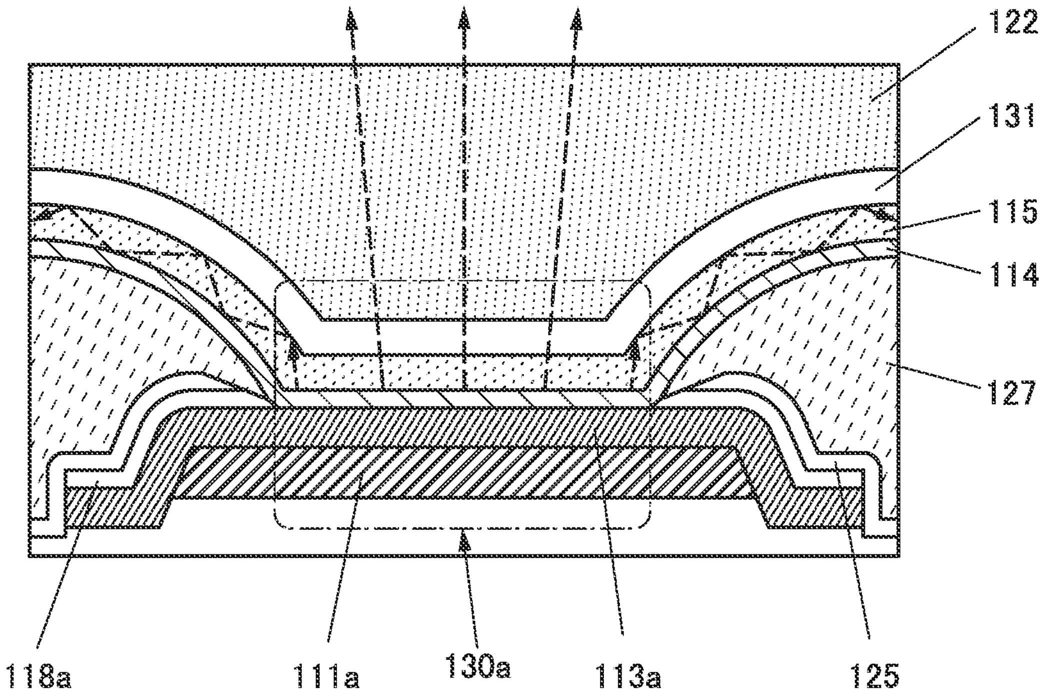
FIG. 9A and FIG. 9B are cross-sectional views illustrating examples of a display apparatus.

FIG. 9A is a comparative example in which the lens 133 is not provided, and is a diagram simply illustrating an optical path of light emitted from the light-emitting device. Note that slight reflection or the like at interfaces between layers is not illustrated. Most of light emitted from the light-emitting device passes through a perpendicular optical path or a substantially perpendicular optical path and is extracted to the outside. However, as illustrated in FIG. 9A, part of light emitted from the light-emitting device proceeds in the lateral direction through the common electrode 115 formed of the light-transmitting conductive film and provided over the insulating layer 127 as a waveguide and fails to be extracted to the outside. That is, the phenomenon is one factor of a reduction in light extraction efficiency.

As an example of a factor causing the common electrode 115 to become a waveguide, a difference in a refractive index between the common electrode 115 and layers over and under the common electrode 115 can be given. Another factor is an increase of incident angle of light entering the common electrode 115 over the insulating layer 127 due to the common electrode 115 provided to extend beyond the insulating layer 127.

As illustrated in FIG. 9A, the protective layer 131 is provided over and in contact with the common electrode 115, and the common layer 114 is provided under and in contact with the common electrode 115. Here, in the case where the refractive index of the common electrode 115 is $n_{115}$, the refractive index of the protective layer 131 is $n_{131}$, the refractive index of the common layer 114 is $n_{114}$, and $n_{115}>n_{131}$ and $n_{115}>n_{114}$ are satisfied, light with a large incident angle with respect to an interface of each layer is likely to be totally reflected. Thus, light does not enter the protective layer 131 or the common layer 114 and proceeds in the lateral direction through the common electrode 115 as a waveguide. Note that the refractive index here refers to a refractive index with respect to light in the range of the wavelengths of light emitted from the light-emitting devices (the wavelength range of blue to red) or a refractive index with respect to visible light.

In the case where the light-emitting device has a microcavity structure, an electrode having a light-transmitting property and a light-reflecting property (a transflective electrode) is preferably used as the common electrode 115. Thus, an electrode having a reflecting property is formed on the common layer 114 side of the common electrode 115 in some cases. Thus, light reflection by the electrode is one of the factors causing the common electrode 115 to become a waveguide.

Figure 9B:
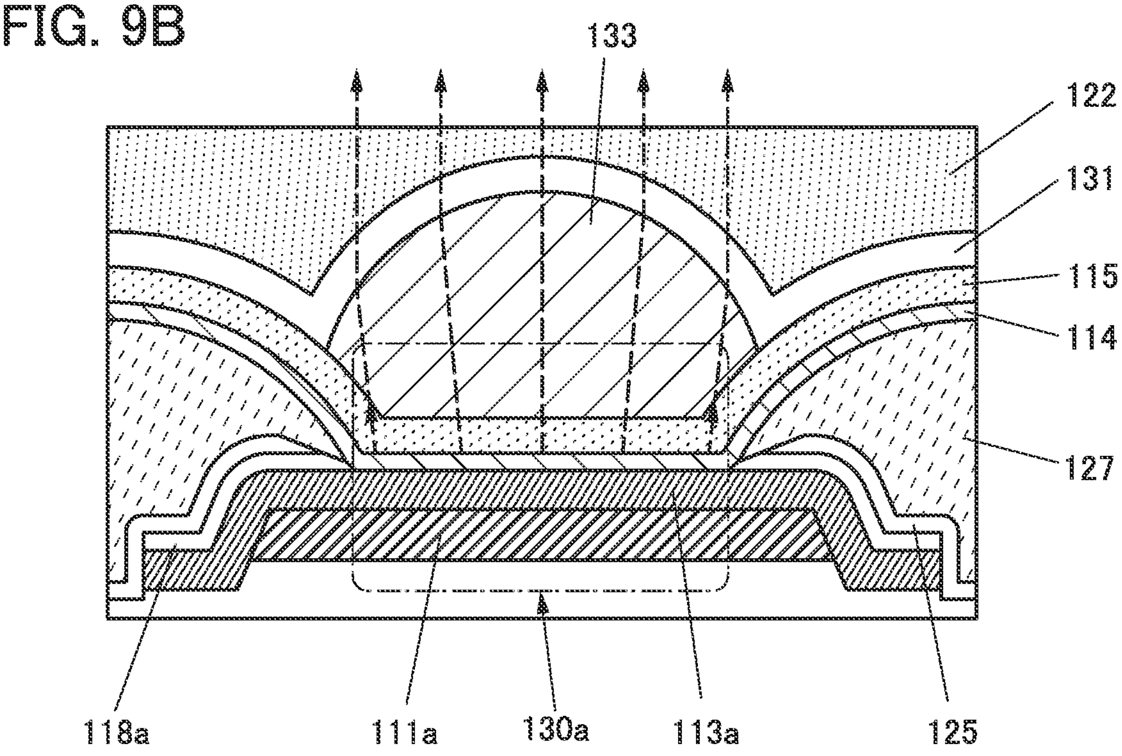

Therefore, in one embodiment of the present invention, as illustrated in FIG. 9B, the lens 133 is provided between the common electrode 115 and the protective layer 131 in a region overlapping with a light-emitting portion of the light-emitting device. Note that in FIG. 9B, the light-emitting portion is a region where the first layer 113*a* and the common layer 114 are in contact with each other. In the case where the common layer 114 is not provided, the light-emitting portion is a region where the first layer 113*a* and the common electrode 115 are in contact with each other.

A lens having a convex surface and a flat surface on the surface opposite to the convex surface as illustrated in FIG. 9B is referred to as a plano-convex lens. The lens 133 can be fabricated using a material and a process similar to those for the insulating layer 127 described above.

In one embodiment of the present invention, the lens 133 is formed such that a surface opposite to the convex surface of the plano-convex lens is in contact with the common electrode 115. When the refractive index of the lens 133 is $n_{133}$, $n_{133}$ is equivalent to $n_{115}$, and preferably $n_{133}$ is higher than $n_{115}$.

With such a structure, even when light enters the interface between the common electrode 115 and the lens 133 at a large incident angle, the light is not totally reflected and transmits from the common electrode 115 to the lens 133. The light which enters the lens 133 reaches the protective layer 131 and the resin layer 122 provided over the lens 133; since the incident angle at each interface is not large, the light can be extracted to the outside regardless of the refractive indices of the protective layer 131 and the resin layer 122. Thus, by providing the lens 133 with the above-described refractive indices, light extraction efficiency can be increased.

Even in the case where $n_{133}$ is smaller than $n_{115}$, setting the difference therebetween small can inhibit total reflection of light incident at a relatively large incident angle and facilitate transmission of the light from the common electrode 115 to the lens 133. In this case, for example, $n_{133}$ is a value lower than $n_{115}$ by 1% to 30%, preferably $n_{133}$ is a value lower than $n_{115}$ by 1% to 20%, and further preferably $n_{133}$ is a value lower than $n_{115}$ by 1% to 10%.

Figure 10A:
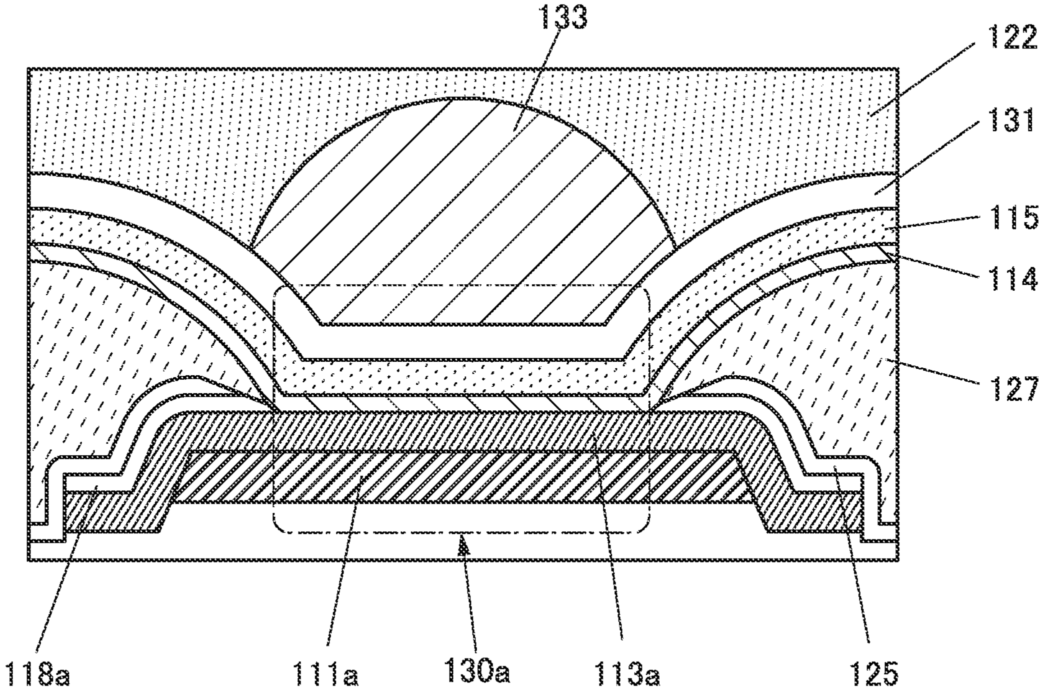
FIG. 10A and FIG. 10B are cross-sectional views illustrating an examples of a display apparatus.
Figure 10B:
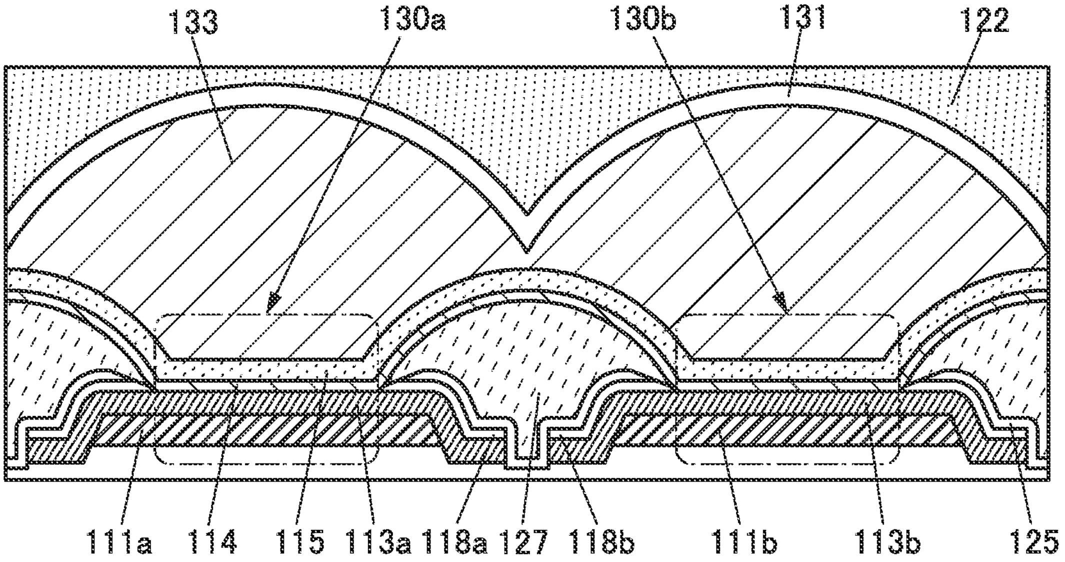

Note that as illustrated in FIG. 10A, the protective layer 131 may be provided between the common electrode 115 and the lens 133 as long as $n_{133}$ and $n_{131}$ are equivalent to $n_{115}$, or $n_{133}$ and $n_{131}$ are equivalent to each other and are higher than $n_{115}$.

As illustrated in FIG. 10B, end portions of the lenses 133 may be connected in adjacent pixels. With this structure, a region where the common electrode 115 and the protective layer 131 are in contact with each other can be omitted. Thus, the interface between the common electrode 115 and the protective layer 131 which causes total reflection can be omitted, so that the light extraction efficiency can be increased.

Figure 11:
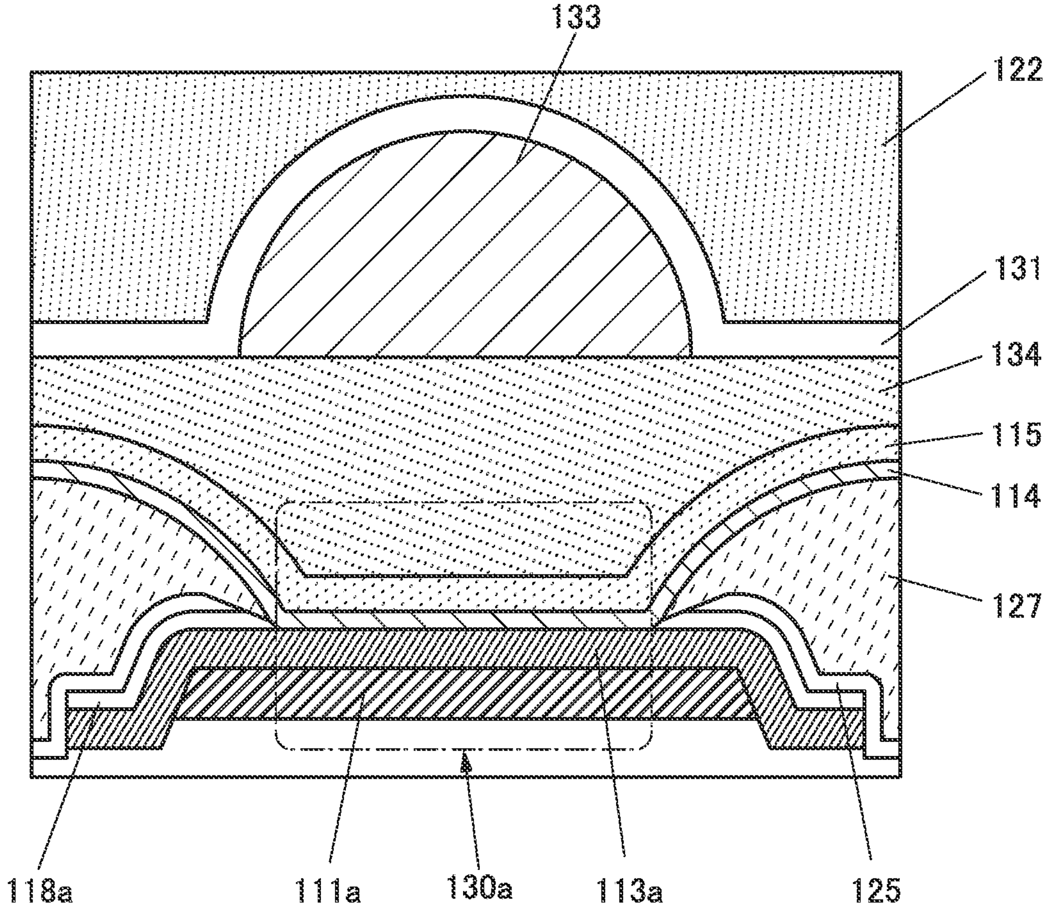
FIG. 11 is a cross-sectional view illustrating an example of a display apparatus.

As illustrated in FIG. 11, an insulating layer 134 may be provided between the common electrode 115 and the lens 133; the insulating layer 134 is a layer for adjusting the distance between the lens 133 and the light-emitting portion. The insulating layer 134 is preferably formed using a material similar to that for the lens 133. Note that the structures illustrated in FIG. 10A, FIG. 10B, and FIG. 11 can be combined as appropriate.

The protective layer 131 provided over the light-emitting devices 130*a*, 130*b*, and 130*c* may have a single-layer structure or a stacked-layer structure of two or more layers. Providing the protective layer 131 can improve the reliability of the light-emitting devices.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting devices by preventing oxidation of the common electrode 115 and inhibiting entry of impurities (e.g., moisture and oxygen) into the light-emitting devices, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Specific examples of these inorganic insulating films are as listed in the description of the insulating layer 125. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can employ, for example, a stacked-layer structure of an aluminum oxide film and a silicon nitride film over the aluminum oxide film, or a stacked-layer structure of an aluminum oxide film and an IGZO film over the aluminum oxide film. With the use of the stacked-layer structure, impurities (e.g., water and oxygen) entering the EL layer side can be inhibited.

Furthermore, the protective layer 131 may include an organic film. The protective layer 131 may include both an organic film and an inorganic film. Examples of an organic material that can be used for the protective layer 131 include organic insulating materials that can be used for the insulating layer 127.

The protective layer 131 may have a stacked structure of two layers which are formed by different formation methods. Specifically, the first layer of the protective layer 131 may be formed by an ALD method, and the second layer of the protective layer 131 may be formed by a sputtering method.

A light-blocking layer may be provided on the surface of the substrate 120 on the resin layer 122 side. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120.

It is preferable to provide, as the surface protective layer, a glass layer or a silica layer ($SiO_x$ layer) to inhibit the surface contamination or damage. For the surface protective layer, DLC (diamond like carbon), aluminum oxide ($AlO_x$), a polyester-based material, a polycarbonate-based material, or the like may be used. For the surface protective layer, a material having a high visible light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate through which light from the light-emitting device is extracted is formed using a material that transmits the light. When a flexible material is used for the substrate 120, the flexibility of the display apparatus can be increased. Furthermore, a polarizing plate may be used as the substrate 120.

For the substrate 120, polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, and the like can be used. Glass that is thin enough to have flexibility may be used as the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display apparatus might be changed, e.g., creases might be caused. Thus, as the substrate, a film with a low water absorption rate is preferably used. For example, the water absorption rate of the film is lower than or equal to preferably 1%, further preferably lower than or equal to 0.1%, still further preferably lower than or equal to 0.01%.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. A two-component-mixture-type resin may be used. An adhesive sheet or the like may be used.

Figure 12A:
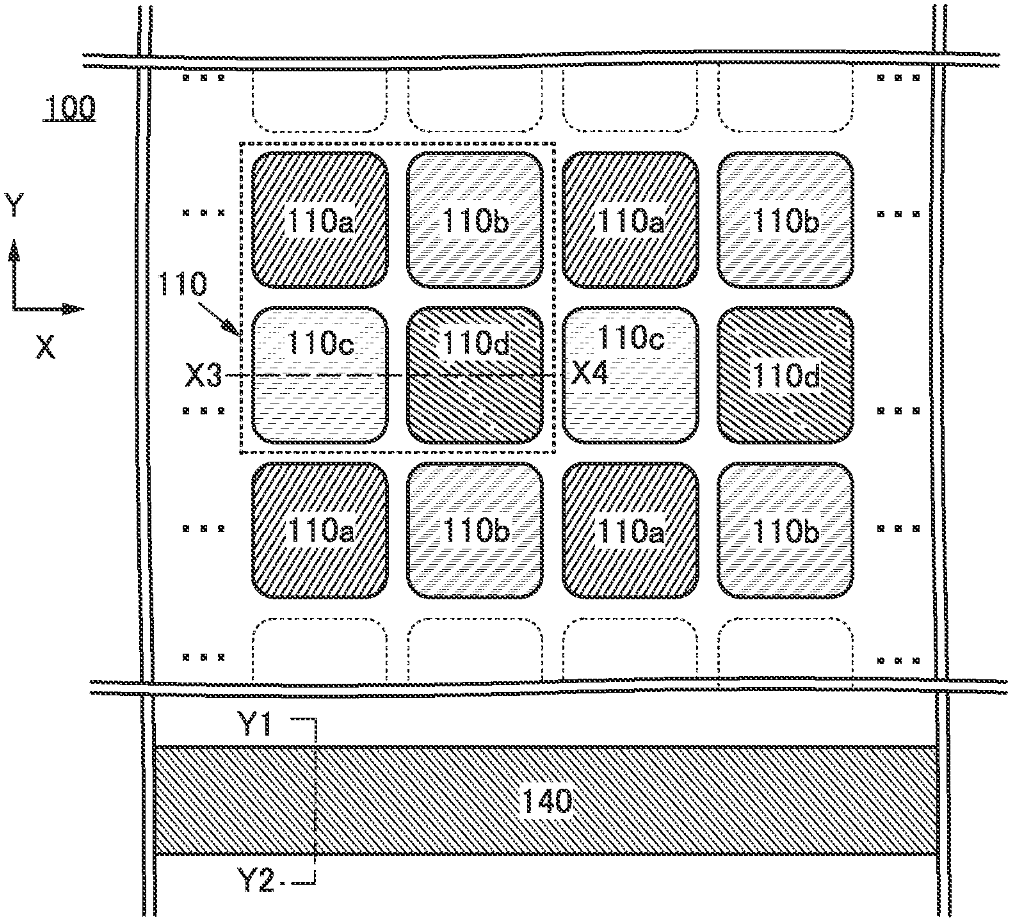
FIG. 12A is a top view illustrating an example of a display apparatus.

FIG. 12A is a top view of the display apparatus 100 different from that in FIG. 1A. The pixel 110 illustrated in FIG. 12A includes four types of subpixels 110*a*, 110*b*, 110*c*, and 110*d*.

The subpixels 110*a*, 110*b*, 110*c*, and 110*d* can include light-emitting devices that emit light of different colors. As the subpixels 110*a*, 110*b*, 110*c*, and 110*d*, for example, subpixels of four colors of R, G, B, and W, subpixels of four colors of R, G, B, and Y, and subpixels of R, G, B, and IR, and the like can be given.

The display apparatus of one embodiment of the present invention may include a light-receiving device in the pixel. For example, three of the four subpixels included in the pixel 110 illustrated in FIG. 12A may each include a light-emitting device and the other one may include a light-receiving device.

As the light-receiving device, a pn photodiode or a pin photodiode can be used. The light-receiving device functions as a photoelectric conversion device (also referred to as a photoelectric conversion element) that detects light entering the light-receiving device and generates charge. The amount of charge generated from the light-receiving device depends on the amount of light entering the light-receiving device.

The light-receiving device can detect one or both of visible light and infrared light. In the case of detecting visible light, for example, one or more of blue light, violet light, bluish violet light, green light, yellowish green light, yellow light, orange light, red light, and the like can be detected. The infrared light is preferably detected, in which case an object can be detected even in a dark place.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The organic EL device and the organic photodiode can be formed over one substrate. Thus, the organic photodiode can be incorporated into the display apparatus including the organic EL device.

When the light-receiving device is driven by application of reverse bias between the pixel electrode and the common electrode, light entering the light-receiving device can be detected and charge can be generated and extracted as a current.

A manufacturing method similar to that of the light-emitting device can be employed for the light-receiving device. An island-shaped active layer (also referred to as a photoelectric conversion layer) included in the light-receiving device is formed by processing a film to be the active layer deposited on the entire surface, not by using a fine metal mask; thus, the island-shaped active layer can be formed to have a uniform thickness. Moreover, providing the mask layer over the active layer can reduce damage to the active layer in the manufacturing process of the display apparatus, resulting in an improvement in reliability of the light-receiving device.

Embodiment 6 can be referred to for the structure and the materials of the light-receiving device.

Figure 12B:
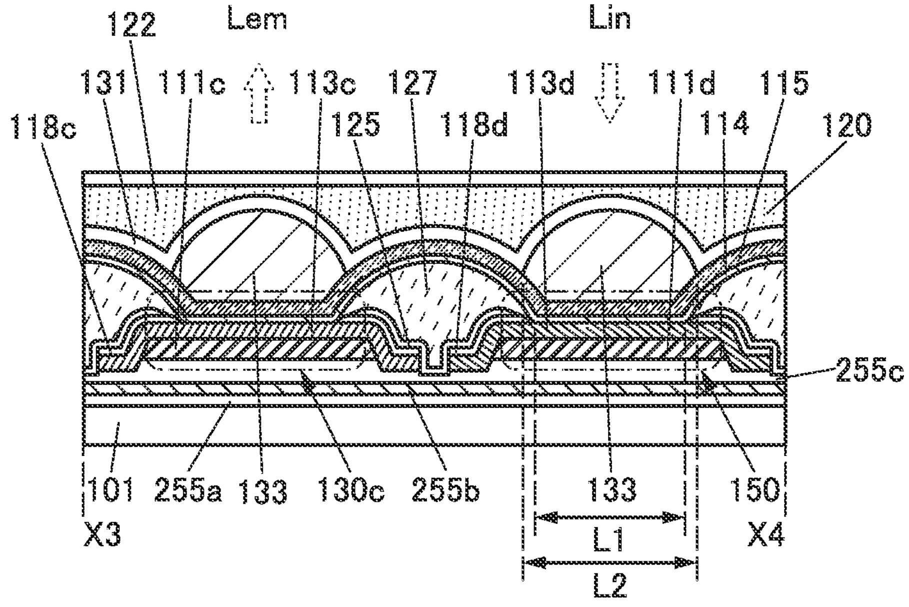
FIG. 12B is a cross-sectional view illustrating an example of a display apparatus.

FIG. 12B is a cross-sectional view along the dashed-dotted line X3-X4 in FIG. 12A. Note that FIG. 1B can be referred to for the cross-sectional view of the subpixels 110*a* and 110*b* in FIG. 12A, and FIG. 2A or FIG. 2B can be referred to for the cross-sectional view along the dashed-dotted line Y1-Y2.

As illustrated in FIG. 12B, in the display apparatus 100, an insulating layer is provided over the layer 101 including transistors, the light-emitting device 130*c* and a light-receiving device 150 are provided over the insulating layer, and the lenses 133 are provided in the light-emitting device 130*c* and the light-receiving device 150. The protective layer 131 is provided to cover the lens 133. The substrate 120 is bonded to the protective layer 131 with the resin layer 122. In a region between the light-emitting device and the light-receiving device 150 adjacent to each other, the insulating layer 125 and the insulating layer 127 over the insulating layer 125 are provided.

FIG. 12B illustrates an example in which light emitted from the light-emitting device 130*c* is emitted to the substrate 120 side through the lens 133 and light incident from the substrate 120 side enters the light-receiving device 150 through the lens 133 (see light Lem and light Lin).

The structure of the light-emitting device 130*c* is as described above.

The light-receiving device 150 includes a pixel electrode 111*d* over the insulating layer 255*c*, a fourth layer 113*d* over the pixel electrode 111*d*, the common layer 114 over the fourth layer 113*d*, and the common electrode 115 over the common layer 114.

Here, the fourth layer 113*d* includes at least an active layer, preferably includes a plurality of functional layers. Examples of the functional layer include carrier-transport layers (a hole-transport layer and an electron-transport layer) and carrier-blocking layers (a hole-blocking layer and an electron-blocking layer). In addition, the fourth layer 113*d* preferably includes one or more layers over the active layer. A layer between the active layer and the mask layer can inhibit the active layer from being exposed on the outermost surface during the manufacturing process of the display apparatus and can reduce damage to the active layer. Accordingly, the reliability of the light-receiving device 150 can be increased. Thus, the fourth layer 113*d* preferably includes an active layer and a carrier-blocking layer (a hole-blocking layer or an electron-blocking layer) or a carrier-transport layer (an electron-transport layer or a hole-transport layer) over the active layer.

The fourth layer 113*d* is provided in the light-receiving device 150, not in the light-emitting devices. Note that the functional layer other than the active layer included in the fourth layer 113*d* contains the same material as the light-emitting layer included in each of the first layer 113*a* to the third layer 113*c*. Meanwhile, the common layer 114 is a continuous layer shared by the light-emitting devices and the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device has the same function in both the light-receiving device and the light-emitting device in some cases. A hole-transport layer functions as a hole-transport layer in both the light-emitting device and the light-receiving device, and the electron-transport layer functions as an electron-transport layer in both the light-emitting device and the light-receiving device.

The mask layer 118*a* is positioned between the first layer 113*a* and the insulating layer 125, and a mask layer 118*d* is positioned between the fourth layer 113*d* and the insulating layer 125. The mask layer 118*a* is a remaining part of the mask layer provided over the first layer 113*a* at the time of processing the first layer 113*a*. The mask layer 118*d* is a remaining part of a mask layer provided in contact with the top surface of the fourth layer 113*d* at the time of processing the fourth layer 113*d*, which is a layer including the active layer. The mask layer 118*a* and the mask layer 118*d* may contain the same material or different materials.

Although FIG. 12A illustrates an example where the subpixels 110*a*, 110*b*, and 110*c* and the subpixel 110*d* have the same aperture ratio (also referred to as size or size of the light-emitting region or the light-receiving region), one embodiment of the present invention is not limited thereto. The aperture ratio of each of the subpixels 110*a*, 110*b*, 110*c*, and 110*d* can be determined as appropriate. The subpixels 110*a*, 110*b*, 110*c*, and 110*d* may have different aperture ratios, or two or more of the subpixels 110*a*, 110*b*, 110*c*, and 110*d* may have the same or substantially the same aperture ratio.

The subpixel 110*d* may have a higher aperture ratio than at least one of the subpixels 110*a*, 110*b*, and 110*c*. A wide light-receiving area of the subpixel 110*d* can make it easier to detect an object in some cases. For example, in some cases, the aperture ratio of the subpixel 110*d* is higher than that of the other subpixels depending on the resolution of the display apparatus and the circuit structure or the like of the subpixel.

The subpixel 110*d* may have a lower aperture ratio than at least one of the subpixels 110*a*, 110*b*, and 110*c*. A smaller light-receiving area of the subpixel 110*d* leads to a narrower image-capturing range, so that a blur in a capturing result is inhibited and the definition is improved. Accordingly, high-resolution or high-definition image capturing can be performed, which is preferable.

As described above, the subpixel 110*d* can have a detection wavelength, a resolution, and an aperture ratio that are suitable for the intended use.

The diameter (L2) of the lens 133 provided over the light-receiving device 150 is preferably larger than the diameter (L1) of the light-receiving portion of the light-receiving device 150. With this structure, light entering a region larger than the light-receiving portion can be condensed and incident on the light-receiving portion, so that light sensitivity can be increased. Note that the light-receiving portion is a region where the fourth layer 113*d* and the common layer 114 are in contact with each other. In the case where the common layer 114 is not provided, the light-receiving portion is a region where the fourth layer 113*d* and the common electrode 115 are in contact with each other.

In the display apparatus of one embodiment of the present invention, each light-emitting device includes an island-shaped EL layer, which can inhibit generation of a leakage current flowing between the subpixels. This can prevent crosstalk due to unintended light emission, so that a display apparatus with extremely high contrast can be obtained. The insulating layer having a tapered end portion and being provided between adjacent island-shaped EL layers can inhibit generation of step disconnection and prevent formation of a locally thinned portion in the common electrode at the time of forming the common electrode. This can inhibit the common layer and the common electrode from having connection defects due to the disconnected portion and an increased electric resistance due to the locally thinned portion.

Thus, the display apparatus of one embodiment of the present invention can have both a higher resolution and higher display quality. In the display apparatus of one embodiment of the present invention, the lens is provided over the common electrode overlapping with the light-emitting region. Providing the lens can inhibit light that proceeds in the lateral direction through the common electrode as a waveguide, so that the light extraction efficiency can be improved. That is, a high-luminance display apparatus can be formed.

In a display apparatus with a light-receiving device, which is one embodiment of the present invention, a lens can also be provided over the light-receiving device. When the diameter of the lens provided over the light-receiving device is larger than the effective area of the light-receiving portion, the light collecting capability can be increased and the light sensitivity of the light-receiving device can be increased.

This embodiment can be combined with any of the other embodiments as appropriate. In this specification, in the case where a plurality of structure examples are shown in one embodiment, the structure examples can be combined as appropriate.

Embodiment 2

In this embodiment, a method for manufacturing a display apparatus of one embodiment of the present invention will be described with reference to FIG. 13 to FIG. 18. Note that as for a material and a formation method of each component, portions similar to those described in Embodiment 1 are not described in some cases. The structure of the light-emitting device will be described in detail in Embodiment 5.

FIG. 13 to FIG. 18 each illustrate a cross-sectional view along the dashed-dotted line X1-X2 and a cross sectional view along the dashed-dotted line Y1-Y2 in FIG. 1A side by side. FIG. 19 illustrates an enlarged view of the end portion of the insulating layer 127 and the vicinity thereof.

Note that thin films included in the display apparatus (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, and the like. Examples of a CVD method include a plasma-enhanced chemical vapor deposition (PECVD: Plasma Enhanced CVD) method and a thermal CVD method. An example of a thermal CVD method is a metal organic chemical vapor deposition (MOCVD: Metal Organic CVD) method.

Alternatively, thin films included in the display apparatus (e.g., insulating films, semiconductor films, and conductive films) can be formed by a wet deposition method such as spin coating, dipping, spray coating, ink-jetting, dispensing, screen printing, offset printing, doctor blade coating, slit coating, roll coating, curtain coating, or knife coating.

For manufacturing the light-emitting device and the light-receiving device, a vacuum process such as an evaporation method and a solution process such as a spin coating method or an inkjet method can be used. Examples of an deposition method in a vacuum process include physical vapor deposition (PVD) methods such as a sputtering method, an ion plating method, an ion beam evaporation method, a molecular beam evaporation method, and a vacuum evaporation method, and a chemical vapor deposition (CVD) method.

Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer are preferably formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

Thin films included in the display apparatus can be processed by a photolithography method, an etching method, or the like. Alternatively, the thin films may be processed by a sandblasting method, a lift-off method, or the like. Alternatively, island-shaped thin films may be directly formed by a deposition method using a blocking mask such as a metal mask. Alternatively, a nanoimprinting method may be replaced with a photolithography method.

As steps using a photolithography method, there are the following two typical methods. In one of the methods, a resist mask is formed over a thin film to be processed, the thin film is processed by an etching method and then the resist mask is removed. In the other method, a photosensitive thin film is deposited and then processed into a desired shape by light exposure and development.

As light used for light exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet rays, KrF laser light, ArF laser light, or the like can be used. Light exposure may be performed by liquid immersion exposure technique. As the light used for light exposure, extreme ultraviolet (EUV) light or X-rays may also be used. In addition, visible light can be used in some cases.

Furthermore, instead of the light used for light exposure, an electron beam can be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblasting method, or the like can be used.

Figure 13A:
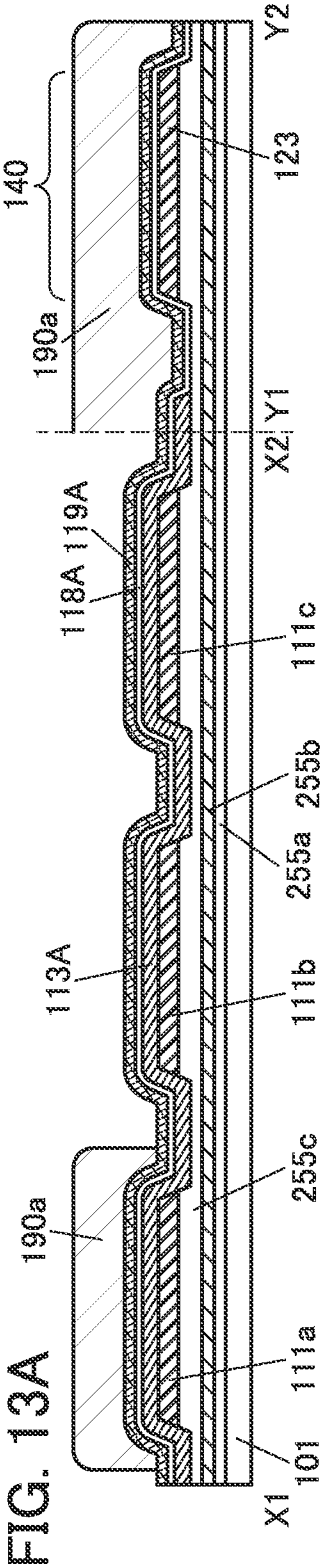
FIG. 13A to FIG. 13C are cross-sectional views illustrating an example of a manufacturing method of a display apparatus.

First, the insulating layer 255*a*, the insulating layer 255*b*, and the insulating layer 255*c* are formed in this order over the layer 101 including transistors. Next, the pixel electrodes 111*a*, 111*b*, and 111*c*, and the conductive layer 123 are formed over the insulating layer 255*c* (FIG. 13A). The pixel electrode can be formed by a sputtering method or a vacuum evaporation method, for example.

Then, hydrophobic treatment for the pixel electrodes is preferably performed. The hydrophobic treatment can change the hydrophilic properties of the subject surface to hydrophobic properties or increase the hydrophobic properties of the subject surface. The hydrophobic treatment for the pixel electrodes can improve adhesion between the pixel electrode and a film to be formed in a later step (here, a film 113A), thereby inhibiting peeling. Note that the hydrophobic treatment is not necessarily performed.

The hydrophobic treatment can be performed by fluorine modification of the pixel electrode. The fluorine modification can be performed by, for example, treatment or heat treatment using a gas containing fluorine, plasma treatment in an atmosphere of a gas containing fluorine, or the like.

As the gas containing fluorine, a fluorocarbon gas such as a carbon tetrafluoride ($CF_4$) gas, a $C_4F_6$ gas, a $C_2F_6$ gas, a $C_4F_8$ gas, or a $C_5F_8$ gas can be used, for example. Alternatively, as the gas containing fluorine, an $SF_6$ gas, an $NF_3$ gas, a $CHF_3$ gas, or the like may be used. Moreover, a helium gas, an argon gas, a hydrogen gas, or the like can be added to any of the above gases as appropriate.

In addition, treatment using a silylating agent is performed on the surface of the pixel electrode after plasma treatment is performed in a gas atmosphere containing a Group 18 element such as argon, so that the surface of the pixel electrode can have a hydrophobic property. As the silylating agent, hexamethyldisilazane (HMDS), trimethylsilylimidazole (TMSI), or the like can be used. Alternatively, treatment using a silane coupling agent is performed on the surface of the pixel electrode after plasma treatment is performed in a gas atmosphere containing a Group 18 element such as argon, so that the surface of the pixel electrode can have a hydrophobic property.

Plasma treatment on the surface of the pixel electrode in a gas atmosphere containing a Group 18 element such as argon can apply damage to the surface of the pixel electrode. Accordingly, a methyl group included in the silylating agent such as HMDS is likely to bond to the surface of the pixel electrode. In addition, silane coupling by the silane coupling agent is likely to occur. As described above, treatment using a silylating agent or a silane coupling agent performed on the surface of the pixel electrode after plasma treatment in a gas atmosphere containing a Group 18 element such as argon enables the surface of the pixel electrode to have a hydrophobic property.

The treatment using a silylating agent, a silane coupling agent, or the like can be performed by application of the silylating agent, the silane coupling agent, or the like by a spin coating method, a dipping method, or the like. Alternatively, the treatment using a silylating agent, a silane coupling agent, or the like can be performed by forming a film containing the silylating agent, a film containing the silane coupling agent, or the like over the pixel electrode by a gas phase method.

In a gas phase method, first, a material containing a silylating agent, a material containing a silane coupling agent, or the like is evaporated so that the silylating agent or the silane coupling agent is contained in an atmosphere. Next, a substrate where the pixel electrode and the like are formed is put in the atmosphere. Accordingly, a film containing the silylating agent, a film containing the silane coupling agent, or the like can be formed over the pixel electrode, so that the surface of the pixel electrode can have a hydrophobic property.

Then, the film 113A to be the layer 113*a* later is formed over the pixel electrodes (FIG. 13A).

As illustrated in FIG. 13A, the film 113A is not formed over the conductive layer 123 in a cross-sectional view along the dashed-dotted line Y1-Y2. For example, by using a mask for specifying a deposition area (also referred to as an area mask or a rough metal mask to be distinguished from a fine metal mask), the film 113A can be formed only in a desired region. A light-emitting device can be manufactured through a relatively simple process, by employing a deposition step using an area mask and a processing step using a resist mask.

As described in Embodiment 1, a material with high heat resistance is used for the light-emitting device of the display apparatus of one embodiment of the present invention. Specifically, the upper temperature limit of a compound contained in the film 113A is higher than or equal to 100° C. and lower than or equal to 180° C., preferably higher than or equal to 120° C. and lower than or equal to 180° C., further preferably higher than or equal to 140° C. and lower than or equal to 180° C. Accordingly, the reliability of the light-emitting device can be improved. In addition, the upper limit of the temperature that can be applied in the manufacturing process of the display apparatus can be increased. Therefore, the range of choices of the materials and the formation methods of the display apparatus can be widened, thereby improving the manufacturing yield and the reliability.

The film 113A can be formed by an evaporation method, specifically a vacuum evaporation method, for example. The film 113A may be formed by a transfer method, a printing method, an inkjet method, a coating method, or the like.

Next, a mask film 118A to be the mask layer 118*a* later and a mask film 119A to be the mask layer 119*a* later are formed in this order over the film 113A and the conductive layer 123 (FIG. 13A).

Although this embodiment describes an example where the mask film is formed with a two-layer structure of the mask film 118A and the mask film 119A, the mask film may have a single-layer structure or a stacked-layer structure of three or more layers.

Providing the mask layers over the film 113A can reduce damage to the film 113A in the manufacturing process of the display apparatus, resulting in an improvement in reliability of the light-emitting device.

As the mask film 118A, a film highly resistant to the processing conditions of the film 113A, specifically, a film having high etching selectivity to the film 113A, is used. As the mask film 119A, a film having high etching selectivity to the mask film 118A is used.

The mask film 118A and the mask film 119A are formed at a temperature lower than the upper temperature limit of the film 113A. The typical substrate temperatures in formation of the mask film 118A and the mask film 119A are each lower than or equal to 200° C., preferably lower than or equal to 150° C., further preferably lower than or equal to 120° C., still further preferably lower than or equal to 100° C., yet still further preferably lower than or equal to 80° C.

Examples of indicators of the upper temperature limit are the glass transition point, the softening point, the melting point, the thermal decomposition temperature, and the 5% weight loss temperature. The upper temperature limit of the film 113A to a film 113C (i.e., the first layer 113*a* to the third layer 113*c*) can be any of the temperatures, preferably the lowest one among the temperatures.

As described above, a material with high heat resistance is used for the light-emitting device of the display apparatus of one embodiment of the present invention. Thus, the substrate temperature in formation of the mask films can be higher than or equal to 100° C., higher than or equal to 120° C., or higher than or equal to 140° C. An inorganic insulating film can have higher density and a higher barrier property as the deposition temperature becomes higher. Therefore, depositing the mask film at such a temperature can further reduce damage to the film 113A and improve the reliability of the light-emitting device.

As each of the mask film 118A and the mask film 119A, a film that can be removed by a wet etching method is preferably used. The use of a wet etching method can reduce damage to the film 113A in processing of the mask film 118A and the mask film 119A as compared with the case of using a dry etching method.

The mask film 118A and the mask film 119A can be formed by a sputtering method, an ALD method (a thermal ALD method or a PEALD method), a CVD method, or a vacuum evaporation method, for example. Alternatively, the above-described wet deposition method may be used for the formation.

The mask film 118A, which is formed over and in contact with the film 113A, is preferably formed by a formation method that causes less damage to the film 113A than a formation method of the mask film 119A. For example, the mask film 118A is preferably formed by an ALD method or a vacuum evaporation method rather than a sputtering method.

As each of the mask film 118A and the mask film 119A, it is possible to use one or more kinds of a metal film, an alloy film, a metal oxide film, a semiconductor film, an organic insulating film, and an inorganic insulating film, for example.

For each of the mask film 118A and the mask film 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials. It is particularly preferable to use a low-melting-point material such as aluminum or silver. The use of a metal material capable of blocking ultraviolet rays for one or both of the mask film 118A and the mask film 119A is preferable, in which case the film 113A can be inhibited from being irradiated with ultraviolet rays and deteriorating.

The mask film 118A and the mask film 119A can each be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In addition, in place of gallium described above, an element M (M is one or more kinds of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used. Specifically, M is preferably one or more kinds selected from gallium, aluminum, and yttrium.

As the mask film, a film containing a material having a light-blocking property, particularly with respect to ultraviolet rays, can be used. For example, a film having a reflecting property with respect to ultraviolet rays or a film absorbing ultraviolet rays can be used. Although a variety of materials, such as a metal having a light-blocking property with respect to ultraviolet rays, an insulator, a semiconductor, and a metalloid, can be used as the material having a light-blocking property, a film capable of being processed by etching is preferable, and a film having good processability is particularly preferable because part or the whole of the mask film is removed in a later step.

A semiconductor material such as silicon or germanium can be used for the mask film as a material with an affinity for the semiconductor manufacturing process. Alternatively, an oxide or a nitride of the semiconductor material can be used. Alternatively, a non-metallic (metalloid) material such as carbon or a compound thereof can be used. Alternatively, a metal such as titanium, tantalum, tungsten, chromium, or aluminum, or an alloy containing one or more of these metals can be used. Alternatively, an oxide containing the above-described metal, such as titanium oxide or chromium oxide, or a nitride such as titanium nitride, chromium nitride, or tantalum nitride can be used.

The use of a film containing a material having a light-blocking property with respect to ultraviolet rays can inhibit the EL layer from being irradiated with ultraviolet rays in a light exposure step or the like. The EL layer is inhibited from being damaged by ultraviolet rays, so that the reliability of the light-emitting device can be improved.

Note that the film containing a material having a light-blocking property with respect to ultraviolet rays can have the same effect even when used as a material for an after-mentioned insulating film 125A.

As the mask film 118A and the mask film 119A, any of a variety of inorganic insulating films that can be used as the protective layer 131 can be used. In particular, an oxide insulating film is preferable because its adhesion to the film 113A is higher than that of a nitride insulating film. For example, an inorganic insulating material such as aluminum oxide, hafnium oxide, or silicon oxide can be used for the mask film 118A and the mask film 119A. As the mask film 118A and the mask film 119A, an aluminum oxide film can be formed by an ALD method, for example. The use of an ALD method is preferable, in which case damage to abase (in particular, the EL layer) can be reduced.

An inorganic insulating film (e.g., an aluminum oxide film) formed by an ALD method can be used as the mask film 118A, and an inorganic film (e.g., an In—Ga—Zn oxide film, an aluminum film, or a tungsten film) formed by a sputtering method can be used as the mask film 119A.

Note that the same inorganic insulating film can be used as both the mask film 118A and the insulating layer 125 that is to be formed later. For example, an aluminum oxide film formed by an ALD method can be used as both the mask film 118A and the insulating layer 125. Here, for the mask film 118A and the insulating layer 125, the same film formation condition may be used or different film formation conditions may be used.

When the mask film 118A is deposited under conditions similar to those of the insulating layer 125, the mask film 118A can be an insulating layer having a high barrier property against at least one of water and oxygen. Meanwhile, since most or all of the mask film 118A is to be removed in a later step, the mask film 118A is preferably easy to process. Therefore, the mask film 118A is preferably deposited under a condition where a substrate temperature in formation is lower than that for the insulating layer 125.

An organic material may be used for one or both of the mask film 118A and the mask film 119A. As the organic material, a material that can be dissolved in a solvent chemically stable with respect to at least the uppermost film of the film 113A may be used. Specifically, a material that can be dissolved in water or alcohol can be suitably used. In deposition of such a material, it is preferable to apply the material dissolved in a solvent such as water or alcohol by a wet deposition method and then perform heat treatment for evaporating the solvent. At this time, the heat treatment is preferably performed under a reduced-pressure atmosphere, in which case the solvent can be removed at a low temperature in a short time and thermal damage to the film 113A can be accordingly reduced.

The mask film 118A and the mask film 119A may be formed using polyvinyl alcohol (PVA), polyvinyl butyral, polyvinylpyrrolidone, polyethylene glycol, polyglycerin, pullulan, water-soluble cellulose, an alcohol-soluble polyamide resin, or a fluororesin such as perfluoropolymer.

An organic film (e.g., a PVA film) formed by an evaporation method or the any of the above wet deposition method can be used as the mask film 118A, and an inorganic film (e.g., a silicon nitride film) formed by a sputtering method can be used as the mask film 119A.

Note that as described in Embodiment 1, part of the mask film sometimes remains as a mask layer in the display apparatus of one embodiment of the present invention.

Next, a resist mask 190*a* is formed over the mask film 119A (FIG. 13A). The resist mask 190*a* can be formed by application of a photosensitive resin (photoresist), light exposure, and development.

The resist mask 190*a* may be formed using either a positive resist material or a negative resist material.

The resist mask 190*a* is provided at a position overlapping with the pixel electrode 111*a*. Note that the resist mask 190*a* is preferably provided also at a position overlapping with the conductive layer 123. This can inhibit the conductive layer 123 from being damaged during the manufacturing process of the display apparatus. Note that the resist mask 190*a* is not necessarily provided over the conductive layer 123.

As illustrated in the cross-sectional view along Y1-Y2 in FIG. 13A, the resist mask 190*a* is preferably provided to cover a region from the end portion of the first layer 113*a* to an end portion of the conductive layer 123 (an end portion on the first layer 113*a* side). In this case, end portions of the mask layers 118*a* and 119*a* overlap with the end portion of the first layer 113*a* even after the mask film 118A and the mask film 119A are processed. Since the mask layers 118*a* and 119*a* are provided to cover a region from the end portion of the first layer 113*a* to the end portion of the conductive layer 123 (the end portion on the first layer 113*a* side), the insulating layer 255*c* can be inhibited from being exposed (see a cross-sectional view along Y1-Y2 in FIG. 13C).

This can prevent elimination of the insulating layers 255*a* to 255*c* and part of the insulating layer included in the layer 101 including transistors, and exposure of the conductive layer included in the layer 101 including transistors. Thus, unintentional electrical connection between the conductive layer and another conductive layer can be inhibited. For example, a short circuit between the conductive layer and the common electrode 115 can be inhibited.

Figure 13B:
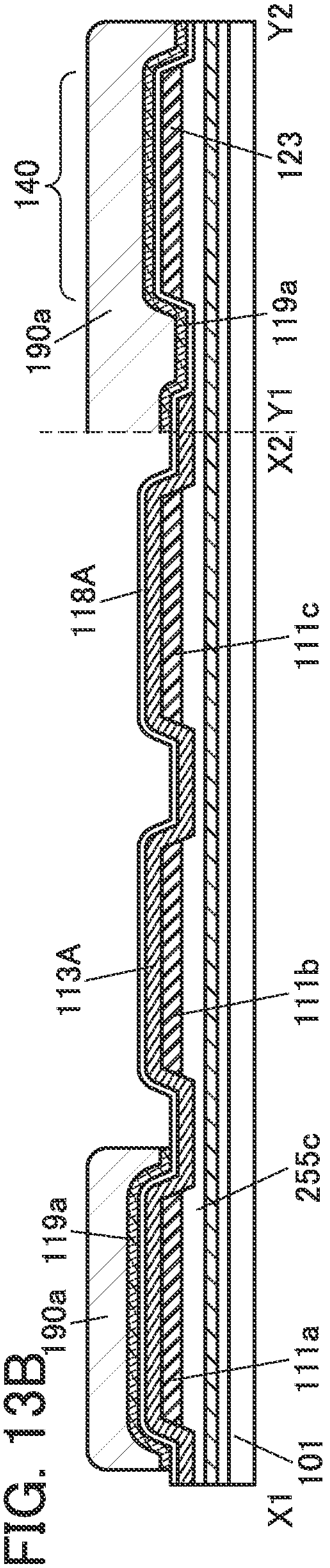
Figure 13C:
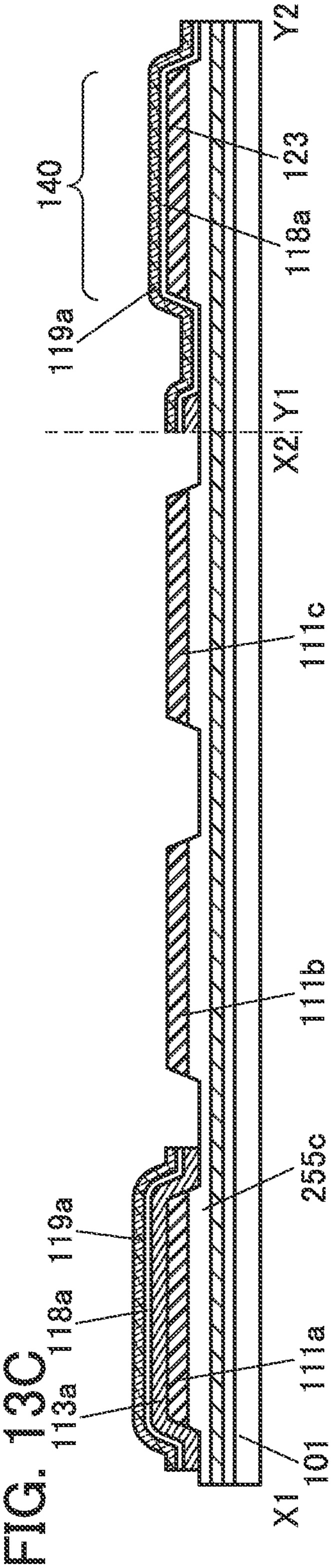

Next, part of the mask film 119A is removed with the use of the resist mask 190*a*, so that the mask layer 119*a* is formed (FIG. 13B). The mask layer 119*a* remains over the pixel electrode 111*a* and the conductive layer 123. After that, the resist mask 190*a* is removed. Next, part of the mask film 118A is removed using the mask layer 119*a* as a mask (also referred to as a hard mask), so that the mask layer 118*a* is formed (FIG. 13C).

The mask film 118A and the mask film 119A can be processed by a wet etching method or a dry etching method. The mask film 118A and the mask film 119A are preferably processed by anisotropic etching.

The use of a wet etching method can reduce damage to the film 113A in processing of the mask film 118A and the mask film 119A as compared with the case of using a dry etching method. In the case of using a wet etching method, it is preferable to use a developer, an aqueous solution of tetramethyl ammonium hydroxide (TMAH), dilute hydrofluoric acid, oxalic acid, phosphoric acid, acetic acid, nitric acid, or a chemical solution containing a mixed solution of any of these acids, for example.

Since the film 113A is not exposed in processing of the mask film 119A, the range of choices of the processing method is wider than that for the mask film 118A. Specifically, deterioration of the mask film 113A can be further inhibited even when a gas containing oxygen is used as an etching gas for processing the mask film 119A.

In the case of using a dry etching method for processing the mask film 118A, deterioration of the film 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas such as He as the etching gas, for example.

When an aluminum oxide film formed by an ALD method is used as the mask film 118A, the mask film 118A can be processed by a dry etching method using a combination of $CHF_3$ and He or a combination of $CHF_3$, He, and $CH_4$. In the case where an In—Ga—Zn oxide film formed by a sputtering method is used as the mask film 119A, the mask film 119A can be processed by a wet etching method using a diluted phosphoric acid. Alternatively, the mask film 119A may be processed by a dry etching method using $CH_4$ and Ar. Alternatively, the mask film 119A can be processed by a wet etching method using a diluted phosphoric acid. When a tungsten film formed by a sputtering method is used as the mask film 119A, the mask film 119A can be processed by a dry etching method using a combination of $SF_6$, $CF_4$, and $O_2$ or a combination of $CF_4$, $Cl_2$, and $O_2$.

The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas such as He may be used. Alternatively, the resist mask 190*a* may be removed by wet etching. At this time, the mask film 118A is positioned on the outermost surface and the film 113A is not exposed; thus, the film 113A can be inhibited from being damaged in the step of removing the resist mask 190*a*. In addition, the range of choices of the method for removing the resist mask 190*a* can be widened.

Next, part of the film 113A is removed using the mask layer 119*a* and the mask layer 118*a* as hard masks, so that the first layer 113*a* is formed (FIG. 13C).

Accordingly, as illustrated in FIG. 13C, a stacked-layer structure of the first layer 113*a*, the mask layer 118*a*, and the mask layer 119*a* remains over the pixel electrode 111*a*. In addition, the pixel electrode 111*b* and the pixel electrode 111*c* are exposed.

FIG. 13C illustrates an example where the end portion of the first layer 113*a* is positioned outward from the end portion of the pixel electrode 111*a*. Such a structure can increase the aperture ratio of the pixel. Although not illustrated in FIG. 13C, a depressed portion is sometimes formed by the etching treatment in a region of the insulating layer 255*c* not overlapping with the first layer 113*a*.

When the first layer 113*a* covers the top surface and the side surface of the pixel electrode 111*a*, the following steps can be performed without exposing the pixel electrode 111*a*. When the end portion of the pixel electrode 111*a* is exposed, corrosion might occur in the etching step or the like. A product generated by corrosion of the pixel electrode 111*a* might be unstable; the product might be dissolved in a solution in wet etching and might be diffused in an atmosphere in dry etching.

The product dissolved in a solution or diffused in an atmosphere might be attached to a surface to be processed, the side surface of the first layer 113*a*, and the like, which adversely affects the characteristics of the light-emitting device or forms a leakage path between the plurality of light-emitting devices in some cases. In a region where the end portion of the pixel electrode 111*a* is exposed, adhesion between layers in contact with each other might be lowered, which might be likely to cause peeling of the first layer 113*a* or the pixel electrode 111*a*.

Thus, when the first layer 113*a* covers the top surface and the side surface of the pixel electrode 111*a*, the yield and characteristics of the light-emitting device can be improved.

In a region corresponding to the connection portion 140, a stacked-layer structure of the mask layer 118*a* and the mask layer 119*a* remains over the conductive layer 123.

As described above, in the cross-sectional view along Y1-Y2 in FIG. 13C, the mask layers 118*a* and 119*a* are provided to cover the end portion of the first layer 113*a* and the end portion of the conductive layer 123, and the insulating layer 255*c* is not exposed. This can prevent removal of the insulating layers 255*a* to 255*c* and part of the insulating layer included in the layer 101 including transistors, and exposure of the conductive layer included in the layer 101 including transistors. Thus, unintentional electrical connection between the conductive layer and another conductive layer can be inhibited.

The film 113A is preferably processed by anisotropic etching. In particular, anisotropic dry etching is preferably employed. Alternatively, wet etching may be employed.

In the case of using a dry etching method, deterioration of the film 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the film 113A can be inhibited. Furthermore, a defect such as attachment of a reaction product generated at the etching can be inhibited.

In the case of using a dry etching method, it is preferable to use, as the etching gas, a gas containing at least one kind of $H_2$, $CF_4$, $C_4F_8$, $SF_6$, $CHF_3$, $Cl_2$, $H_2O$, $BCl_3$, and a noble gas such as He and Ar, for example. Alternatively, a gas containing oxygen and at least one kind of the above is preferably used as the etching gas. Alternatively, an oxygen gas may be used as the etching gas. Specifically, a gas containing $H_2$ and Ar or a gas containing $CF_4$ and He can be used as the etching gas. As another example, a gas containing $CF_4$, He, and oxygen can be used as the etching gas. As another example, a gas containing $H_2$ and Ar and a gas containing oxygen can be used as the etching gas.

As described above, in one embodiment of the present invention, the mask layer 119*a* is formed in the following manner: the resist mask 190*a* is formed over the mask film 119A, and part of the mask film 119A is removed using the resist mask 190*a*. After that, part of the film 113A is removed using the mask layer 119*a* as a hard mask, so that the first layer 113*a* is formed. Thus, it can be said that the first layer 113*a* is formed by processing the film 113A by a photolithography method. Note that part of the film 113A may be removed using the resist mask 190*a*. Then, the resist mask 190*a* may be removed.

Next, hydrophobic treatment for the pixel electrodes is preferably performed. In processing of the film 113A, the surface state of the pixel electrode changes to a hydrophilic state in some cases. The hydrophobic treatment for the pixel electrodes can improve adhesion between the pixel electrodes and a film to be formed in a later step (here, the film 113B), thereby inhibiting peeling. Note that the hydrophobic treatment is not necessarily performed.

Figures 14A, 14B, 14C:
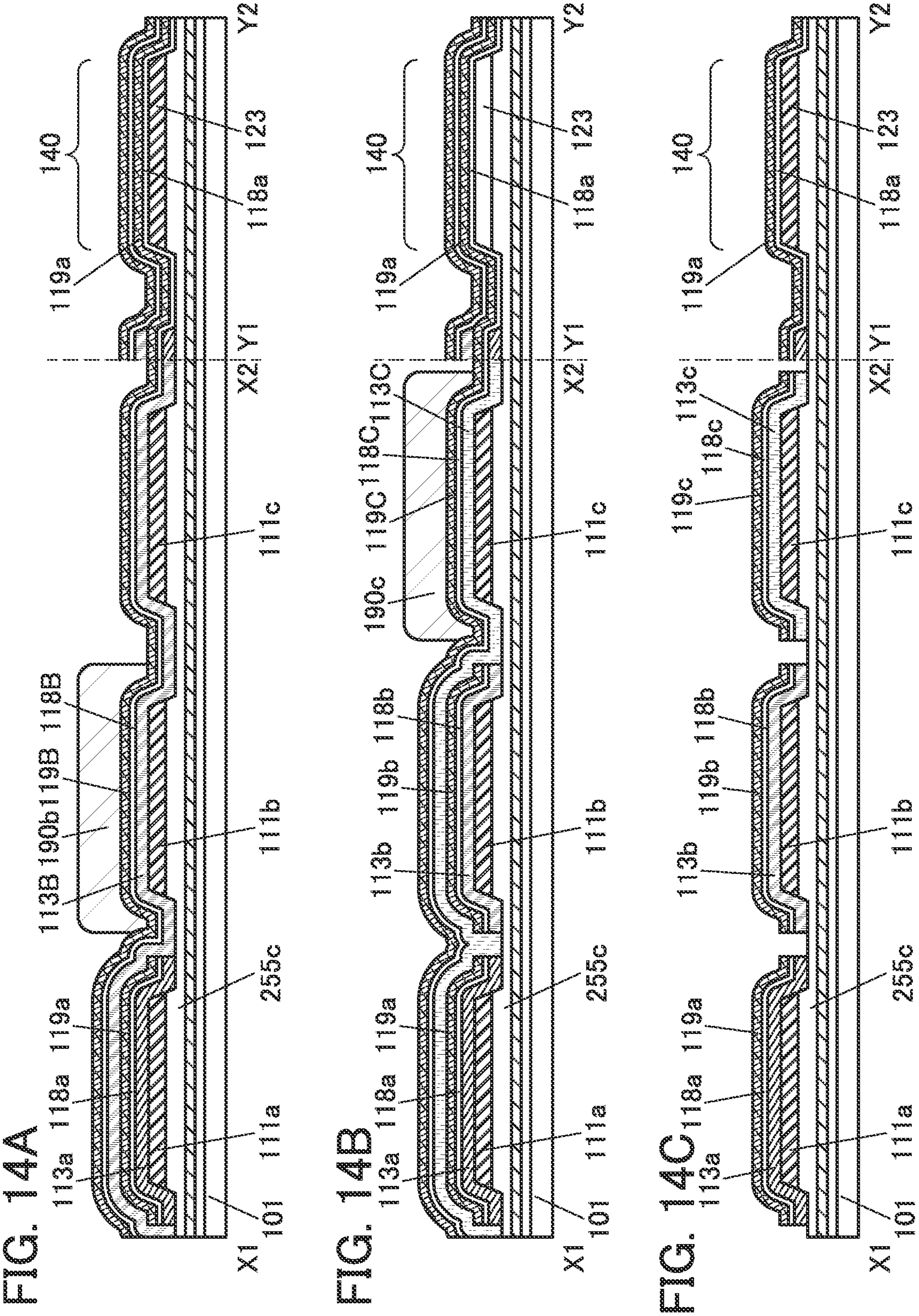
FIG. 14A to FIG. 14C are cross-sectional views illustrating an example of a manufacturing method of a display apparatus.

Subsequently, the film 113B to be the second layer 113*b* later is formed over the pixel electrodes 111*b*, 111*c*, and the mask layer 119*a* (FIG. 14A).

The film 113B can be formed by a method similar to that usable for the formation of the film 113A.

Next, over the film 113B, a mask film 118B to be the mask layer 118*b* later and a mask film 119B to be a mask layer 119*b* later are formed in this order, and then a resist mask 190*b* is formed (FIG. 14A). The materials and the formation methods of the mask film 118B and the mask film 119B are similar to those applicable to the mask film 118A and the mask film 119A. The material and the formation method of the resist mask 190*b* are similar to those applicable to the resist mask 190*a*.

The resist mask 190*b* is provided at a position overlapping with the pixel electrode 111*b*.

Next, part of the mask film 119B is removed with the use of the resist mask 190*b*, so that the mask layer 119*b* is formed. The mask layer 119*b* remains over the pixel electrode 111*b*. After that, the resist mask 190*b* is removed. Next, part of the mask film 118B is removed using the mask layer 119*b* as a mask, so that the mask layer 118*b* is formed.

Next, part of the film 113B is removed using the mask layer 119*b* and the mask layer 118*b* as hard masks, so that the second layer 113*b* is formed (FIG. 14B).

Accordingly, as illustrated in FIG. 14B, a stacked-layer structure of the second layer 113*b*, the mask layer 118*b*, and the mask layer 119*b* remains over the pixel electrode 111*b*. The mask layer 119*a* and the pixel electrode 111*c* are exposed.

Next, hydrophobic treatment for the pixel electrodes is preferably performed. In processing of the film 113B, the surface state of the pixel electrode changes to a hydrophilic state in some cases. The hydrophobic treatment for the pixel electrodes can improve adhesion between the pixel electrodes and a film to be formed in a later step (here, the film 113C), thereby inhibiting peeling. Note that the hydrophobic treatment is not necessarily performed.

Next, the film 113C to be the third layer 113*c* later is formed over the pixel electrode 111*c* and the mask layers 119*a* and 119*b* (FIG. 14B).

The film 113C can be formed by a method similar to that usable for the formation of the film 113A.

Next, over the film 113C, a mask film 118C to be the mask layer 118*c* later and a mask film 119C to be a mask layer 119*c* later are formed in this order, and then a resist mask 190*c* is formed (FIG. 14B). The materials and the formation methods of the mask film 118C and the mask film 119C are similar to those applicable to the mask film 118A and the mask film 119A. The material and the formation method of the resist mask 190*c* are similar to those applicable to the resist mask 190*a*.

The resist mask 190*c* is provided at a position overlapping with the pixel electrode 111*c*.

Next, part of the mask film 119C is removed with the use of the resist mask 190*c*, so that the mask layer 119*c* is formed. The mask layer 119*c* remains over the pixel electrode 111*c*. After that, the resist mask 190*c* is removed.

Next, part of the mask film 118C is removed using the mask layer 119*c* as a mask, so that the mask layer 118*c* is formed. Then, part of the film 113C is removed using the mask layer 119*c* and the mask layer 118*c* as hard masks, so that the third layer 113*c* is formed (FIG. 14C).

Accordingly, as illustrated in FIG. 14C, a stacked-layer structure of the third layer 113*c*, the mask layer 118*c*, and the mask layer 119*c* remains over the pixel electrode 111*c*. In addition, the mask layers 119*a* and 119*b* are exposed.

Note that side surfaces of the first layer 113*a*, the second layer 113*b*, and the third layer 113*c* are preferably perpendicular or substantially perpendicular to their formation surfaces. For example, the angle between the formation surfaces and these side surfaces is preferably greater than or equal to 60° and less than or equal to 90°.

As described above, the distance between two adjacent layers among the first layer 113*a*, the second layer 113*b*, and the third layer 113*c*, which are formed by a photolithography method, can be shortened to less than or equal to 8 μm, less than or equal to 5 μm, less than or equal to 3 μm, less than or equal to 2 μm, or less than or equal to 1 μm. Here, the distance can be specified by a distance between facing end portions of two adjacent layers among the first layer 113*a*, the second layer 113*b*, and the third layer 113*c*. When the distance between the island-shaped EL layers is shortened in this manner, a display apparatus with a high resolution and a high aperture ratio can be provided.

Note that in the case where the display apparatus including both the light-emitting device and the light-receiving device is manufactured as illustrated in FIG. 12A and FIG. 12B, the fourth layer 113*d* included in the light-receiving device is formed in a manner similar to that of the first layer 113*a* to the third layer 113*c*. The formation order of the first layer 113*a* to the fourth layer 113*d* is not particularly limited.

Formation of the layer which has higher adhesion to the pixel electrode first enables inhibition of peeling during the process. For example, in the case where the first layer 113*a* to the third layer 113*c* have higher adhesion to the pixel electrode than the fourth layer 113*d*, the first layer 113*a* to the third layer 113*c* are preferably formed first. The thickness of the layer to be formed first affects the distance between the substrate and a mask for specifying a formation area in a later formation process of layer in some cases. When the layer with smaller thickness is formed first, shadowing (formation of a layer in shadow portion) can be inhibited.

In the case where a light-emitting device having a tandem structure is formed, the first layer 113*a* to the third layer 113*c* often have larger thickness than the fourth layer 113*d*; thus, the fourth layer 113*d* is preferably formed first. In the case where a film is formed by a wet process using a high molecular material, the film is preferably formed first. For example, when a high molecular material is used for the active layer, the fourth layer 113*d* is preferably formed first. As described above, when the formation order is determined depending on the material, the film formation method, and the like, the yield in manufacturing the display apparatus can be increased.

Figures 15A, 15B, 15C:
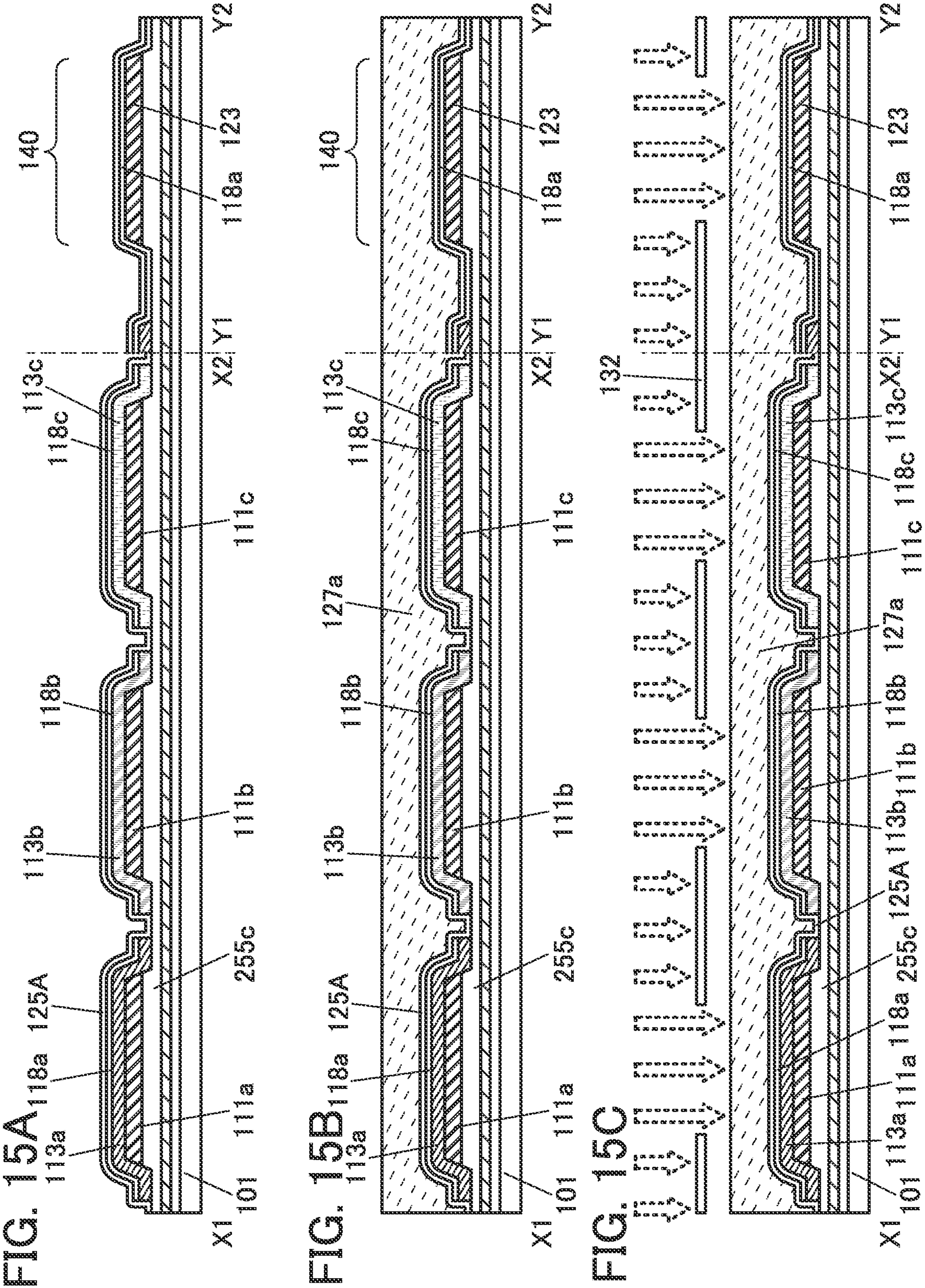
FIG. 15A to FIG. 15C are cross-sectional views illustrating an example of a manufacturing method of a display apparatus.

Next, the mask layers 119*a*, 119*b*, and 119*c* are preferably removed (FIG. 15A). The mask layers 118*a*, 118*b*, 118*c*, 119*a*, 119*b*, and 119*c* remain in the display apparatus in some cases, depending on the later steps. Removing the mask layers 119*a*, 119*b*, and 119*c* at this stage can inhibit the mask layers 119*a*, 119*b*, and 119*c* from remaining in the display apparatus.

In the case where a conductive material is used for the mask layers 119*a*, 119*b*, and 119*c*, removing the mask layers 119*a*, 119*b*, and 119*c* in advance can inhibit generation of a leakage current due to the remaining mask layers 119*a*, 119*b*, and 119*c*, formation of a capacitor, or the like.

Although this embodiment describes an example where the mask layers 119*a*, 119*b*, and 119*c* are removed, the mask layers 119*a*, 119*b*, and 119*c* are not necessarily removed. For example, in the case where the mask layers 119*a*, 119*b*, and 119*c* contain the above-described material having a light-blocking property with respect to ultraviolet rays, the process preferably proceeds to the next step without removing the mask layers, in which case the EL layer can be protected from ultraviolet rays.

The step of removing the mask layers can be performed by a method similar to that for the step of processing the mask layers. In particular, when a wet etching method is used, damage to the first layer 113*a*, the second layer 113*b*, and the third layer 113*c* at the time of removing the mask layers can be reduced as compared with the case where a dry etching method is used.

The mask layer may be removed by being dissolved in a solvent such as water or alcohol. Examples of alcohol include ethyl alcohol, methyl alcohol, isopropyl alcohol (IPA), and glycerin.

After the mask layers are removed, heat treatment may be performed in order to remove water included in the first layer 113*a*, the second layer 113*b*, and the third layer 113*c* and water adsorbed onto the surfaces of the first layer 113*a*, the second layer 113*b*, and the third layer 113*c*. The heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

Next, the insulating film 125A to be the insulating layer 125 later is formed to cover the pixel electrodes, the first layer 113*a*, the second layer 113*b*, the third layer 113*c*, the mask layer 118*a*, the mask layer 118*b*, and the mask layer 118*c* (FIG. 15A).

Then, an insulating film 127*a* is formed over the insulating film 125A (FIG. 15B). Here, the top surface of the insulating film 125A preferably has high affinity for a resin composition (e.g., a photosensitive resin composition containing an acrylic resin) that is used for the insulating film 127*a*. To improve the affinity, the top surface of the insulating film 125A is preferably made to be hydrophobic (or more hydrophobic) by surface treatment. For example, the treatment is preferably performed using a silylating agent such as hexamethyldisilazane (HMDS). By making the top surface of the insulating film 125A hydrophobic in this manner, the insulating film 127*a* can be formed with high adhesion. Note that the above-described hydrophobic treatment may be performed as the surface treatment.

The insulating film 125A and the insulating film 127*a* are preferably deposited by a formation method that causes less damage to the first layer 113*a*, the second layer 113*b*, and the third layer 113*c*. In particular, since the insulating film 125A is formed in contact with the side surfaces of the first layer 113*a*, the second layer 113*b*, and the third layer 113*c*, the insulating film 125A is preferably formed by a formation method that causes less damage to the first layer 113*a*, the second layer 113*b*, and the third layer 113*c* than the insulating film 127*a*.

The insulating film 125A and the insulating film 127*a* are formed at a temperature lower than the upper temperature limit of the first layer 113*a*, the second layer 113*b*, and the third layer 113*c*. When the substrate temperature at the time when the insulating film 125A is formed is increased, the formed insulating film 125A, even with a small thickness, can have a low impurity concentration and a high barrier property against at least one of water and oxygen.

The insulating film 125A and the insulating film 127*a* are preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As described above, a material with high heat resistance is used for the light-emitting device of the display apparatus of one embodiment of the present invention. Thus, the insulating film 125A and the insulating film 127*a* can be formed at a substrate temperature higher than or equal to 100° C., higher than or equal to 120° C., or higher than or equal to 140° C. An inorganic insulating film deposited at a higher temperature can be denser and have a higher barrier property. Therefore, depositing the insulating film 125A at such a temperature can further reduce damage to the first layer 113*a*, the second layer 113*b*, and the third layer 113*c* and improve the reliability of the light-emitting device.

As the insulating film 125A, an insulating film is preferably formed within the above substrate temperature range to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125A is preferably formed by an ALD method. The use of an ALD method is preferable, in which case deposition damage can be reduced and a film with good coverage can be deposited. As the insulating film 125A, an aluminum oxide film is preferably formed by an ALD method, for example.

Alternatively, the insulating film 125A may be formed by a sputtering method, a CVD method, or a PECVD method that provides a higher deposition rate than an ALD method. In this case, a highly reliable display apparatus can be manufactured with high productivity.

The insulating film 127*a* is preferably formed by the above-described wet deposition method. For example, the insulating film 127*a* is preferably formed by spin coating using a photosensitive resin, specifically, a photosensitive resin composition containing an acrylic resin.

The insulating film 127*a* is preferably formed using a resin composition containing a polymer, an acid-generating agent, and a solvent. The polymer is formed using one or more kinds of monomers and has a structure in which one or more kinds of structural units (also referred to as building blocks) are repeated regularly or irregularly. As the acid-generating agent, one or both of a compound that generates acid by light irradiation and a compound that generates acid by heating can be used.

The resin composition may also include one or more of a photosensitizing agent, a sensitizer, a catalyst, an adhesive aid, a surface-active agent, and an antioxidant. As such a resin composition, for example, the resin composition described in Patent Document 2 (Japanese Published Patent Application No. 2020-101659) can be suitably used. For example, the resin composition can include a quinone diazide compound as the acid-generating agent.

Heat treatment (also referred to as pre-baking) is preferably performed after formation of the insulating film 127*a*. The heat treatment is performed at a temperature lower than the upper temperature limit of the first layer 113*a*, the second layer 113*b*, and the third layer 113*c*. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, a solvent contained in the insulating film 127*a* can be removed.

Then, as illustrated in FIG. 15C, light exposure is performed, so that part of the insulating film 127*a* is exposed to visible light or ultraviolet rays. In the case where a positive photosensitive resin composition containing an acrylic resin is used for the insulating film 127*a*, a region where the insulating layer 127 is not formed in a later step is irradiated with visible light or ultraviolet rays using a mask 132.

The insulating layer 127 is formed in regions interposed between two of the pixel electrodes 111*a*, 111*b*, and 111*c*, and a region surrounding the conductive layer 123. Thus, as illustrated in FIG. 13C, irradiation with visible light or ultraviolet rays is performed over the pixel electrode 111*a*, the pixel electrode 111*b*, the pixel electrode 111*c*, and the conductive layer 123 with the use of the mask 132.

Note that the width of the insulating layer 127 to be formed later can be controlled by the region exposed to light here. In this embodiment, the insulating layer 127 is processed to include a portion overlapping with the top surface of the pixel electrode (FIG. 3A and FIG. 3B). As illustrated in FIG. 7A or FIG. 7B, the insulating layer 127 does not necessarily include a portion overlapping with the top surface of the pixel electrode.

Light used for light exposure preferably includes the i-line (wavelength: 365 nm). The light used for light exposure may include at least one of the g-line (wavelength: 436 nm) and the h-line (wavelength: 405 nm).

Here, when a barrier insulating layer against oxygen (e.g., an aluminum oxide film) is provided as one or both of the mask layer 118 (the mask layers 118*a*, 118*b*, and 118*c*) and the insulating film 125A, diffusion of oxygen into the first layer 113*a*, the second layer 113*b*, and the third layer 113*c* can be reduced.

When the EL layer is irradiated with light (visible light or ultraviolet rays), an organic compound contained in the EL layer is brought into an excited state and a reaction with oxygen contained in the atmosphere is promoted in some cases. More specifically, when the EL layer is irradiated with light (visible light or ultraviolet rays) in an atmosphere including oxygen, oxygen might be bonded to the organic compound contained in the EL layer. By providing the mask layer 118 and the insulating film 125A over the island-shaped EL layer, bonding of oxygen in the atmosphere to the organic compound contained in the EL layer can be reduced.

Although FIG. 15C illustrates an example where a positive photosensitive resin is used for the insulating film 127*a* and a region where the insulating layer 127 is not formed is irradiated with visible light or ultraviolet rays, the present invention is not limited thereto. For example, a negative photosensitive resin may be used for the insulating film 127*a*. In this case, a region where the insulating layer 127 is formed is irradiated with visible light or ultraviolet rays.

Figure 16A:
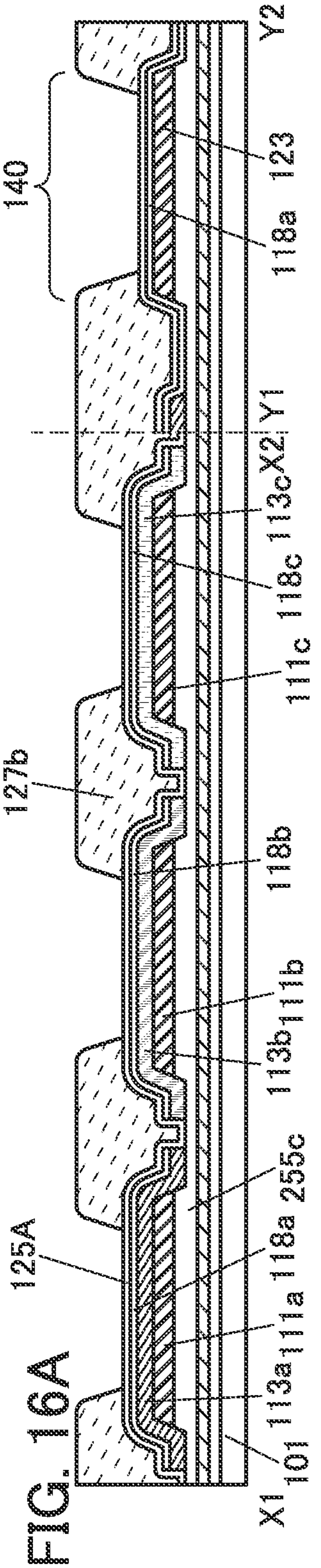
FIG. 16A to FIG. 16C are cross-sectional views illustrating an example of a manufacturing method of a display apparatus.
Figure 20A:
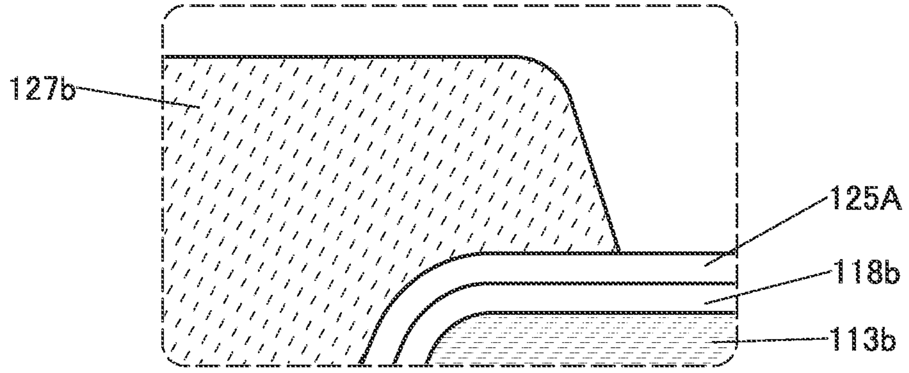
FIG. 20A to FIG. 20D are cross-sectional views illustrating an example of a manufacturing method of a display apparatus.

Next, the region of the insulating film 127*a* exposed to light is removed by a development step as illustrated in FIG. 16A and FIG. 20A, so that an insulating layer 127*b* is formed. Note that FIG. 20A is an enlarged view of the end portions of the second layer 113*b* and the insulating layer 127*b* and the vicinity thereof illustrated in FIG. 16A. The insulating layer 127*b* is formed in regions interposed between two of the pixel electrodes 111*a*, 111*b*, and 111*c*, and a region surrounding the conductive layer 123. In the case where an acrylic resin is used for the insulating film 127*a*, an alkaline solution is preferably used as a developer, and for example, an aqueous solution of tetramethyl ammonium hydroxide (TMAH) can be used.

Then, a residue (what is called a scum) due to the development step may be removed. For example, the residue can be removed by ashing using oxygen plasma.

Etching may be performed to adjust the surface level of the insulating layer 127*b*. The insulating layer 127*b* may be processed by ashing using oxygen plasma, for example. Also in the case where a non-photosensitive material is used for the insulating film 127*a*, the surface level of the insulating film 127*a* can be adjusted by the ashing or the like.

Figure 16B:
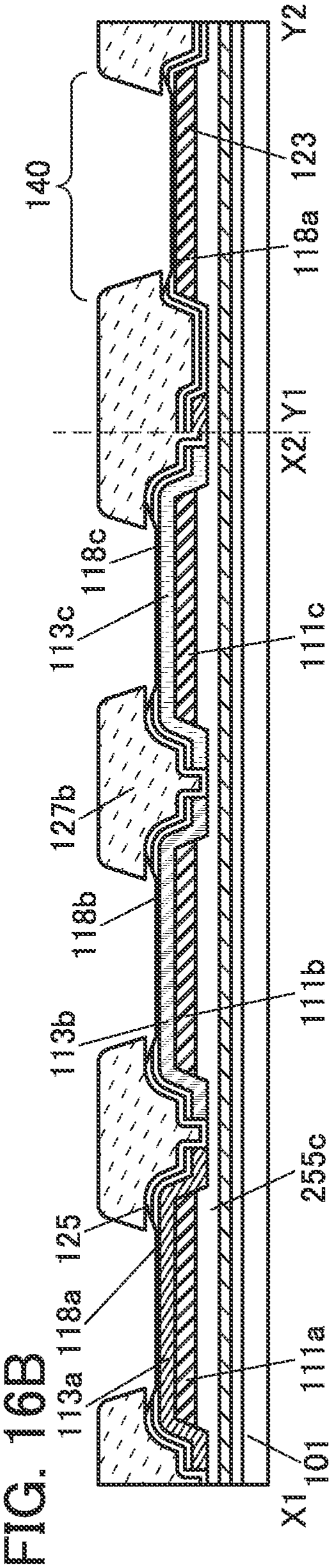
Figure 20B:
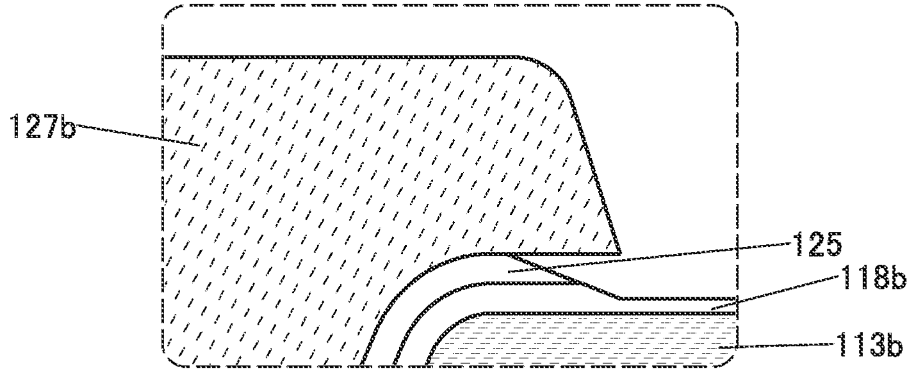

Next, as illustrated in FIG. 16B and FIG. 20B, etching treatment is performed using the insulating layer 127*b* as a mask to remove part of the insulating film 125A, so that the mask layers 118*a*, 118*b*, and 118*c* are partly thinned. Accordingly, the insulating layer 125 is formed below the insulating layer 127*b*. In addition, the surfaces of the thinned portions of the mask layers 118*a*, 118*b*, and 118*c* are exposed. Note that FIG. 20B is an enlarged view of the end portions of the second layer 113*b* and the insulating layer 127*b* and the vicinity thereof illustrated in FIG. 16B. Note that the etching treatment using the insulating layer 127*b* as a mask is referred to as first etching treatment below in some cases.

The first etching treatment can be performed by dry etching or wet etching. Note that the insulating film 125A is preferably deposited using a material similar to that for the mask layers 118*a*, 118*b*, and 118*c*, in which case the first etching treatment can be performed collectively.

As illustrated in FIG. 20B, etching is performed using the insulating layer 127*b* with a tapered side surface as a mask, so that the side surface of the insulating layer 125, the upper end portions of the side surfaces of the mask layers 118*a*, 118*b*, and 118*c* can be tapered relatively easily.

In the case of performing dry etching, a chlorine-based gas is preferably used. As the chlorine-based gas, any of $Cl_2$, $BCl_3$, $SiCl_4$, $CCl_4$, and the like can be used alone or two or more of the gases can be mixed and used. In addition, one of an oxygen gas, a hydrogen gas, a helium gas, an argon gas, and the like or a mixture of two or more gases selected from these can be added to the chlorine-based gas as appropriate. By employing dry etching, the thin regions of the mask layers 118*a*, 118*b*, and 118*c* can be formed with favorable in-plane uniformity.

A dry etching apparatus including a high-density plasma source can be used as the dry etching apparatus. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used.

The capacitively coupled plasma etching apparatus including parallel plate electrodes may have a structure in which a high-frequency voltage is applied to one of the parallel plate electrodes. Alternatively, different high-frequency voltages may be applied to one of the parallel plate electrodes. Alternatively, high-frequency voltages with the same frequency may be applied to the parallel plate electrodes. Alternatively, high-frequency voltages with different frequencies may be applied to the parallel plate electrodes.

In the case of performing dry etching, a by-product generated by the dry etching is sometimes deposited on the top surface and the side surface of the insulating layer 127*b*, for example. Thus, a component contained in the etching gas, a component contained in the insulating film 125A, components contained in the mask layers 118*a*, 118*b*, and 118*c*, or the like might be contained in the insulating layer 127 in the completed display apparatus.

Furthermore, the first etching treatment is preferably performed by wet etching. The use of a wet etching method can reduce damage to the first layer 113*a*, the second layer 113*b*, and the third layer 113*c* compared with the case of using a dry etching method. The wet etching can be performed using an alkaline solution or the like. For example, wet etching of an aluminum oxide film is preferably performed using an aqueous solution of tetramethyl ammonium hydroxide (TMAH) that is an alkaline solution. In this case, the wet etching can be performed by a puddle method. Note that the insulating film 125A is preferably deposited using a material similar to that for the mask layers 118*a*, 118*b*, and 118*c*, in which case the etching treatment can be performed collectively.

As illustrated in FIG. 16B and FIG. 20B, the mask layers 118*a*, 118*b*, and 118*c* are not removed completely by the first etching treatment, and the etching treatment is stopped when the mask layers 118*a*, 118*b*, and 118*c* are thinned. When the corresponding mask layers 118*a*, 118*b*, and 118*c* remain over the first layer 113*a*, the second layer 113*b*, and the third layer 113*c* in this manner, the first layer 113*a*, the second layer 113*b*, and the third layer 113*c* can be prevented from being damaged by treatment in a later step.

Although the mask layers 118*a*, 118*b*, and 118*c* are thinned in FIG. 16B and FIG. 20B, the present invention is not limited thereto. For example, depending on the thicknesses of the insulating film 125A, the mask layers 118*a*, 118*b*, and 118*c*, the first etching treatment may be stopped before the insulating film 125A is processed into the insulating layer 125.

In the case where the insulating film 125A is deposited using a material similar to that for the mask layers 118*a*, 118*b*, and 118*c*, a boundary between the insulating film 125A and each of the mask layers 118*a*, 118*b*, and 118*c* becomes unclear in some cases.

Although FIG. 16B and FIG. 20B illustrates an example where the shape of the insulating layer 127*b* is not changed from that in FIG. 16A and FIG. 20A, the present invention is not limited thereto. For example, the end portion of the insulating layer 127*b* sags and covers the end portion of the insulating layer 125 in some cases. In another case, the end portion of the insulating layer 127*b* is in contact with the top surfaces of the mask layers 118*a*, 118*b*, and 118*c*.

Figure 16C:
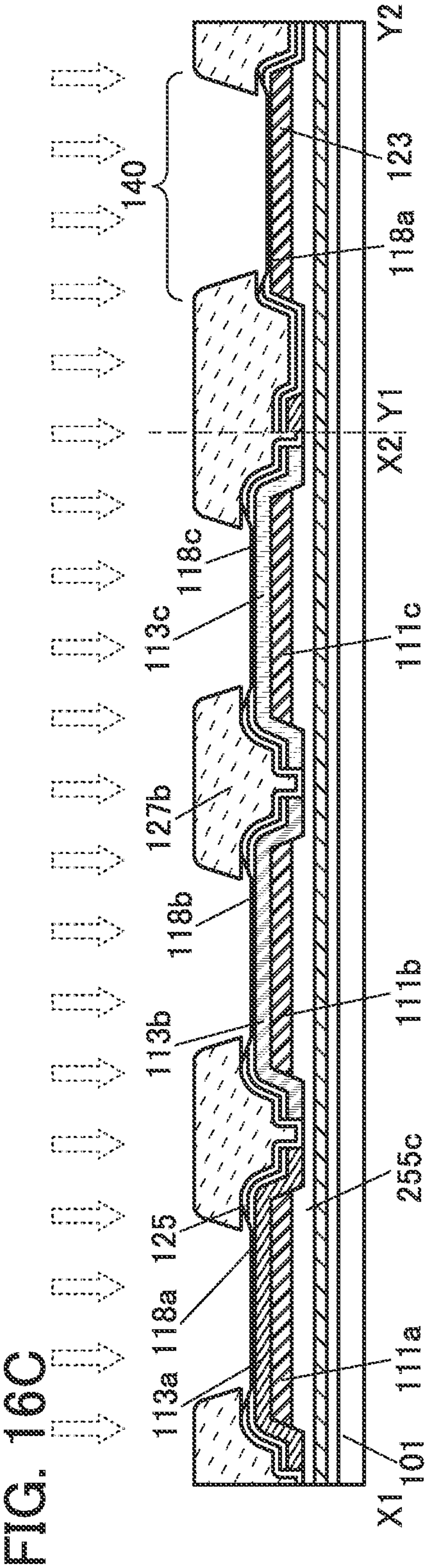

Then, light exposure is preferably performed from the top surface side of the insulating layer 127*b* so that the insulating layer 127*b* is irradiated with visible light or ultraviolet rays (FIG. 16C). The energy density of the light exposure is preferably greater than 0 $mJ/cm^2$ and less than or equal to 800 $mJ/cm^2$, further preferably greater than 0 $mJ/cm^2$ and less than or equal to 500 $mJ/cm^2$. When such light exposure is performed after development, the post-baking temperature for reflow of the insulating layer 127*b* in a later step can be decreased in some cases.

Here, when barrier insulating layers against oxygen (e.g., an aluminum oxide film) are provided as the mask layer 118*a*, the mask layer 118*b*, and the mask layer 118*c*, diffusion of oxygen into the first layer 113*a*, the second layer 113*b*, and the third layer 113*c* can be reduced.

When the EL layer is irradiated with light (visible light or ultraviolet rays), an organic compound contained in the EL layer is brought into an excited state and a reaction with oxygen contained in the atmosphere is promoted in some cases. More specifically, when the EL layer is irradiated with light (visible light or ultraviolet rays) in an atmosphere including oxygen, oxygen might be bonded to the organic compound contained in the EL layer. When the mask layer 118*a*, the mask layer 118*b*, and the mask layer 118*c* are provided over island-shaped EL layers, bonding of oxygen in an atmosphere to the organic compound contained in the EL layers can be reduced.

In contrast, as described later, when light exposure is not performed on the insulating layer 127*b*, changing the shape of the insulating layer 127*b* (reflow) or changing the shape of the insulating layer 127 into a tapered shape in a later step becomes easy in some cases. Thus, sometimes it is preferable not to perform light exposure on the insulating layer 127*b* or 127 after development.

For example, in the case where a light curable resin is used as the material of the insulating layer 127*b*, light exposure on the insulating layer 127*b* can start polymerization and cure the insulating layer 127*b*. Note that without performing light exposure on the insulating layer 127*b* at this stage, at least one of after-mentioned post-baking and second etching treatment may be performed while the insulating layer 127*b* remains in a state where its shape is relatively easily changed. Thus, generation of unevenness on the formation surface of the common layer 114 and the common electrode 115 can be inhibited and step disconnection of the common layer 114 and the common electrode 115 can be inhibited.

After the post-baking or the second etching treatment described later, light exposure to the insulating layer 127*b* (or the insulating layer 127) may be performed. After the development, light exposure may be performed before the first etching treatment. Meanwhile, depending on the material of the insulating layer 127*b* (e.g., a positive type material) and the conditions of the first etching treatment, by performing light exposure, the insulating layer 127*b* is sometimes dissolved in the chemical solution in the first etching treatment. Therefore, light exposure is preferably performed after the first etching treatment and before the post-baking. Thus, the insulating layer 127 having a desired shape can be stably formed with high reproducibility.

Here, irradiation with visible light or ultraviolet rays illustrated in FIG. 16C is preferably performed in an atmosphere containing no oxygen or an atmosphere containing a small amount of oxygen. For example, the irradiation with visible light or ultraviolet rays is preferably performed in an inert gas atmosphere such as a nitrogen atmosphere or a reduced-pressure atmosphere. If the irradiation with visible light or ultraviolet rays is performed in an atmosphere containing a large amount of oxygen, the compound contained in the EL layer might be oxidized and the properties of the EL layer might be changed. In contrast, by performing the irradiation with visible light or ultraviolet rays in an atmosphere containing no oxygen or an atmosphere containing a small amount of oxygen, the change of the properties of the EL layer can be prevented; hence, a more highly reliable display apparatus can be provided.

Figures 17A, 17B, 17C:
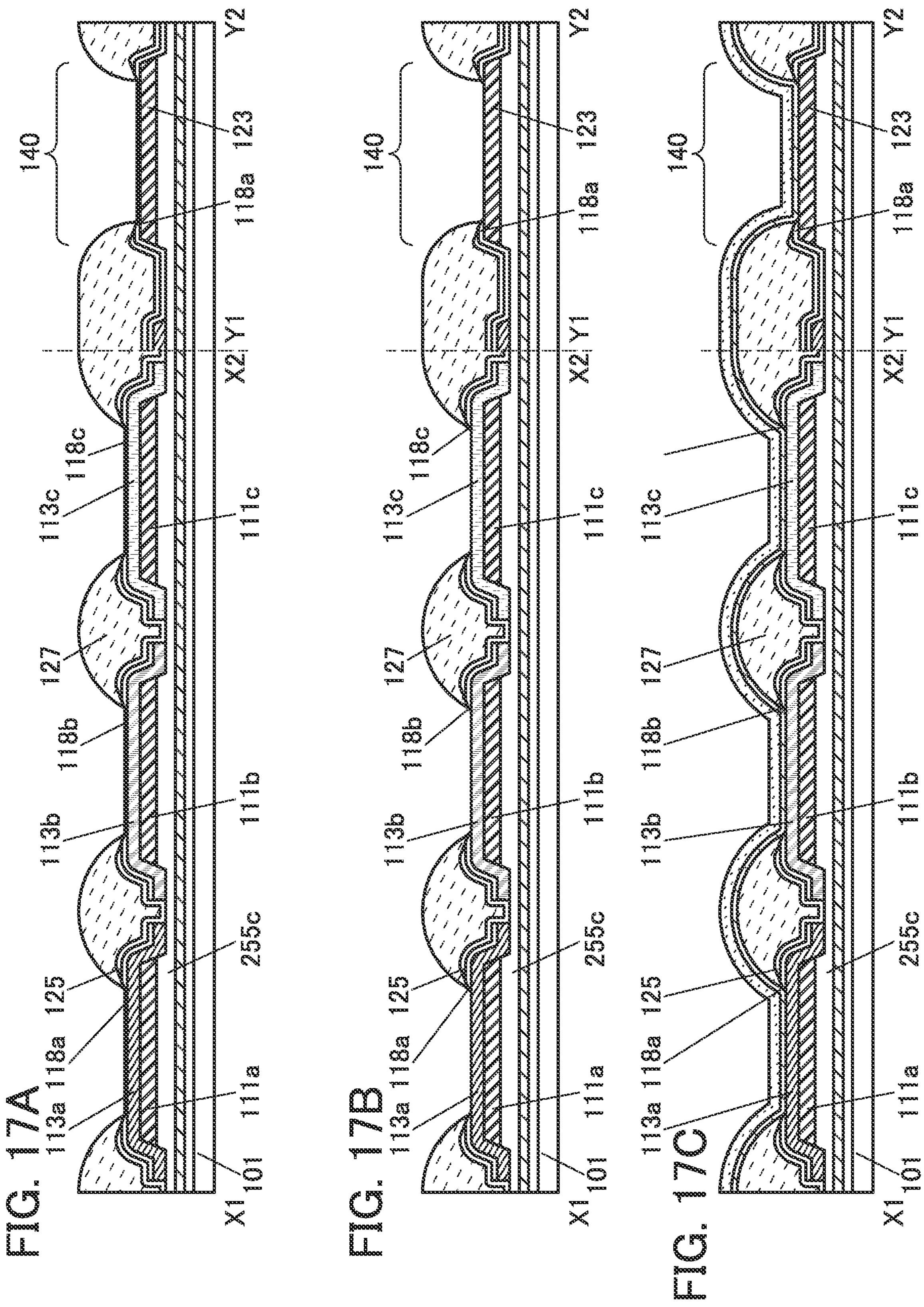
FIG. 17A to FIG. 17C are cross-sectional views illustrating an example of a manufacturing method of a display apparatus.
Figure 20C:
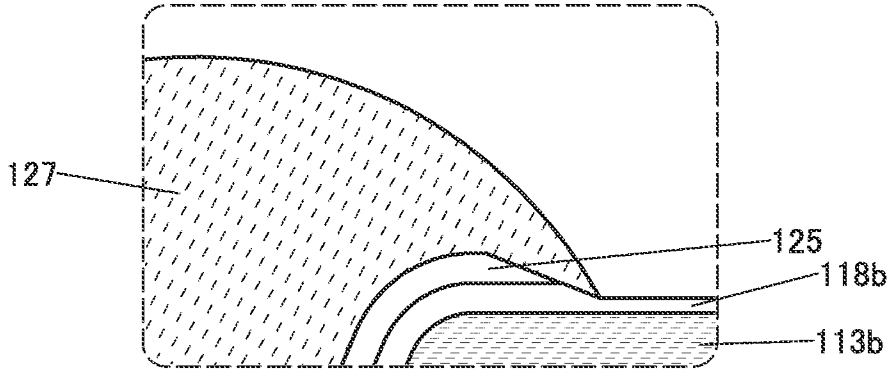

Then, heat treatment (also referred to as post-baking) is performed as illustrated in FIG. 17A and FIG. 20C. By performing the heat treatment, the insulating layer 127*b* is reflowed and the insulating layer 127 having a tapered side surface can be formed. As described above, in some cases, the insulating layer 127*b* is already changed in shape and has a tapered side surface at the time when the first etching treatment is finished. The heat treatment is performed at a temperature lower than the upper temperature limit of the EL layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C.

The heating atmosphere may be either an air atmosphere or an inert gas atmosphere. Alternatively, the heating atmosphere may be either an atmospheric pressure atmosphere or a reduced pressure atmosphere. The heat treatment is preferably performed in a reduced-pressure atmosphere because drying at a lower temperature is possible. The heat treatment in this step is preferably performed at a higher substrate temperature than the heat treatment (pre-baking) after formation of the insulating film 127*a*. In this case, adhesion between the insulating layer 127 and the insulating layer 125 and the corrosion resistance of the insulating layer 127 can be improved. Note that FIG. 20C is an enlarged view of the end portions of the second layer 113*b* and the insulating layer 127 and the vicinity thereof illustrated in FIG. 17A.

As described above, a material with high heat resistance is used for the light-emitting device of the display apparatus of one embodiment of the present invention. Therefore, the temperature of the pre-baking and the temperature of the post-baking can each be higher than or equal to 100° C., higher than or equal to 120° C., or higher than or equal to 140° C. In this case, adhesion between the insulating layer 127 and the insulating layer 125 and the corrosion resistance of the insulating layer 127 can be improved. Moreover, the range of choice for materials that can be used for the insulating layer 127 can be widened. By adequately removing the solvent and the like included in the insulating layer 127, entry of impurities such as water and oxygen into the EL layer can be inhibited.

The first etching treatment does not remove the mask layers 118*a*, 118*b*, and 118*c* completely to make the thinned mask layers 118*a*, 118*b*, and 118*c* remain, thereby preventing the first layer 113*a*, the second layer 113*b*, and the third layer 113*c* from being damaged by the heat treatment and deteriorating. Thus, the reliability of the light-emitting devices can be improved.

As illustrated in FIG. 5A and FIG. 5B, the side surface of the insulating layer 127 might have a concave curved shape depending on the materials for the insulating layer 127, and the temperature, time, and atmosphere of post-baking. For example, the insulating layer 127 is more likely to be changed in shape to have a concave curved shape as the post-baking is performed at higher temperature or for a longer time. In addition, as described above, the insulating layer 127 is sometimes likely to be changed in shape at the time of post-baking, in the case where light exposure is not performed on the insulating layer 127*b* after development.

Figure 20D:
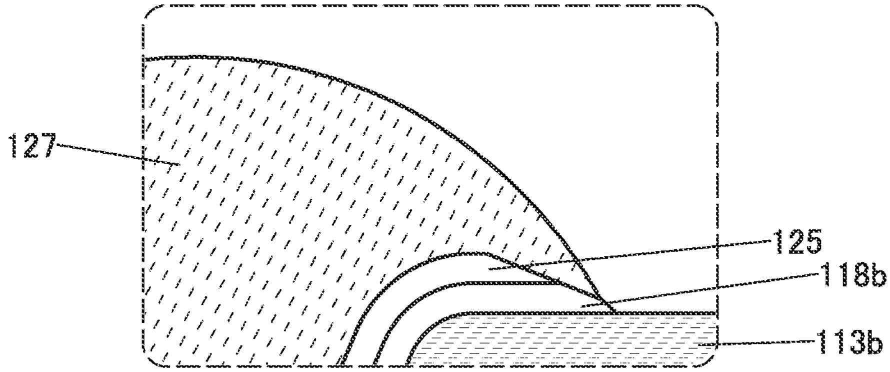

Next, as illustrated in FIG. 17B and FIG. 20D, etching treatment is performed using the insulating layer 127 as a mask to remove part of the mask layers 118*a*, 118*b*, and 118*c*. Note that part of the insulating layer 125 is also removed in some cases. Thus, opening are formed in each of the mask layers 118*a*, 118*b*, and 118*c*, and the top surfaces of the first layer 113*a*, the second layer 113*b*, the third layer 113*c*, and the conductive layer 123 are exposed. Note that FIG. 20D is an enlarged view of the end portions of the second layer 113*b* and the insulating layer 127 and the vicinity thereof illustrated in FIG. 17B. Note that the etching treatment using the insulating layer 127 as a mask is referred to as second etching treatment in some cases below.

The end portion of the insulating layer 125 is covered with the insulating layer 127. FIG. 17B and FIG. 20D illustrate an example where part of the end portion of the mask layer 118*b* (specifically, the tapered portion formed by the first etching treatment) is covered with the insulating layer 127 and the tapered portion formed by the second etching treatment is exposed. That is, the structure corresponds to the illustrated in FIG. 3A and FIG. 3B.

Here, when the insulating layer 125 and the mask layer are collectively subjected to etching treatment after post-baking without performing the first etching treatment, the insulating layer 125 and the mask layer below the end portion of the insulating layer 127 are eliminated and accordingly a cavity is formed in some cases. The cavity causes unevenness in the formation surface of the common layer 114 and the common electrode 115, so that step disconnection is likely to be generated in the common layer 114 and the common electrode 115.

However, even when a cavity is formed owing to side-etching of the insulating layer 125 and the mask layer by the first etching treatment, the post-baking performed subsequently can reflow the insulating layer 127 and fill the cavity. Since the following second etching treatment etches the thinned mask layer, the amount of side etching is small and thus a cavity is not easily formed. Furthermore, even when a cavity is formed, the size can be extremely small. Therefore, the formation surface of the common layer 114 and the common electrode 115 can be made flatter.

Note that as illustrated in FIG. 5A, FIG. 5B, FIG. 7A and FIG. 7B, the insulating layer 127 may cover the entire end portion of the mask layer 118*b*. For example, the end portion of the insulating layer 127 sags and covers the end portion of the mask layer 118*b* in some cases. The end portion of the insulating layer 127 is in contact with at least one of the top surfaces of the first layer 113*a*, the second layer 113*b*, and the third layer 113*c* in some cases. As described above, in the case where light exposure is not performed on the insulating layer 127*b* after development, the insulating layer 127 is likely to change in shape in some cases.

The second etching treatment is preferably performed by wet etching. The use of a wet etching method can reduce damage to the first layer 113*a*, the second layer 113*b*, and the third layer 113*c* compared with the case of using a dry etching method. The wet etching can be performed using an alkaline solution or the like.

As described above, providing the insulating layer 127, the insulating layer 125, the mask layer 118*a*, and the mask layer 118*b*, and the mask layer 118*c* can inhibit the common layer 114 and the common electrode 115 between the light-emitting devices from having connection defects due to a disconnected portion and an increased electric resistance due to a locally thinned portion. Thus, the display quality of the display apparatus of one embodiment of the present invention can be improved.

Heat treatment may be further performed after part of the first layer 113*a*, the second layer 113*b*, and the third layer 113*c* are exposed. The heat treatment can remove water contained in the EL layer, water adsorbed onto the surface of the EL layer, and the like. In addition, the heat treatment changes the shape of the insulating layer 127 in some cases. Specifically, the insulating layer 127 may be extended to cover at least one of the end portion of the insulating layer 125, the end portions of the mask layers 118*a*, 118*b*, and 118*c*, and the top surfaces of the first layer 113*a*, the second layer 113*b*, and the third layer 113*c*. For example, the insulating layer 127 may have a shape illustrated in FIG. 5A and FIG. 5B.

The heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced pressure atmosphere because dehydration at a lower temperature is possible. Note that the temperature range of the heat treatment is preferably set as appropriate in consideration of the upper temperature limit of the EL layer. In consideration of the upper temperature limit of the EL layer, a temperature higher than or equal to 70° C. and lower than or equal to 120° C. is particularly preferable in the above temperature ranges.

Next, the common layer 114 and the common electrode 115 are formed in this order over the insulating layer 127, the first layer 113*a*, the second layer 113*b*, and the third layer 113*c* (FIG. 17C).

The common layer 114 can be formed by an evaporation method (including a vacuum evaporation method), a transfer method, a printing method, an inkjet method, a coating method, or the like.

The common electrode 115 can be formed by a sputtering method or a vacuum evaporation method, for example. Alternatively, a film formed by an evaporation method and a film formed by a sputtering method may be stacked.

Figure 18A:
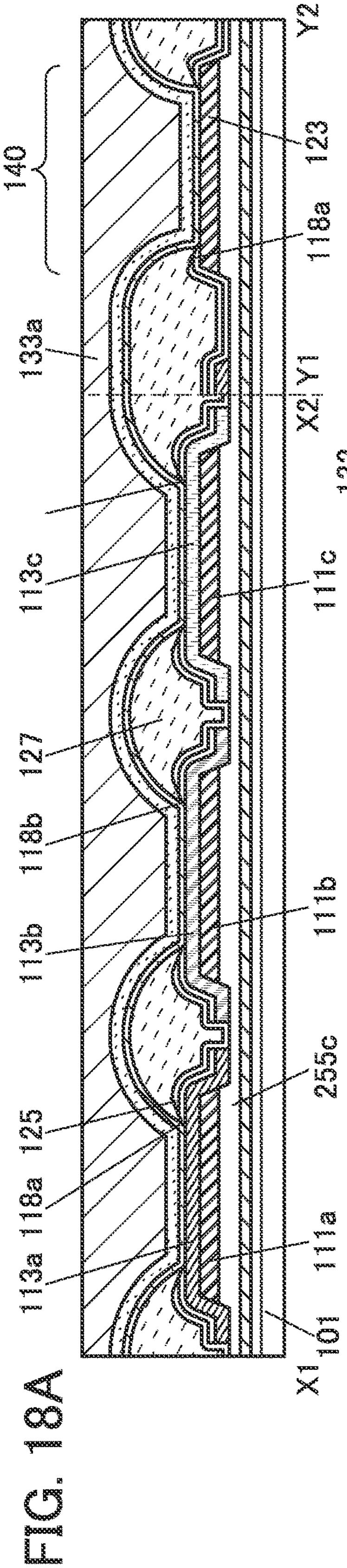
FIG. 18A to FIG. 18C are cross-sectional views illustrating an example of a manufacturing method of a display apparatus.

Next, an insulating film 133*a* is formed over the common electrode 115 (FIG. 18A). The insulating film 133*a* can be formed using a material and a method similar to those for the insulating film 127*a* illustrated in FIG. 15B. Note that the insulating film 133*a* and the insulating film 127*a* are formed using the same material, i.e., the insulating film 133*a* and the insulating film 127*a* contain the same material, whereby manufacturing cost can be reduced. When the insulating film 133*a* and the insulating film 127*a* contain the same material, shrinkage of the material (e.g., shrinkage of an organic resin material) due to heat treatment in the manufacturing process can be caused in the same manner. By making the shrinkage or the shrinkage rate of materials used for the insulating film 133*a* and the insulating film 127*a* the same, stress or the like of the whole display apparatus is easily controlled, which is preferable.

Figure 18B:
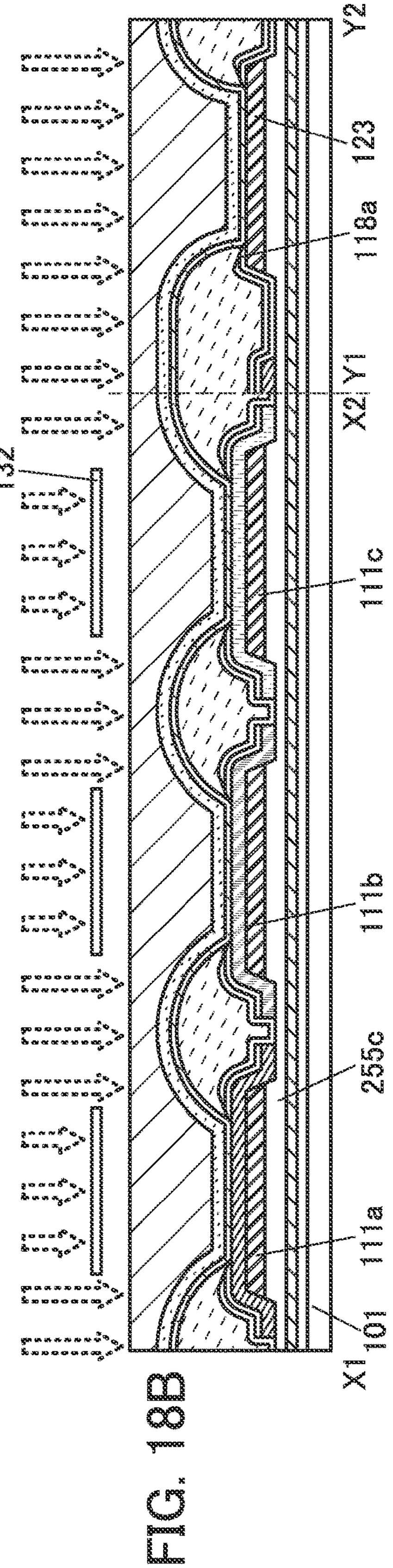

Then, as illustrated in FIG. 18B, light exposure is performed so that part of the insulating film 133*a* is exposed to visible light or ultraviolet rays. In the case where a positive photosensitive resin composition is used for the insulating film 133*a*, a region where the lens 133 is not formed in a later step is irradiated with visible light or ultraviolet rays using the mask 132. The lens 133 is formed in each of regions overlapping with the first layer 113*a*, the second layer 113*b*, and the third layer 113*c*.

Note that the width (diameter) of the lens 133 to be formed later can be controlled by the region exposed to light here. In this embodiment, the lens 133 is processed to have an island shape (FIG. 9B). Note that as illustrated in FIG. 10B, the lenses 133 may be processed so that the end portions of the lenses 133 are connected in adjacent pixels. In this case, the width of a region where the insulating film 133*a* is exposed to light is narrowed, and reflow is performed in a later step, whereby the end portions of the lenses 133 are connected.

For light exposure to the insulating film 133*a*, a method similar to that for light exposure to the insulating film 127*a* illustrated in FIG. 15C can be used.

Figure 18C:
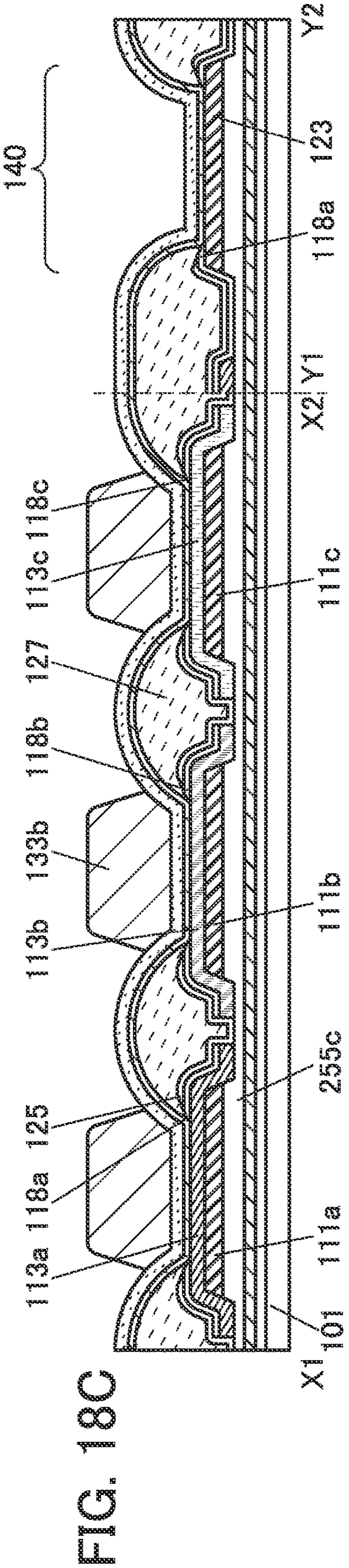

Next, the region of the insulating film 133*a* exposed to light is removed by development as illustrated in FIG. 18C, so that an insulating layer 133*b* is formed. The insulating layer 133*b* is formed in each of regions overlapping with the first layer 113*a*, the second layer 113*b*, and the third layer 113*c*. In the case where an acrylic resin is used for the insulating film 133*a*, an alkaline solution is preferably used as a developer, and for example, an aqueous solution of tetramethyl ammonium hydroxide (TMAH) can be used.

Then, a residue (scum) due to the development may be removed. For example, the residue can be removed by ashing using oxygen plasma.

Etching may be performed to adjust the surface level of the insulating layer 133*b*. The insulating layer 133*b* may be processed by ashing using oxygen plasma, for example. Furthermore, in the case where a non-photosensitive material is used for the insulating film 133*a*, the surface level of the insulating film 133*a* can be adjusted by the ashing or the like.

Figure 19A:
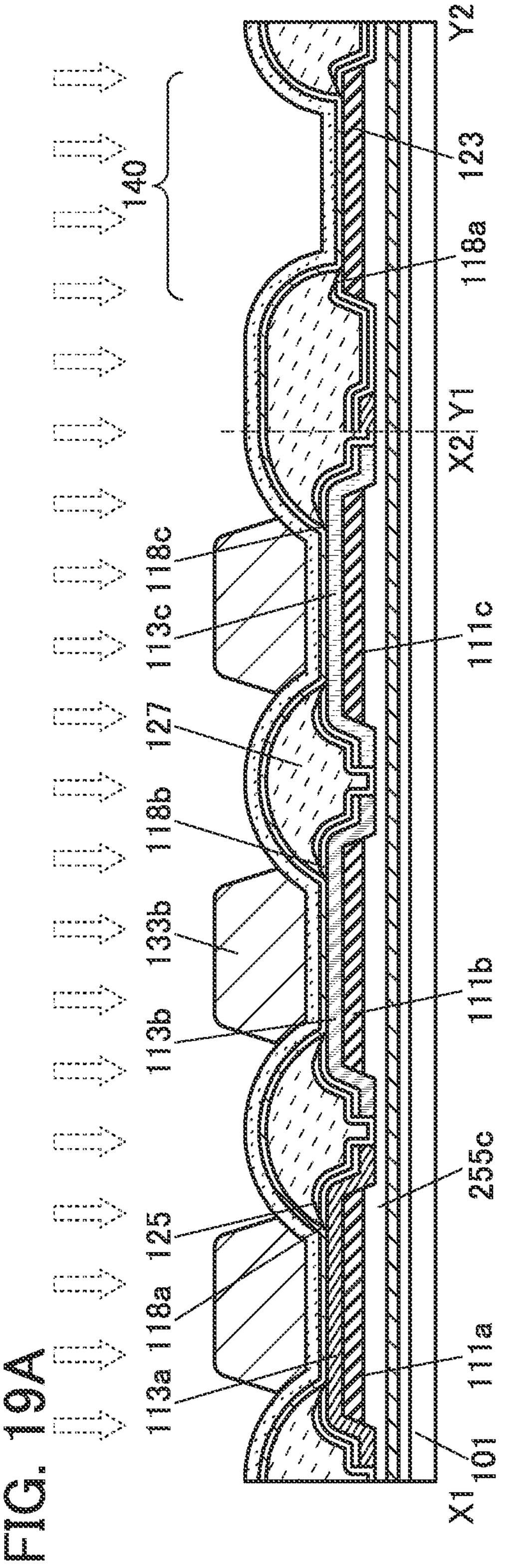
FIG. 19A and FIG. 19B are cross-sectional views illustrating an example of a manufacturing method of a display apparatus.

Then, light exposure is preferably performed from the top surface side of the insulating layer 133*b* so that the insulating layer 133*b* is irradiated with visible light or ultraviolet rays (FIG. 19A). Performing light exposure after development can improve the transparency of the insulating layer 127*b* in some cases. By increasing the transparency of the insulating layer 127*b*, the transmittance of the lens 133 formed later can be increased. For light exposure to the insulating layer 133*b*, a method similar to that for light exposure of the insulating layer 127*b* illustrated in FIG. 16C can be used.

Figure 19B:
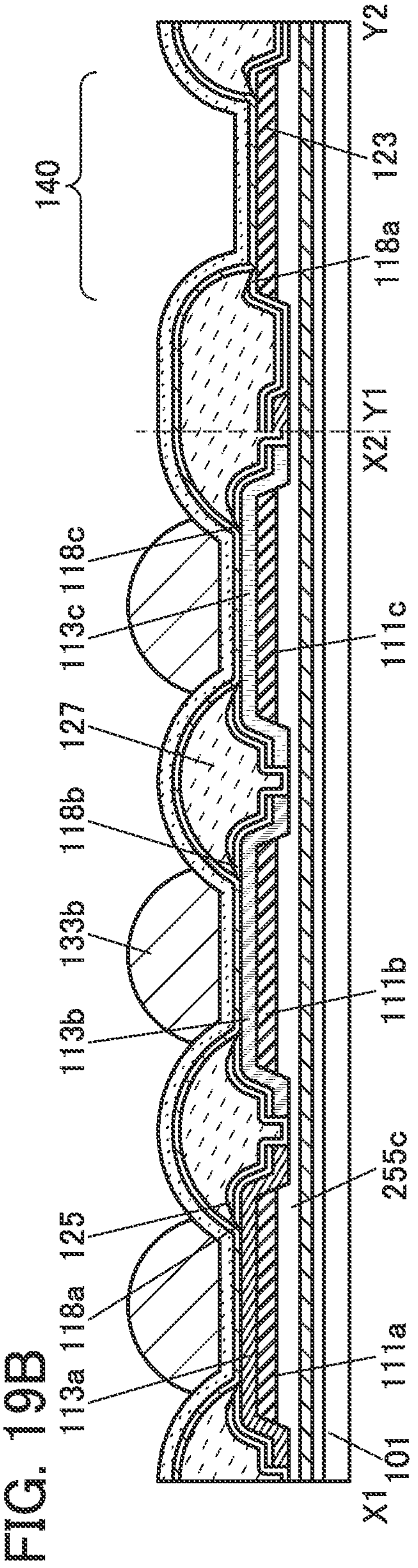

Next, heat treatment (post-baking) is performed as illustrated in FIG. 19B. By performing the heat treatment, the insulating layer 133*b* can be reflowed and changed into the convex shaped lens 133 having a tapered side surface. For the heat treatment, a step similar to that for the heat treatment in the insulating layer 127 illustrated in FIG. 17A can be used.

Next, the protective layer 131 is formed over the common electrode 115 and the lens 133. Furthermore, the substrate 120 is bonded over the protective layer 131 with the resin layer 122, whereby the display apparatus can be manufactured (FIG. 1).

Examples of a method for forming the protective layer 131 include a vacuum evaporation method, a sputtering method, a CVD method, and an ALD method.

As described above, in the method for manufacturing a display apparatus of one embodiment of the present invention, the island-shaped first layer 113*a*, the island-shaped second layer 113*b*, and the third layer 113*c* are formed not by using a fine metal mask but by depositing a film on the entire surface and processing the film; thus, the island-shaped layers can be formed to have a uniform thickness. Consequently, a high-resolution display apparatus or a display apparatus with a high aperture ratio can be obtained.

Furthermore, even when the resolution or the aperture ratio is high and the distance between the subpixels is extremely short, the first layer 113*a*, the second layer 113*b*, and the third layer 113*c* can be inhibited from being in contact with each other in the adjacent subpixels. Accordingly, generation of a leakage current flowing between subpixels can be inhibited. This can prevent crosstalk due to unintended light emission, so that a display apparatus with extremely high contrast can be obtained.

The insulating layer 127 having a tapered end portion and being provided between adjacent island-shaped EL layers can inhibit occurrence of step disconnection and prevent formation of a locally thinned portion in the common electrode 115 at the time of forming the common electrode 115. This can inhibit the common layer 114 and the common electrode 115 to have connection defects due to the disconnected portion and an increased electric resistance due to the locally thinned portion. Thus, the display apparatus of one embodiment of the present invention can have both a higher resolution and higher display quality.

When a lens is provided over the common electrode overlapping with the light-emitting region, light that proceeds in the lateral direction through the common electrode 115 as a waveguide can be inhibited and light extraction efficiency can be improved.

In the case where the display apparatus includes a light-receiving device, a lens can be provided over the light-receiving device. When the diameter of the lens is larger than the effective area of a light-receiving portion, the light collecting capability can be increased, and the light sensitivity of the light-receiving device can be increased.

This embodiment can be combined with any of the other embodiments as appropriate.

Embodiment 3

In this embodiment, a display apparatus of one embodiment of the present invention will be described with reference to FIG. 21 and FIG. 22.

[Pixel Layout]

In this embodiment, pixel layouts different from those in FIG. 1A will be mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

The top surface shape of the subpixel illustrated in the diagrams in this embodiment corresponds to the top surface shape of a light-emitting region (or a light-receiving region).

Examples of the top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in the diagrams, and the components of the circuit may be placed outside the range of the subpixels.

Figure 21A:
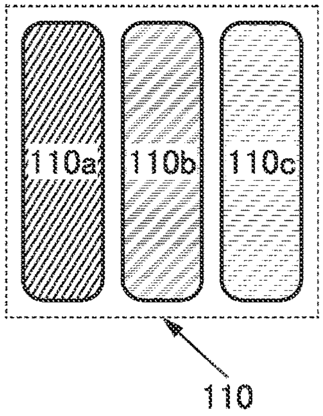
FIG. 21A to FIG. 21F are diagrams each illustrating an example of a pixel.

The pixel 110 illustrated in FIG. 21A employs stripe arrangement. The pixel 110 illustrated in FIG. 21A includes the three subpixels 110*a*, 110*b*, and 110*c*.

Figure 21B:
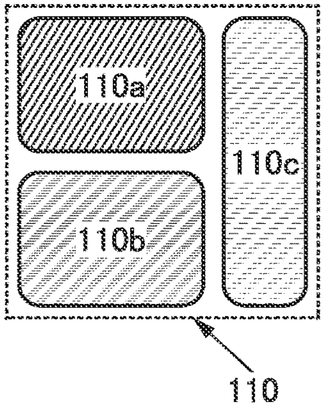

The pixel 110 illustrated in FIG. 21B employs S-stripe arrangement. The pixel 110 illustrated in FIG. 21B includes the three subpixels 110*a*, 110*b*, and 110*c*.

Figure 21C:
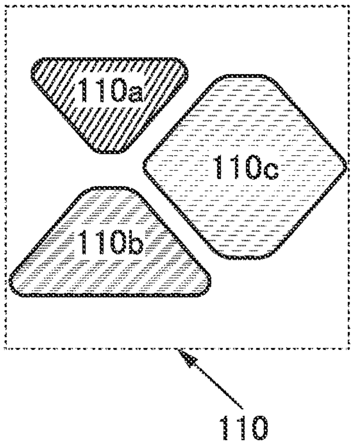

The pixel 110 illustrated in FIG. 21C includes the subpixel 110*a* whose top surface shape is a rough triangle or a rough trapezoid with rounded corners, the subpixel 110*b* whose top surface shape is a rough triangle or a rough trapezoid with rounded corners, and the subpixel 110*c* whose top surface shape is a rough tetragon or a rough hexagon with rounded corners. The subpixel 110*b* has a larger light-emitting area than the subpixel 110*a*. In this manner, the shapes and sizes of the subpixels can be determined independently.

Figure 21D:
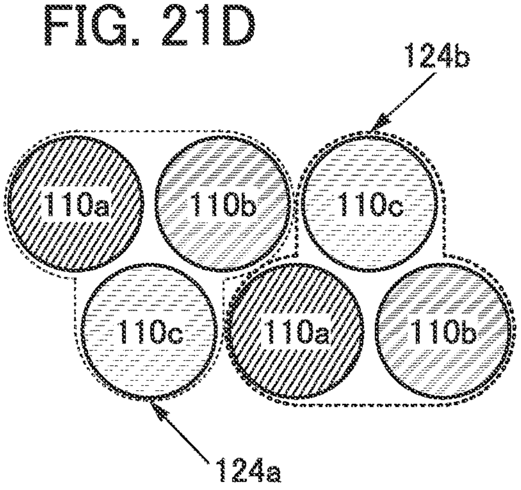

Pixels 124*a* and 124*b* illustrated in FIG. 21D employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row).

FIG. 21D illustrates an example in which each subpixel has a circular top surface shape, and FIG. 1A illustrates an example in which each subpixel has a rough tetragonal top surface with rounded corners.

Figure 21E:
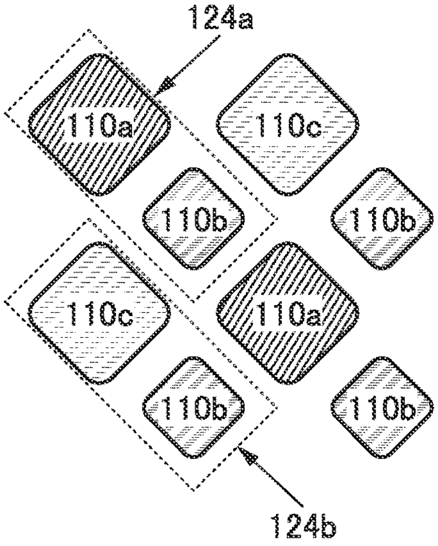

The pixels 124*a* and 124*b* illustrated in FIG. 21E employ PenTile arrangement. FIG. 21E illustrates an example where the pixels 124*a* including the subpixel 110*a* and the subpixel 110*b* and the pixels 124*b* including the subpixel 110*b* and the subpixel 110*c* are alternately arranged.

Figure 21F:
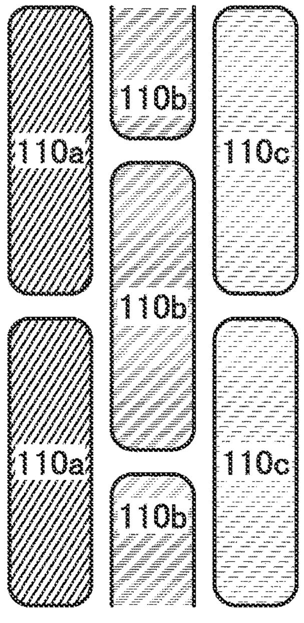

FIG. 21F illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view.

For example, in each pixel in FIG. 21A to FIG. 21F, it is preferable that the subpixel 110*a* be a subpixel R emitting red light, the subpixel 110*b* be a subpixel G emitting green light, and the subpixel 110*c* be a subpixel B emitting blue light. Note that the structures of the subpixels are not limited to this, and the colors and arrangement order of the subpixels can be determined as appropriate. For example, the subpixel 110*b* may be the subpixel R emitting red light and the subpixel 110*a* may be the subpixel G emitting green light.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface shape of a subpixel becomes a polygon with rounded corners, an ellipse, a circle, or the like, in some cases.

Furthermore, in the method for manufacturing the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface shape of the EL layer becomes a polygon with rounded corners, an ellipse, a circle, or the like, in some cases. For example, when a resist mask with a square top surface shape is intended to be formed, a resist mask with a circular top surface shape might be formed, and the top surface shape of the EL layer might be circular.

Note that to obtain a desired top surface shape of the EL layer, a technique of correcting a mask pattern in advance so that a transferred pattern agrees with a design pattern (OPC (Optical Proximity Correction) technique) may be used. Specifically, with the OPC technique, a pattern for correction is added to a corner portion or the like of a figure on a mask pattern.

As illustrated in FIG. 22A to FIG. 22I, the pixel can include four types of subpixels.

Figure 22A:
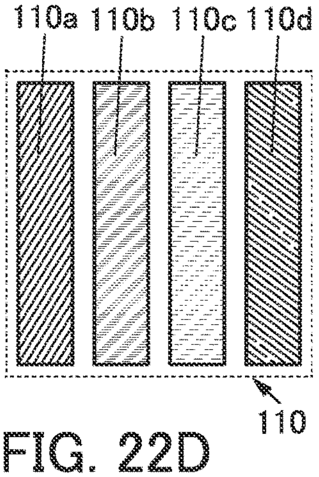
FIG. 22A to FIG. 22K are diagrams each illustrating an example of a pixel.
Figure 22B:
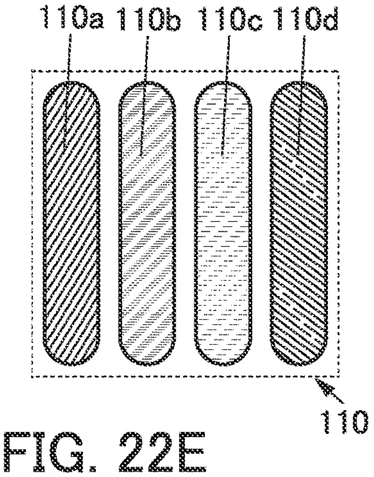
Figure 22C:
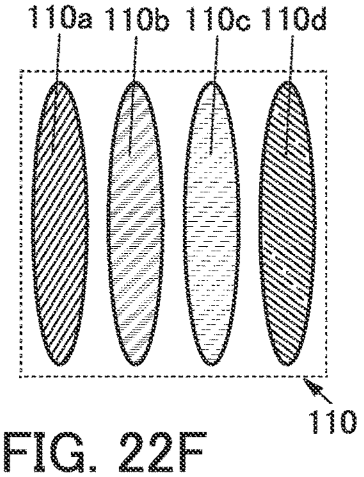

The pixel 110 illustrated in FIG. 22A to FIG. 22C employs stripe arrangement.

FIG. 22A illustrates an example where each subpixel has a rectangular top surface shape, FIG. 22B illustrates an example where each subpixel has a top surface shape formed by combining two half circles and a rectangle, and FIG. 22C illustrates an example where each subpixel has an elliptical top surface shape.

Figure 22D:
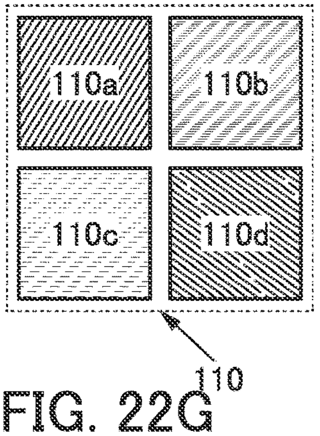
Figure 22E:
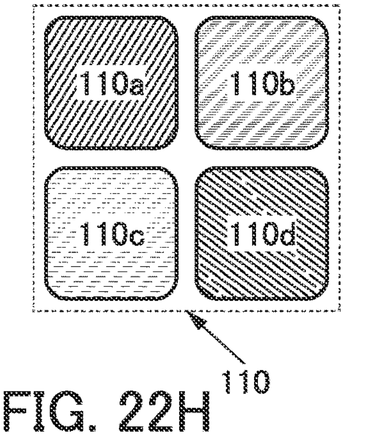
Figure 22F:
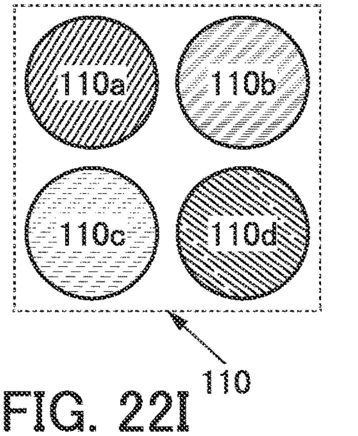

The pixel 110 illustrated in FIG. 22D to FIG. 22F employs matrix arrangement.

FIG. 22D illustrates an example where each subpixel has a square top surface shape, FIG. 22E illustrates an example where each subpixel has a rough square top surface shape with rounded corners, and FIG. 22F illustrates an example where each subpixel has a circular top surface shape.

Figure 22G:
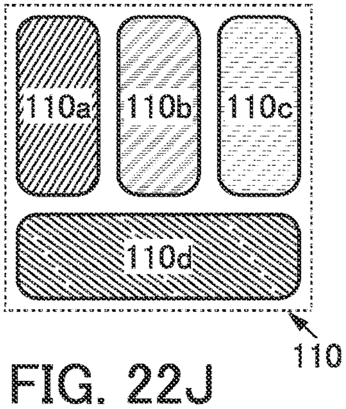
Figure 22H:
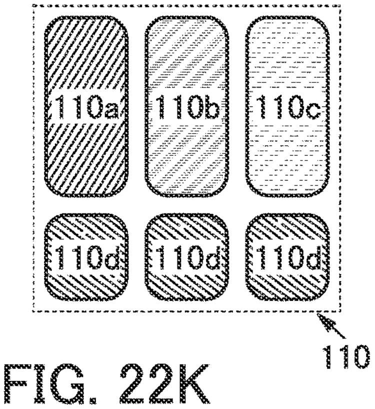

FIG. 22G and FIG. 22H each illustrate an example where one pixel 110 is composed of two rows and three columns.

The pixel 110 illustrated in FIG. 22G includes three subpixels (the subpixels 110*a*, 110*b*, and 110*c*) in the upper row (first row) and one subpixel (subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 22H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Matching the positions of the subpixels in the upper row and the lower row as illustrated in FIG. 22H enables dust and the like that would be produced in the manufacturing process to be removed efficiently. Thus, a display apparatus having high display quality can be provided.

Figure 22I:
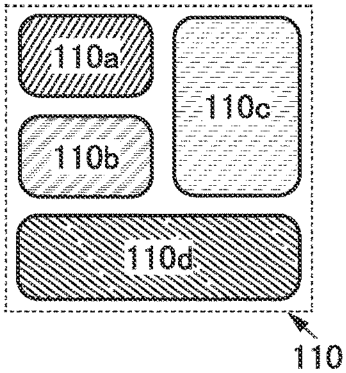

FIG. 22I illustrates an example where one pixel 110 is composed of three rows and two columns.

The pixel 110 illustrated in FIG. 22I includes the subpixel 110*a* in the upper row (first row), the subpixel 110*b* in the center row (second row), the subpixel 110*c* across the first row and the second row, and one subpixel (the subpixel 110*d*) in the lower row (third row). In other words, the pixel 110 includes the subpixels 110*a* and 110*b* in the left column (first column), the subpixel 110*c* in the right column (second column), and the subpixel 110*d* across these two columns.

The pixels 110 illustrated in FIG. 22A to FIG. 22I are each composed of the four subpixels 110*a*, 110*b*, 110*c*, and 110*d*.

The subpixels 110*a*, 110*b*, 110*c*, and 110*d* can include light-emitting devices that emit light of different colors. As the subpixels 110*a*, 110*b*, 110*c*, and 110*d*, subpixels of four colors of R, G, B, and white (W), subpixels of four colors of R, G, B, and Y, subpixels of R, G, B, and infrared light (IR), and the like can be given.

In each of the pixels 110 illustrated in FIG. 22A to FIG. 22I, it is preferable that the subpixel 110*a* be the subpixel R emitting red light, the subpixel 110*b* be the subpixel G emitting green light, the subpixel 110*c* be the subpixel B emitting blue light, and the subpixel 110*d* be any of a subpixel W emitting white light, a subpixel Y emitting yellow light, and a subpixel IR emitting near-infrared light, for example. In the case of such a structure, stripe arrangement is employed as the layout of R, G, and B in the pixel 110 illustrated in FIG. 22G and FIG. 22H, leading to higher display quality. In the pixel 110 illustrated in FIG. 22I, what is called S-stripe arrangement is employed as the layout of R, G, and B, leading to higher display quality.

The pixel 110 may include a subpixel including a light-receiving device.

In each of the pixels 110 illustrated in FIG. 22A to FIG. 22I, any one of the subpixel 110*a* to the subpixel 110*d* may be a subpixel including a light-receiving device.

In each of the pixels 110 illustrated in FIG. 22A to FIG. 22I, for example, it is preferable that the subpixel 110*a* be the subpixel R emitting red light, the subpixel 110*b* be the subpixel G emitting green light, the subpixel 110*c* be the subpixel B emitting blue light, and the subpixel 110*d* be a subpixel S including a light-receiving device. In the case of such a structure, stripe arrangement is employed as the layout of R, G, and B in the pixel 110 illustrated in FIG. 22G and FIG. 22H, leading to higher display quality. In the pixel 110 illustrated in FIG. 22I, what is called S-stripe arrangement is employed as the layout of R, G, and B, leading to higher display quality.

There is no particular limitation on the wavelength of light detected by the subpixel S including a light-receiving device. The subpixel S can have a structure in which one or both of infrared light and visible light can be detected.

Figure 22J:
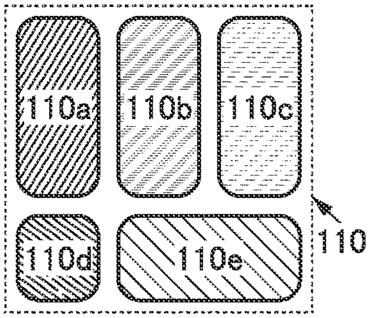
Figure 22K:
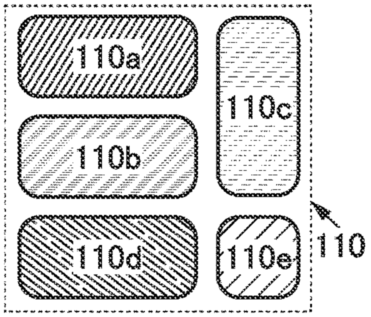

As illustrated in FIG. 22J and FIG. 22K, the pixel can include five types of subpixels.

FIG. 22J illustrates an example where one pixel 110 is composed of two rows and three columns.

The pixel 110 illustrated in FIG. 22J includes three subpixels (the subpixels 110*a*, 110*b*, and 110*c*) in the upper row (first row) and two subpixels (the subpixel 110*d* and a subpixel 110*e*) in the lower row (second row). In other words, the pixel 110 includes the subpixels 110*a* and 110*d* in the left column (first column), the subpixel 110*b* in the center column (second column), the subpixel 110*c* in the right column (third column), and the subpixel 110*e* across the second column and the third column.

FIG. 22K illustrates an example where one pixel 110 is composed of three rows and two columns.

The pixel 110 illustrated in FIG. 22K includes the subpixel 110*a* in the upper row (first row), the subpixel 110*b* in the center row (second row), the subpixel 110*c* across the first row and the second row, and two subpixels (the subpixels 110*d* and 110*e*) in the lower row (third row). In other words, the pixel 110 includes the subpixels 110*a*, 110*b*, and 110*d* in the left column (first column), and the subpixels 110*c* and 110*e* in the right column (second column).

In each of the pixels 110 illustrated in FIG. 22J and FIG. 22K, for example, it is preferable that the subpixel 110*a* be the subpixel R emitting red light, the subpixel 110*b* be the subpixel G emitting green light, and the subpixel 110*c* be the subpixel B emitting blue light. In the case of such a structure, stripe arrangement is employed as the layout of R, G, and B in the pixel 110 illustrated in FIG. 22J, leading to higher display quality. In addition, what is called S-stripe arrangement is employed as the layout of R, G, and B in the pixel 110 illustrated in FIG. 22K, leading to higher display quality.

In each of the pixels 110 illustrated in FIG. 22J and FIG. 22K, for example, it is preferable to use the subpixel S including a light-receiving device as at least one of the subpixel 110*d* and the subpixel 110*e*. In the case where light-receiving devices are used in both the subpixel 110*d* and the subpixel 110*e*, the light-receiving devices may have different structures. For example, the wavelength ranges of detected light may be different at least partly. Specifically, one of the subpixel 110*d* and the subpixel 110*e* may include a light-receiving device mainly detecting visible light and the other may include a light-receiving device mainly detecting infrared light.

In each of the pixels 110 illustrated in FIG. 22J and FIG. 22K, for example, it is preferable that the subpixel S including a light-receiving device be used as one of the subpixel 110*d* and the subpixel 110*e* and a subpixel including a light-emitting device that can be used as a light source be used as the other. For example, it is preferable that one of the subpixel 110*d* and the subpixel 110*e* be the subpixel IR emitting infrared light and the other be the subpixel S including a light-receiving device detecting infrared light.

In the pixel including the subpixels R, G, B, IR, and S, while displaying an image using the subpixels R, G, and B, reflected light of infrared light emitted by the subpixel IR that is used as a light source can be detected by the subpixel S.

As described above, the pixel composed of the subpixels each including the light-emitting device can employ any of a variety of layouts in the display apparatus of one embodiment of the present invention. The display apparatus of one embodiment of the present invention can have a structure in which the pixel includes both a light-emitting device and a light-receiving device. Also in this case, any of a variety of layouts can be employed.

This embodiment can be combined with any of the other embodiments as appropriate.

Embodiment 4

In this embodiment, display apparatuses of embodiments of the present invention are described with reference to FIG. 23 to FIG. 32.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display (HMD) and a glasses-type AR device.

The display apparatus in this embodiment can be a high-definition display apparatus or a large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Module]

Figure 23A:
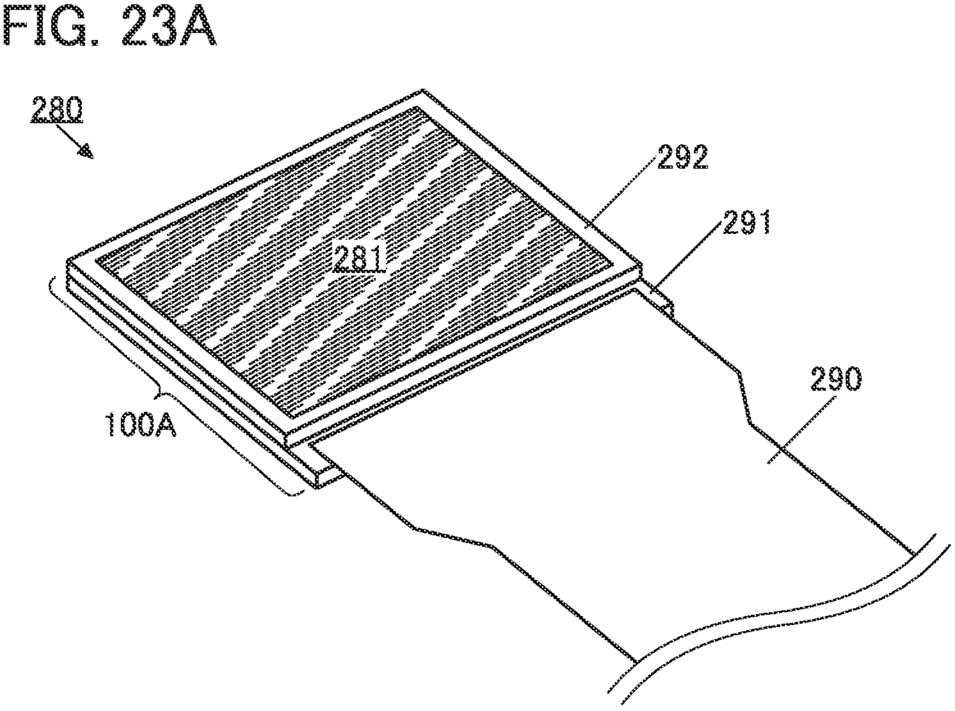
FIG. 23A and FIG. 23B are perspective views illustrating an example of an electronic device.

FIG. 23A is a perspective view of a display module 280. The display module 280 includes a display apparatus 100A and an FPC 290. Note that the display apparatus included in the display module 280 is not limited to the display apparatus 100A and may be any of display apparatus 100B to the display apparatus 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 23B:
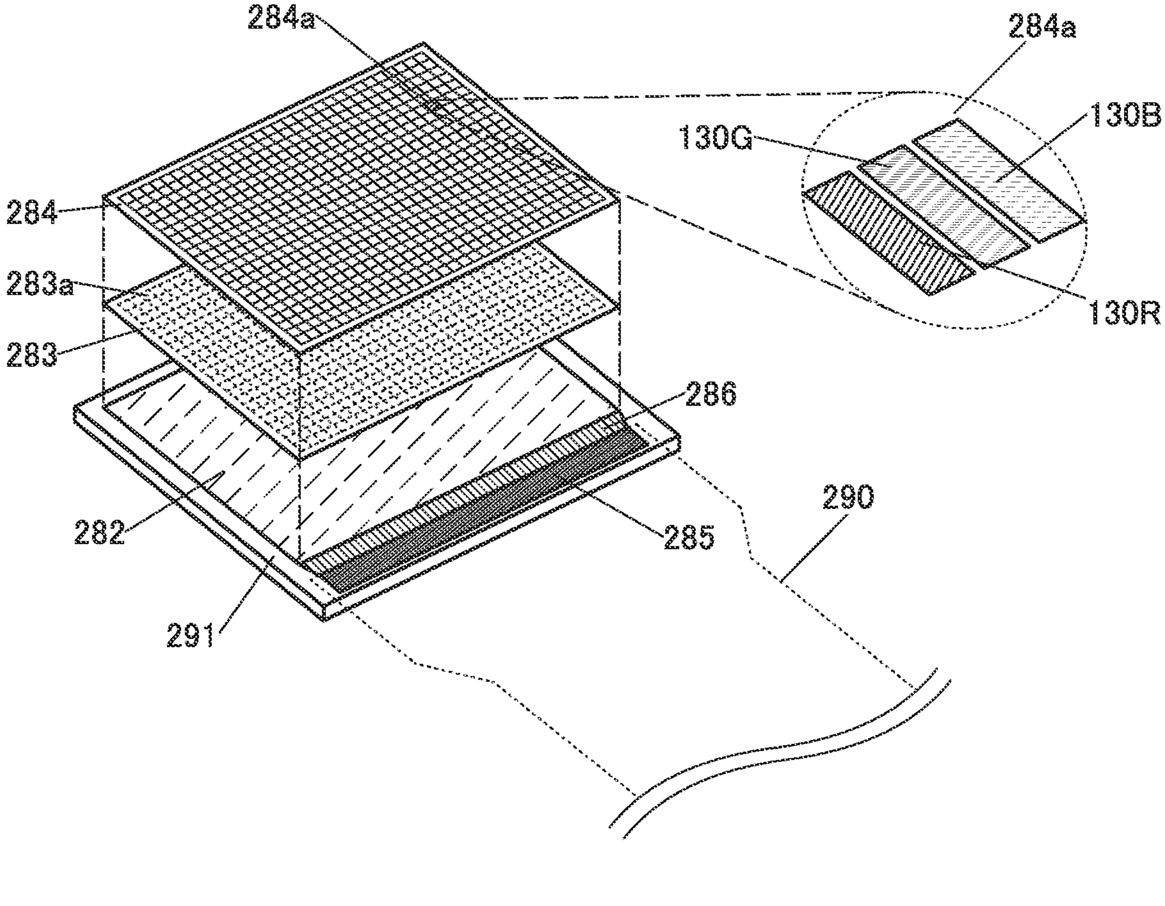

FIG. 23B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is provided in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 23B. The pixel 284*a* can employ any of the structures described in the above embodiments. FIG. 23B illustrates an example where a structure similar to that of the pixel 110 illustrated in FIG. 1A is employed.

The pixel circuit portion 283 includes a plurality of pixel circuits 283*a* arranged periodically.

One pixel circuit 283*a* is a circuit that controls driving of a plurality of elements included in one pixel 284*a*. One pixel circuit 283*a* can be provided with three circuits each of which controls light emission of one light-emitting device. For example, the pixel circuit 283*a* can include at least one selection transistor, one current control transistor (driving transistor), and a capacitor for one light-emitting device. In this case, agate signal is input to agate of the selection transistor, and a source signal is input to a source of the selection transistor. Thus, an active-matrix display apparatus is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284*a* can be arranged extremely densely and thus the display portion 281 can have greatly high resolution. For example, the pixels 284*a* are preferably arranged in the display portion 281 with a resolution greater than or equal to 2000 ppi, preferably greater than or equal to 3000 ppi, further preferably greater than or equal to 5000 ppi, and still further preferably greater than or equal to 6000 ppi, and less than or equal to 20000 ppi or less than or equal to 30000 ppi.

Such a display module 280 has extremely high resolution, and thus can be suitably used for a device for VR such as an HMD or a glasses-type device for AR. For example, even in the case of a structure in which the display portion of the display module 280 is perceived through a lens, pixels of the extremely-high-resolution display portion 281 included in the display module 280 are not perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device, such as a wrist watch.

[Display Apparatus 100A]

Figure 24A:
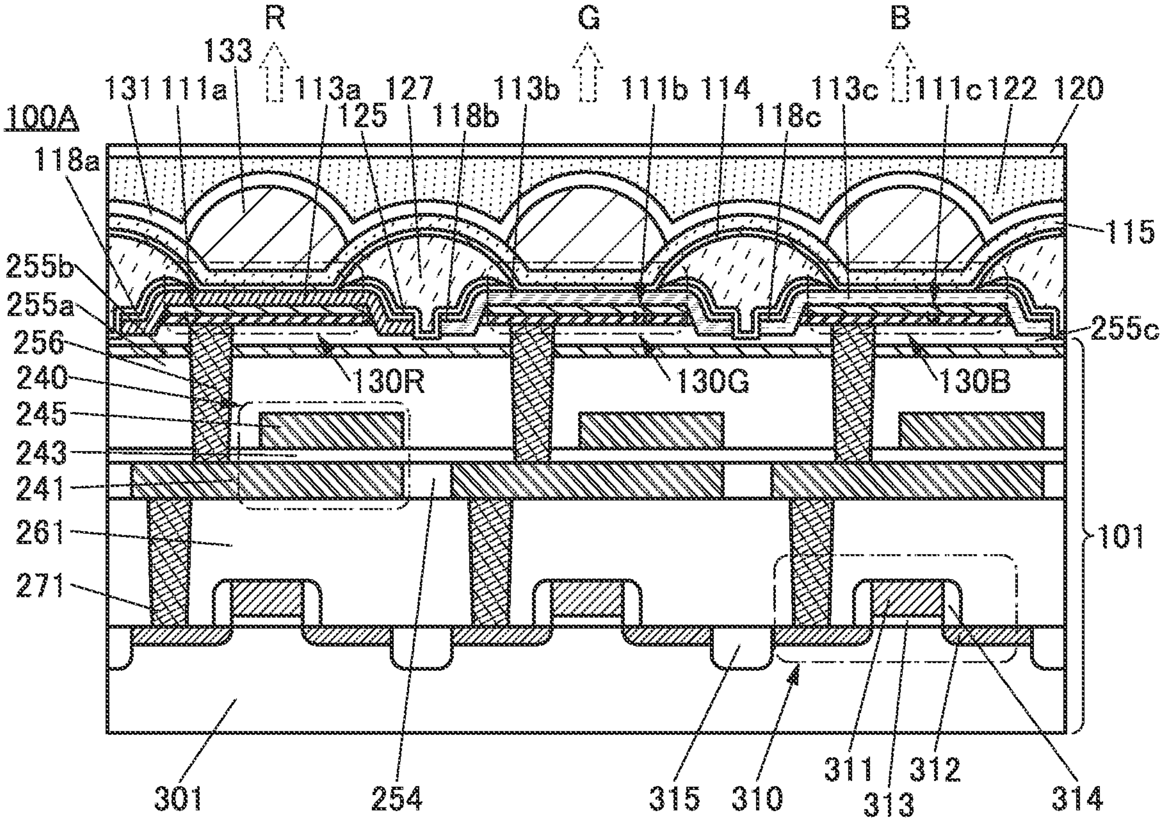
FIG. 24A and FIG. 24B are cross-sectional views each illustrating an example of a display apparatus.

The display apparatus 100A illustrated in FIG. 24A includes a substrate 301, a light-emitting device 130R, a light-emitting device 130G, a light-emitting device 130B, a capacitor 240, and a transistor 310.

The substrate 301 corresponds to the substrate 291 in FIG. 23A and FIG. 23B. A stacked-layer structure including the substrate 301 and the components thereover up to the insulating layer 255*c* corresponds to the layer 101 including transistors in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311 and functions as an insulating layer.

An element isolation layer 315 is provided between the two adjacent transistors 310 so as to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*. The light-emitting device 130R, the light-emitting device 130G, and the light-emitting device 130B are provided over the insulating layer 255*c*. FIG. 24A illustrates an example in which the light-emitting device 130R, the light-emitting device 130G, and the light-emitting device 130B each have a stacked-layer structure illustrated in FIG. 1B. An insulator is provided in a region between adjacent light-emitting devices. In FIG. 24A and the like, the insulating layer 125 and the insulating layer 127 over the insulating layer 125 are provided in the region.

The mask layer 118*a* is positioned over the first layer 113*a* included in the light-emitting device 130R, the mask layer 118*b* is positioned over the second layer 113*b* included in the light-emitting device 130G, and the mask layer 118*c* is positioned over the third layer 113*c* included in the light-emitting device 130B.

The pixel electrode 111*a*, the pixel electrode 111*b*, and the pixel electrode 111*c* are each electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 271 embedded in the insulating layer 261. The top surface of the insulating layer 255*c* and the top surface of the plug 256 are level with or substantially level with each other. Any of a variety of conductive materials can be used for the plugs. FIG. 24A and the like illustrate an example where the pixel electrode has a two-layer structure of a reflective electrode and a transparent electrode over the reflective electrode.

The lens 133 and the protective layer 131 are provided over the light-emitting device 130R, the light-emitting device 130G, and the light-emitting device 130B. The substrate 120 is bonded to the protective layer 131 with the resin layer 122. Embodiment 1 can be referred to for the details of the light-emitting devices and the components thereover up to the substrate 120. The substrate 120 corresponds to the substrate 292 in FIG. 23A.

Figure 24B:
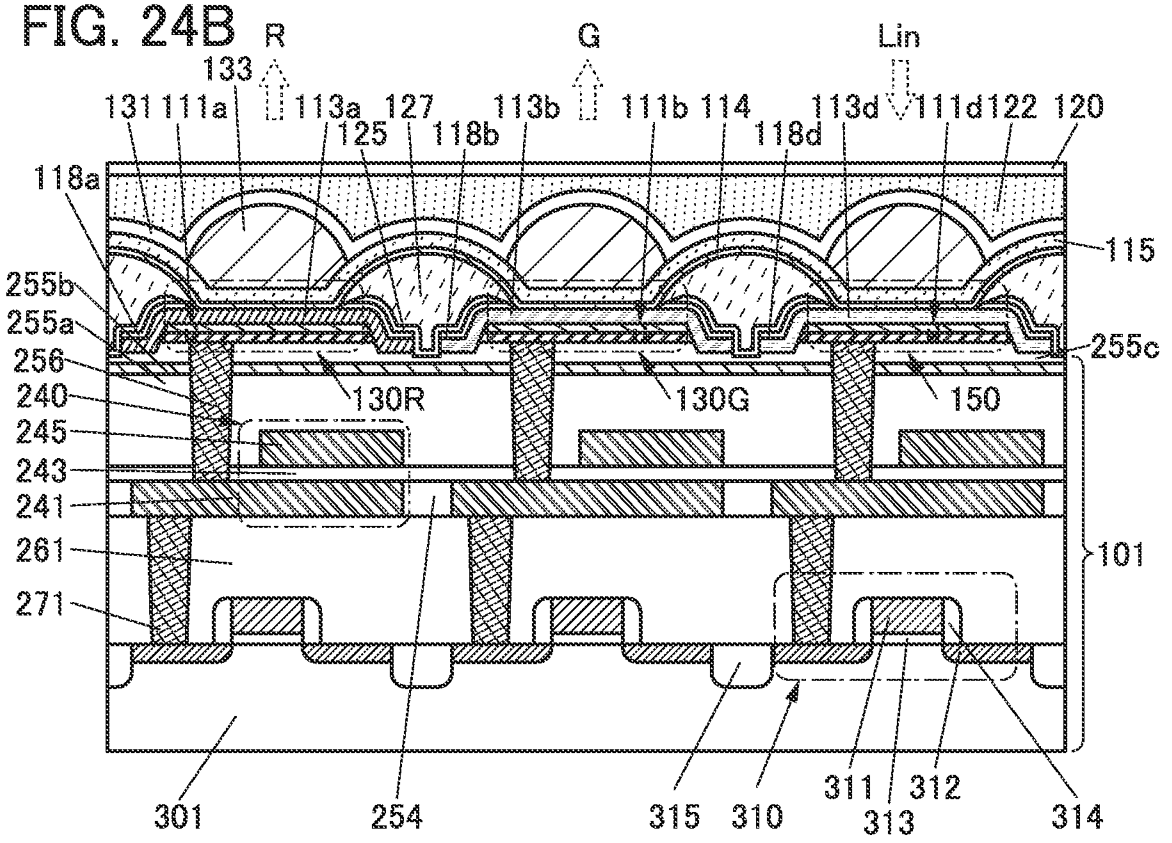

The display apparatus illustrated in FIG. 24B includes the light-emitting devices 130R and 130G and the light-receiving device 150. The light-receiving device 150 includes the pixel electrode 111*d*, the fourth layer 113*d*, the common layer 114, and the common electrode 115 which are stacked. Embodiment 1 and Embodiment 6 can be referred to for the details of the display apparatus including the light-receiving device.

[Display Apparatus 100B]

Figure 25:
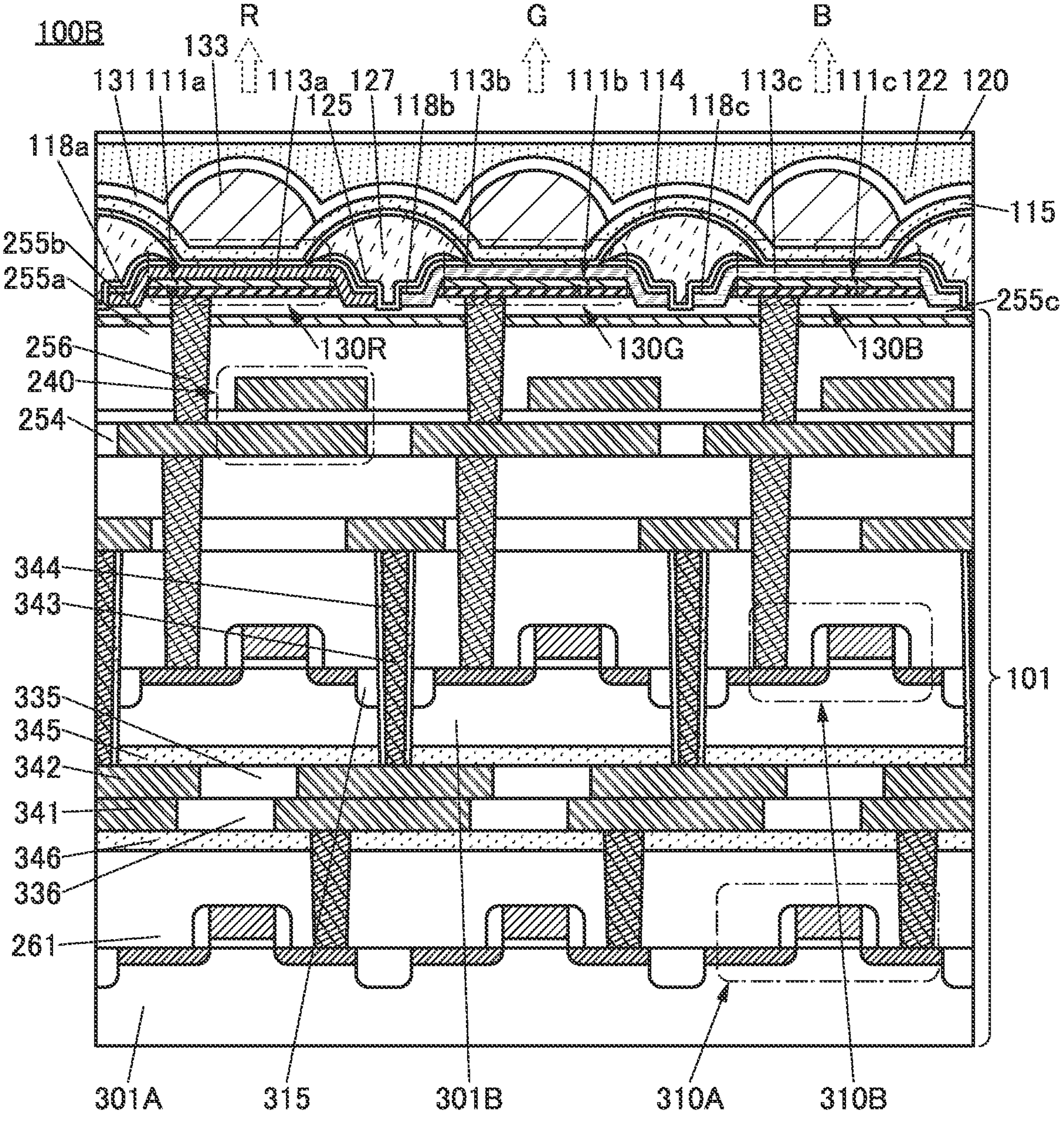
FIG. 25 is a cross-sectional view illustrating an example of a display apparatus.

The display apparatus 100B illustrated in FIG. 25 has a structure where a transistor 310A and a transistor 310B in each of which a channel is formed in a semiconductor substrate are stacked. Note that in the following description of display apparatuses, the description of portions similar to those of the above-described display apparatuses may be omitted.

In the display apparatus 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. For the insulating layers 345 and 346, an inorganic insulating film that can be used for an insulating layer 332 described later or the protective layer 131 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. For the insulating layer 344, an inorganic insulating film that can be used for the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in an insulating layer 336. The top surfaces of the conductive layer 341 and the insulating layer 336 are preferably planarized.

The conductive layer 341 and conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and conductive layer 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layer 341 and conductive layer 342. In this case, it is possible to employ Cu—Cu (copper-copper) direct bonding (a technique for achieving electrical continuity by connecting Cu (copper) pads).

[Display Apparatus 100C]

Figure 26:
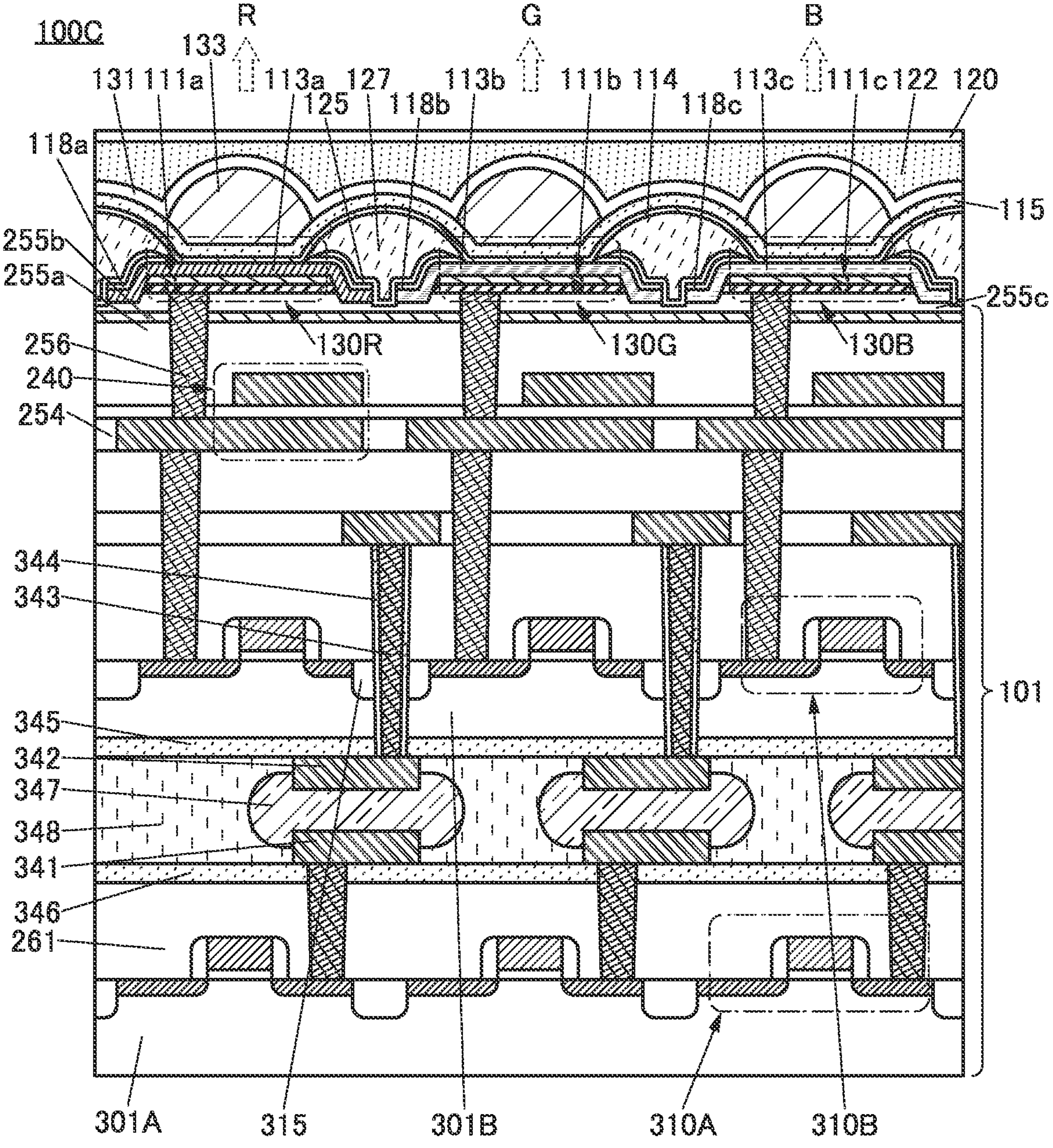
FIG. 26 is a cross-sectional view illustrating an example of a display apparatus.

In the display apparatus 100C illustrated in FIG. 26, the conductive layer 341 and conductive layer 342 are bonded to each other with a bump 347.

As illustrated in FIG. 26, providing the bump 347 between the conductive layer 341 and conductive layer 342 enables the conductive layer 341 and conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Apparatus 100D]

Figure 27:
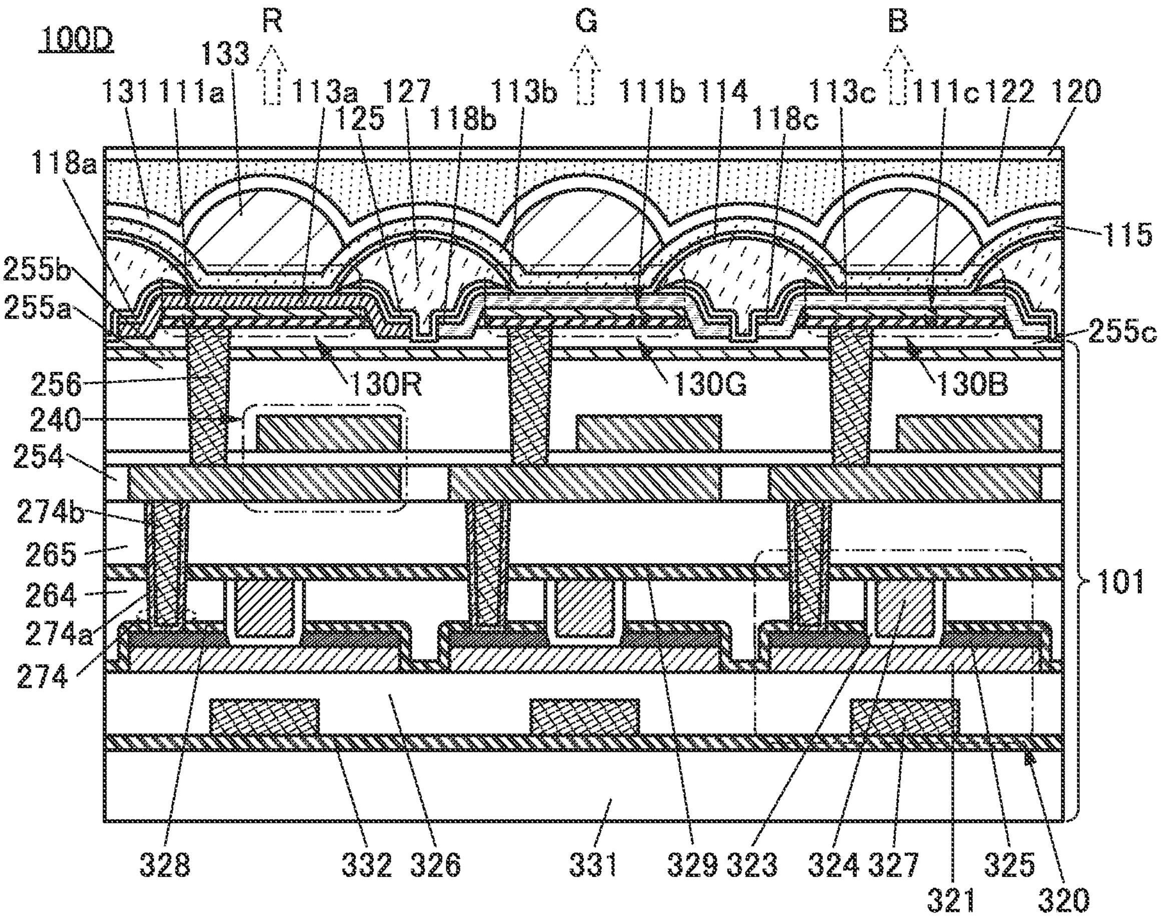
FIG. 27 is a cross-sectional view illustrating an example of a display apparatus.

The display apparatus 100D illustrated in FIG. 27 differs from the display apparatus 100A mainly in a structure of a transistor.

A transistor 320 is a transistor (OS transistor) that contains a metal oxide (also referred to as an oxide semiconductor) in its semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIG. 23A and FIG. 23B. A stacked-layer structure including the substrate 331 and the components thereover up to the insulating layer 255*c* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of an impurity such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 which is in contact with the semiconductor layer 321. The top surface of the insulating layer 326 is preferably planarized.

The semiconductor layer 321 is provided over the insulating layer 326. A metal oxide film having semiconductor characteristics (oxide semiconductor film) is preferably used as the semiconductor layer 321. The pair of conductive layers 325 are provided over and in contact with the semiconductor layer 321, and function as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of an impurity such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with side surfaces of the insulating layer 264 and the insulating layer 328 and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of an impurity such as water or hydrogen from the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer **274*a* that covers a side surface of an opening formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. For the conductive layer 274*a***, a conductive material in which hydrogen and oxygen are less likely to diffuse is preferably used.

[Display Apparatus 100E]

Figure 28:
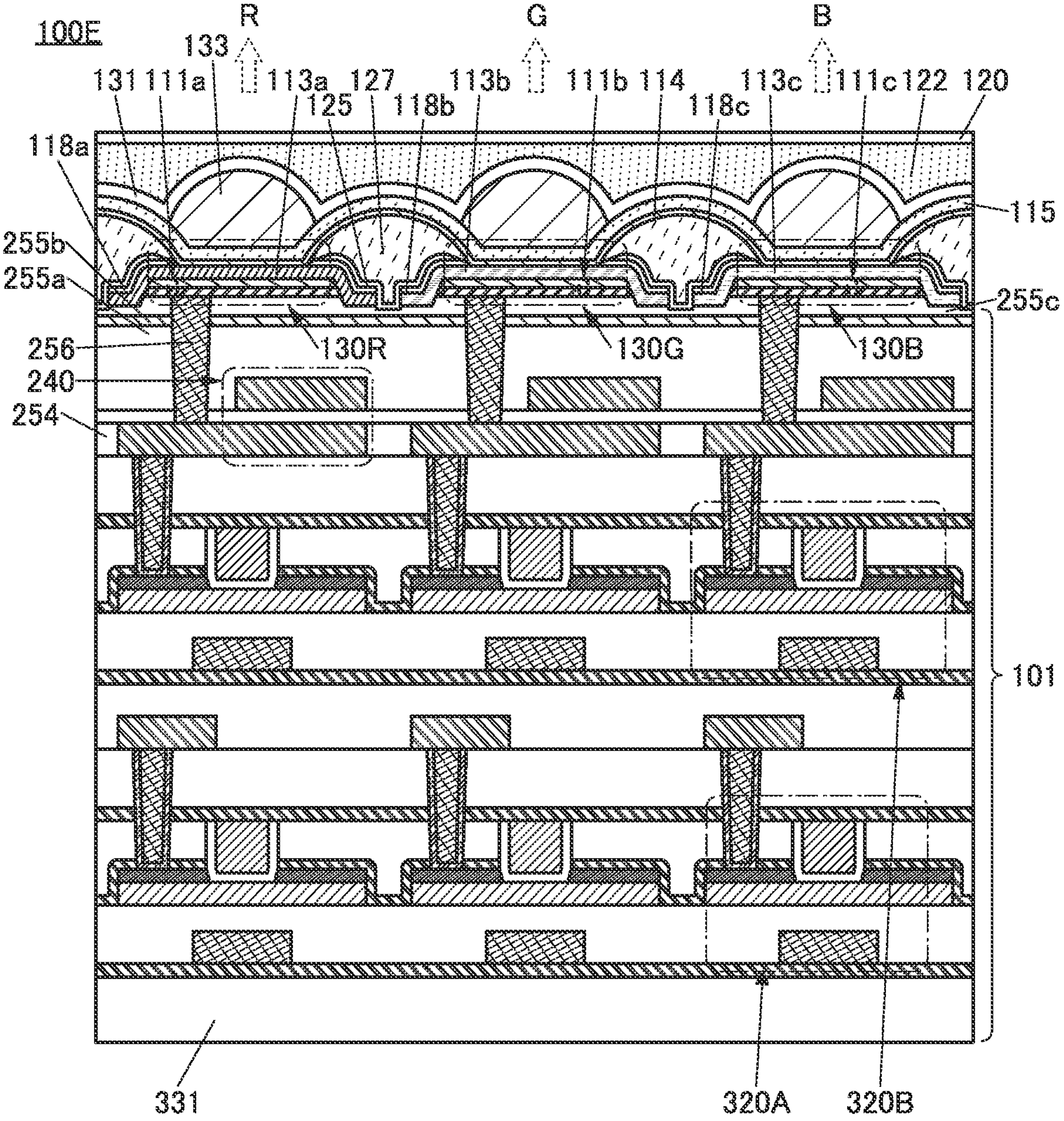
FIG. 28 is a cross-sectional view illustrating an example of a display apparatus.

The display apparatus 100E illustrated in FIG. 28 has a structure in which a transistor 320A and a transistor 320B each including an oxide semiconductor in a semiconductor where a channel is formed are stacked.

The description of the display apparatus 100D can be referred to for the transistor 320A, the transistor 320B, and the components around them.

Although the structure in which two transistors each including an oxide semiconductor are stacked is described here, one embodiment of the present invention is not limited thereto. For example, three or more transistors may be stacked.

[Display Apparatus 100F]

Figure 29:
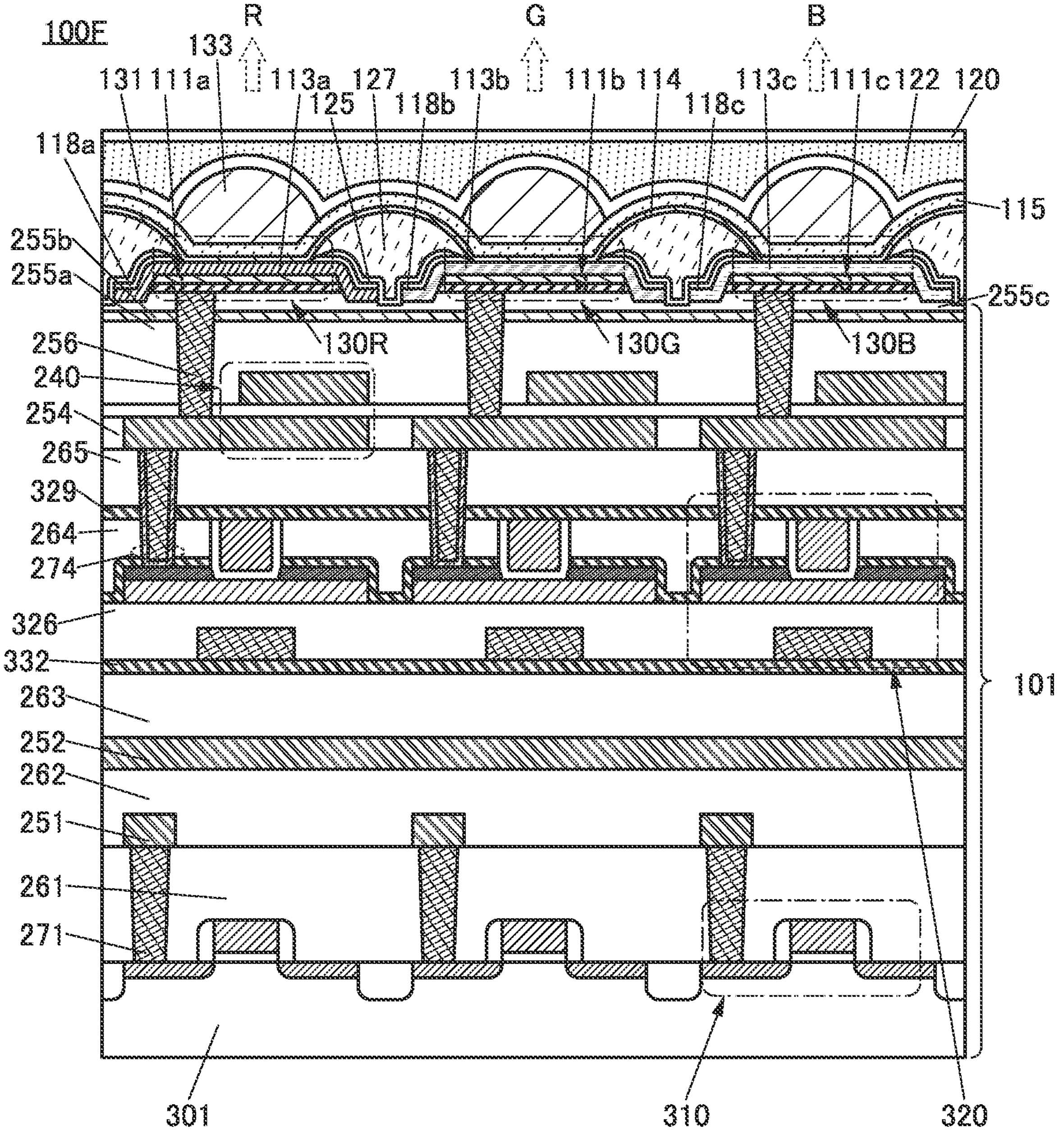
FIG. 29 is a cross-sectional view illustrating an example of a display apparatus.

In the display apparatus 100F illustrated in FIG. 29, the transistor 310 whose channel is formed in the substrate 301 and the transistor 320 containing a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting device; thus, the display apparatus can be downsized as compared with the case where the driver circuit is provided around a display region.

[Display Apparatus 100G]

Figure 30:
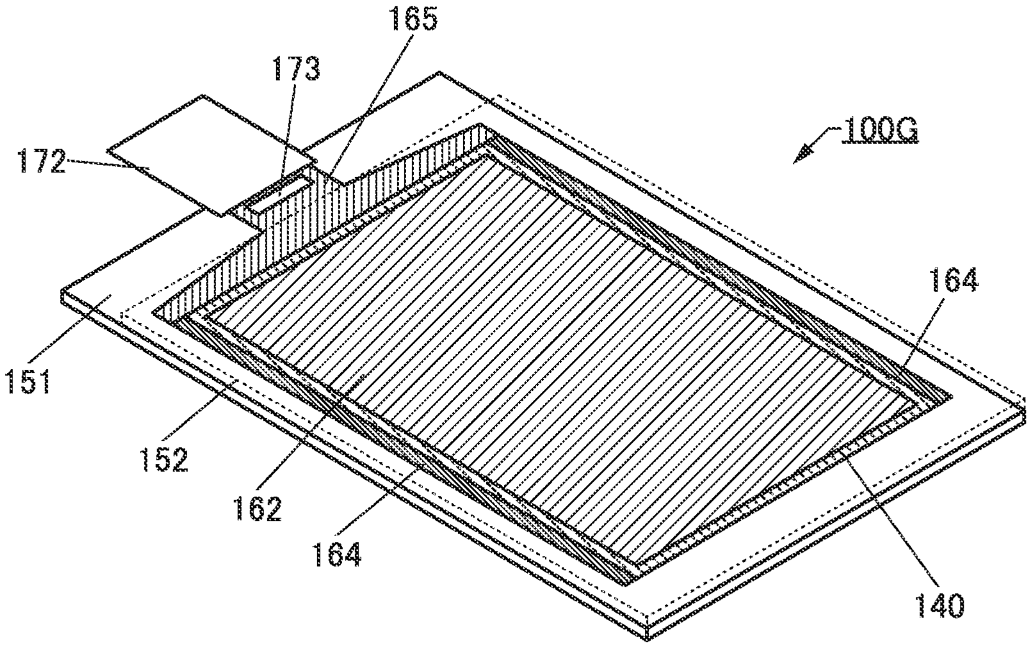
FIG. 30 is a perspective view illustrating an example of a display apparatus.
Figures 31A, 31B, 31C:
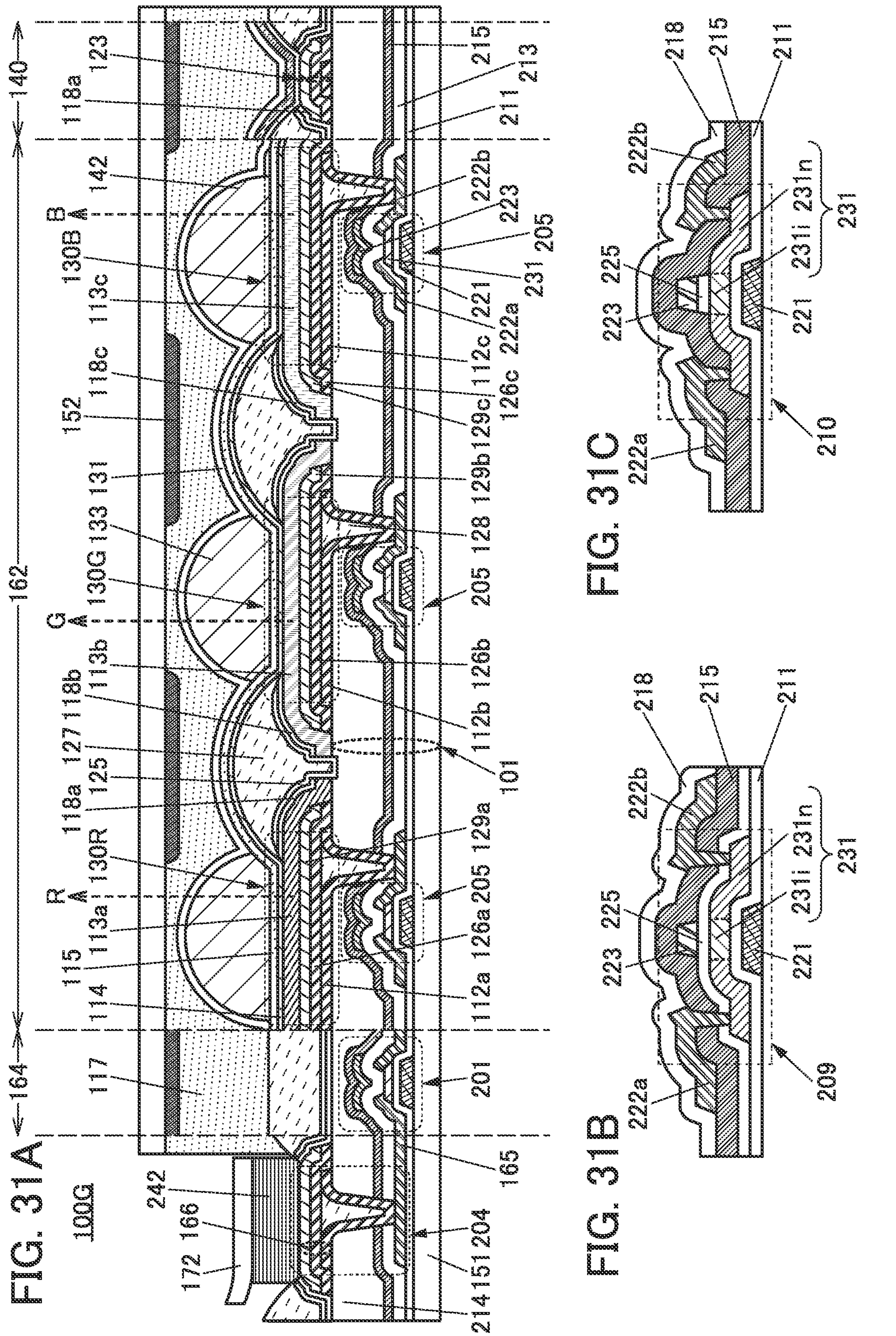
FIG. 31A is a cross-sectional view illustrating an example of a display apparatus.
FIG. 31B and FIG. 31C are cross-sectional views illustrating structure examples of transistors.

FIG. 30 is a perspective view of a display apparatus 100G, and FIG. 31A is a cross-sectional view of the display apparatus 100G.

In the display apparatus 100G, a substrate 152 and a substrate 151 are bonded to each other. In FIG. 30, the substrate 152 is indicated by a dashed line.

The display apparatus 100G includes a display portion 162, the connection portion 140, circuits 164, a wiring 165, and the like. FIG. 30 illustrates an example where an IC 173 and an FPC 172 are mounted on the display apparatus 100G. Thus, the structure illustrated in FIG. 30 can be regarded as a display module including the display apparatus 100G, the IC (integrated circuit), and the FPC.

The connection portion 140 is provided outside the display portion 162. The connection portion 140 can be provided along one or more sides of the display portion 162. The number of the connection portions 140 may be one or more. FIG. 30 illustrates an example where the connection portion 140 is provided to surround the four sides of the display portion. The common electrode of the light-emitting device is electrically connected to a conductive layer in the connection portion 140, and thus a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 30 illustrates an example where the IC 173 is provided over the substrate 151 by a COG (Chip On Glass)

method, a COF (Chip on Film) method, or the like. An IC including a scan line driver circuit, a signal line driver circuit, or the like can be used as the IC 173, for example. Note that the display apparatus 100G and the display module are not necessarily provided with an IC. The IC may be mounted on the FPC by a COF method or the like.

FIG. 31A illustrates an example of cross sections of part of a region including the FPC 172, part of the circuit 164, part of the display portion 162, part of the connection portion 140, and part of a region including an end portion of the display apparatus 100G.

The display apparatus 100G illustrated in FIG. 31A includes a transistor 201, a transistor 205, the light-emitting device 130R that emits red light, the light-emitting device 130G that emits green light, the light-emitting device 130B that emits blue light, and the like between the substrate 151 and the substrate 152.

The light-emitting devices 130R, 130G, and 130B each have the stacked-layer structure illustrated in FIG. 1B except the structure of the pixel electrode. Embodiment 1 can be referred to for the details of the light-emitting devices.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to the conductive layer 222*b* included in the transistor 205 through the opening provided in the insulating layer 214. An end portion of the conductive layer 126*a* is positioned outward from an end portion of the conductive layer 112*a*. The end portion of the conductive layer 126*a* and an end portion of the conductive layer 129*a* are aligned or substantially aligned with each other. A conductive layer functioning as a reflective electrode can be used as the conductive layer 112*a* and the conductive layer 126*a*, and a conductive layer functioning as a transparent electrode can be used as the conductive layer 129*a*, for example.

Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

Depression portions are formed in the conductive layers 112*a*, 112*b*, and 112*c* to cover the openings provided in the insulating layer 214. A layer 128 is embedded in the depression portion.

The layer 128 has a function of filling the depressed portions formed by the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material, particularly preferably formed using an organic insulating material. For the layer 128, an organic insulating material that can be used for the insulating layer 127 can be used, for example.

The top surfaces and the side surfaces of the conductive layers 126*a* and 129*a* are covered with the first layer 113*a*. Similarly, the top surfaces and the side surfaces of the conductive layers 126*b* and 129*b* are covered with the second layer 113*b*, and the top surfaces and the side surfaces of the conductive layers 126*c* and 129*c* are covered with the third layer 113*c*. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

The side surface and part of the top surface of each of the first layer 113*a*, the second layer 113*b*, and the third layer 113*c* are each covered with the insulating layers 125 and 127. The mask layer 118*a* is positioned between the first layer 113*a* and the insulating layer 125. The mask layer 118*b* is positioned between the second layer 113*b* and the insulating layer 125, and the mask layer 118*c* is positioned between the third layer 113*c* and the insulating layer 125. The common layer 114 is provided over the first layer 113*a*, the second layer 113*b*, the third layer 113*c*, and the insulating layers 125 and 127, and the common electrode 115 is provided over the common layer 114. The common layer 114 and the common electrode 115 are each one continuous film shared by a plurality of light-emitting devices.

The lens 133 and the protective layer 131 are provided over the light-emitting devices 130R, 130G, and 130B. The protective layer 131 and the substrate 152 are attached to each other with an adhesive layer 142. The substrate 152 is provided with a light-blocking layer 117. A solid sealing structure, a hollow sealing structure, or the like can be employed to seal the light-emitting devices. In FIG. 31A, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In this case, the adhesive layer 142 may be provided not to overlap with the light-emitting devices. Alternatively, the space may be filled with a resin other than the frame-like adhesive layer 142.

The conductive layer 123 is provided over the insulating layer 214 in the connection portion 140. An example is illustrated where the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the mask layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are directly and electrically connected to each other.

The display apparatus 100G has atop emission structure. Light emitted from the light-emitting devices is emitted toward the substrate 152. For the substrate 152, a material having a high visible-light-transmitting property is preferably used. The pixel electrode contains a material that reflects visible light, and the counter electrode (the common electrode 115) contains a material that transmits visible light.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be manufactured using the same materials in the same steps.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and improve the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating layer and an inorganic insulating layer. The outermost layer of the insulating layer 214 preferably has a function of an etching protective layer. Thus, the formation of a depressed portion in the insulating layer 214 can be inhibited in processing the conductive layer 112*a*, the conductive layer 126*a*, the conductive layer 129*a*, or the like. Alternatively, a depressed portion may be formed in the insulating layer 214 in processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is employed for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and supplying a potential for driving to the other of the two gates.

There is no particular limitation on the crystallinity of a semiconductor material used for the transistors, and any of an amorphous semiconductor and a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide (oxide semiconductor). That is, a transistor including a metal oxide in its channel formation region (hereinafter also referred to as an OS transistor) is preferably used in the display apparatus of this embodiment.

As the oxide semiconductor having crystallinity, a CAAC (c-axis aligned crystalline)-OS, an nc (nanocrystalline)-OS, and the like can be given.

Alternatively, a transistor containing silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to be driven at a high frequency (e.g., a source driver circuit) can be formed on the same substrate as the display portion. This allows simplification of an external circuit mounted on the display apparatus and a reduction in costs of parts and mounting costs.

The OS transistor has much higher field-effect mobility than a transistor containing amorphous silicon. In addition, the OS transistor has an extremely low leakage current flowing between a source and a drain in an off state (hereinafter also referred to as an off-state current), and charge accumulated in a capacitor that is connected in series to the transistor can be held for a long period. Furthermore, the power consumption of the display apparatus can be reduced with the OS transistor.

To increase the luminance of the light-emitting device included in the pixel circuit, the amount of a current fed through the light-emitting device needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Thus, with use of an OS transistor as a driving transistor included in the pixel circuit, the amount of a current flowing through the light-emitting device can be increased, resulting in an increase in emission luminance of the light-emitting device.

When transistors operate in a saturation region, a change in a source-drain current relative to a change in gate-source voltage can be smaller in an OS transistor than in a Si transistor. Accordingly, when an OS transistor is used as the driving transistor in the pixel circuit, a current flowing between the source and the drain can be set minutely in accordance with a change in gate-source voltage; hence, the amount of a current flowing through the light-emitting device can be controlled. Accordingly, the gray level in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case of describing an atomic ratio of In:Ga:Zn=4:2:3 or a composition in the neighborhood thereof, the case is included in which with the atomic ratio of In being 4, the atomic ratio of Ga is greater than or equal to 1 and less than or equal to 3 and the atomic ratio of Zn is greater than or equal to 2 and less than or equal to 4. In the case of describing an atomic ratio of In:Ga:Zn=5:1:6 or a composition in the neighborhood thereof, the case is included in which with the atomic ratio of In being 5, the atomic ratio of Ga is greater than 0.1 and less than or equal to 2 and the atomic ratio of Zn is greater than or equal to 5 and less than or equal to 7. In the case of describing an atomic ratio of In:Ga:Zn=1:1:1 or a composition in the neighborhood thereof, the case is included in which with the atomic ratio of In being 1, the atomic ratio of Ga is greater than 0.1 and less than or equal to 2 and the atomic ratio of Zn is greater than 0.1 and less than or equal to 2.

The transistors included in the circuit 164 and the transistors included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display apparatus can have low power consumption and high drive capability. Note that a structure in which the LTPS transistor and the OS transistor are combined is referred to as LTPO in some cases. Note that as a more preferable example, it is preferable to use an OS transistor as a transistor or the like functioning as a switch for controlling electrical continuity between wirings and an LTPS transistor as a transistor or the like for controlling a current.

For example, one transistor included in the display portion 162 may function as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of a current flowing through the light-emitting device can be increased in the pixel circuit.

By contrast, another transistor included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., lower than or equal to 1 fps); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MIL (metal maskless) structure. With this structure, the leakage current that might flow through the transistor and the leakage current that might flow between adjacent light-emitting devices (also referred to as a horizontal leakage current, a side leakage current, or the like) can become extremely low. With the structure, a viewer can observe any one or more of the image clearness, the image sharpness, a high chroma, and a high contrast ratio in an image displayed on the display apparatus. Note that when the leakage current that might flow through a transistor and the horizontal leakage current that might flow between light-emitting devices are extremely low, light leakage or the like (what is called black floating) that might occur in black display can be reduced as much as possible.

In particular, in the case where a light-emitting device having the MML structure employs the above-described SBS structure, a layer provided between light-emitting devices (for example, also referred to as an organic layer or a common layer which is commonly used between the light-emitting devices) is disconnected; accordingly, display with no or extremely small lateral leakage can be achieved.

FIG. 31B and FIG. 31C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between at least the conductive layer 223 and the channel formation region 231*i*. Furthermore, an insulating layer 218 covering the transistor may be provided.

FIG. 31B illustrates an example of the transistor 209 where the insulating layer 225 covers the top surface and the side surface of the semiconductor layer 231. The conductive layer 222*a* and the conductive layer 222*b* are connected to the corresponding low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 31C, the insulating layer 225 overlaps with the channel formation region 231*i* of the semiconductor layer 231 and does not overlap with the low-resistance regions 231*n*. The structure illustrated in FIG. 31C can be fabricated by processing the insulating layer 225 using the conductive layer 223 as a mask, for example. In FIG. 31C, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215.

A connection portion 204 is provided in a region of the substrate 151 not overlapping with the substrate 152. In the connection portion 204, the wiring 165 is electrically connected to the FPC 172 through the conductive layer 166 and a connection layer 242. An example is illustrated where the conductive layer 166 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. On the top surface of the connection portion 204, the conductive layer 166 is exposed. Thus, the connection portion 204 and the FPC 172 can be electrically connected to each other through the connection layer 242.

The light-blocking layer 117 is preferably provided on a surface of the substrate 152 on the substrate 151 side. The light-blocking layer 117 can be provided between adjacent light-emitting devices, in the connection portion 140, and in the circuit 164, for example. A variety of optical members can be arranged on the outer surface of the substrate 152.

A material that can be used for the substrate 120 can be used for each of the substrate 151 and the substrate 152.

A material that can be used for the resin layer 122 can be used for the adhesive layer 142.

As the connection layer 242, an anisotropic conductive film (ACF), an anisotropic conductive paste (ACP), or the like can be used.

[Display Apparatus 100J]

Figure 32:
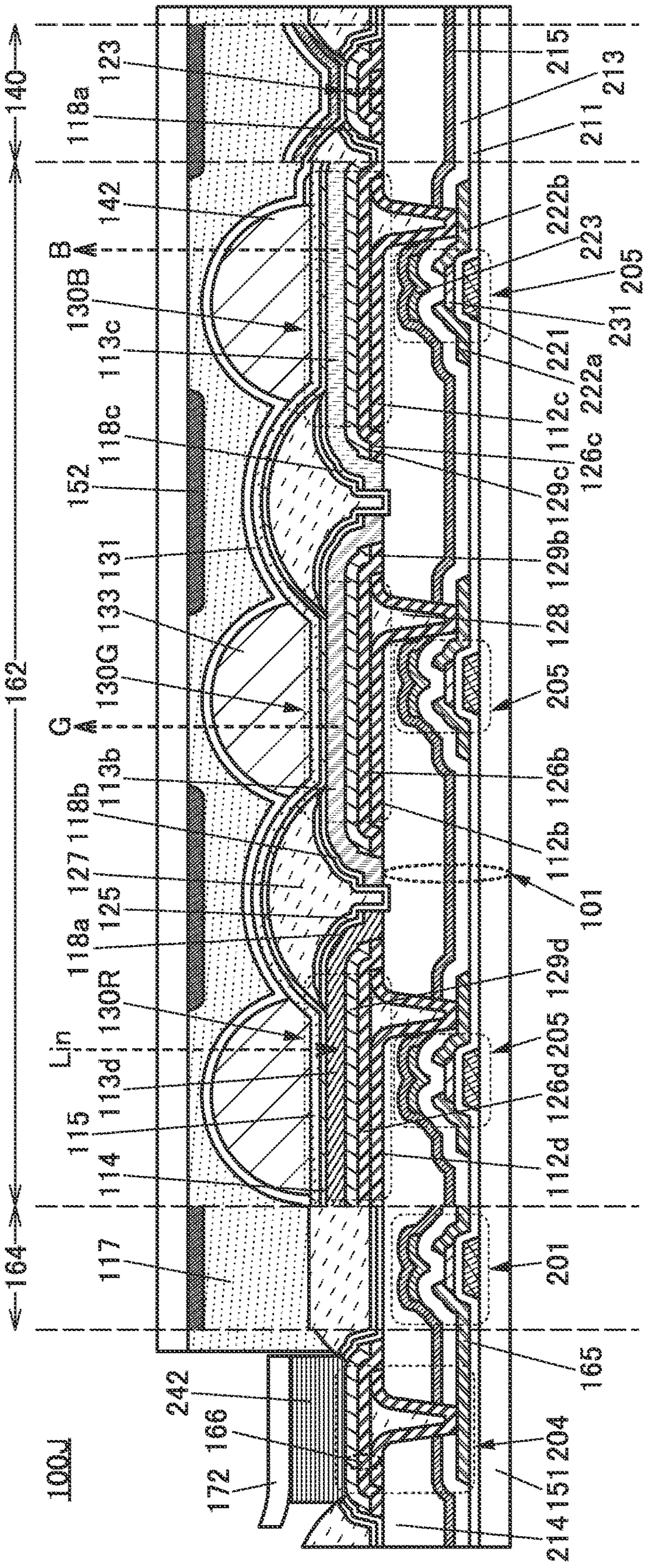
FIG. 32 is a cross-sectional view illustrating an example of a display apparatus.

A display apparatus 100J illustrated in FIG. 32 differs from the display apparatus 100G mainly in including the light-receiving device 150.

The light-receiving device 150 includes a conductive layer 112*d*, a conductive layer 126*d* over the conductive layer 112*d*, and a conductive layer 129*d* over the conductive layer 126*d*.

The conductive layer 112*d* is connected to the conductive layer 222*b* included in the transistor 205 through the opening provided in the insulating layer 214.

The top surface and a side surface of the conductive layer 126*d* and the top surface and a side surface of the conductive layer 129*d* are covered with the fourth layer 113*d*. The fourth layer 113*d* includes at least an active layer.

The side surface and part of the top surface of the fourth layer 113*d* is covered with the insulating layers 125 and 127. The mask layer 118*d* is positioned between the fourth layer 113*d* and the insulating layer 125. The common layer 114 is provided over the fourth layer 113*d* and the insulating layers 125 and 127, and the common electrode 115 is provided over the common layer 114. The common layer 114 is a continuous film shared by the light-receiving device and the light-emitting devices. The lens 133 is provided over the common electrode 115.

For example, the display apparatus 100J can employ the pixel layout described in Embodiment 3 with reference to FIG. 22A to FIG. 22K. Embodiment 1 and Embodiment 6 can be referred to for the details of the display apparatus including the light-receiving device.

This embodiment can be combined with any of the other embodiments as appropriate.

Embodiment 5

In this embodiment, a light-emitting device that can be used in the display apparatus of one embodiment of the present invention will be described.

In this specification and the like, a structure where light-emitting devices of different emission colors (e.g., blue (B), green (G), and red (R)) are separately formed is referred to as an SBS (Side By Side) structure in some cases.

The light-emitting device can emit infrared light or visible light (e.g., red, green, blue, cyan, magenta, yellow, or white). When the light-emitting device has a microcavity structure, the color purity can be further increased.

[Light-Emitting Device]

Figure 33A:
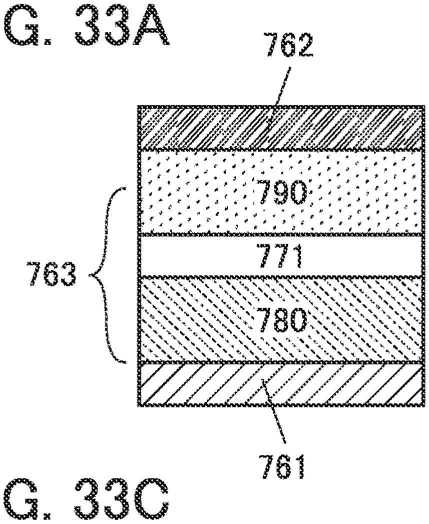
FIG. 33A to FIG. 33F are diagrams illustrating structure examples of a light-emitting device.

As illustrated in FIG. 33A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). The layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layer 780 and the layer 790 are replaced with each other.

The structure including the layer 780, the light-emitting layer 771, and the layer 790, which is provided between a pair of electrodes, can function as a single light-emitting unit, and the structure in FIG. 33A is referred to as a single structure in this specification.

Figure 33B:
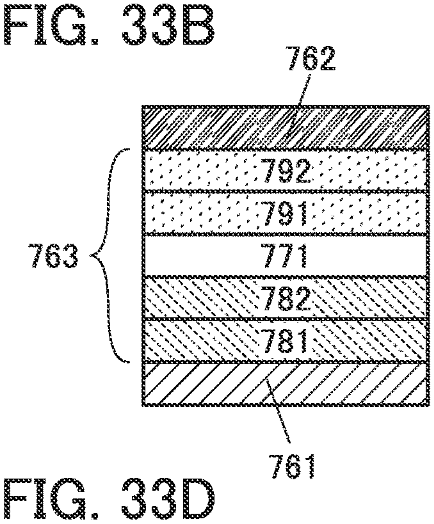

FIG. 33B is a variation example of the EL layer 763 included in the light-emitting device illustrated in FIG. 33A. Specifically, the light-emitting device illustrated in FIG. 33B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Figure 33C:
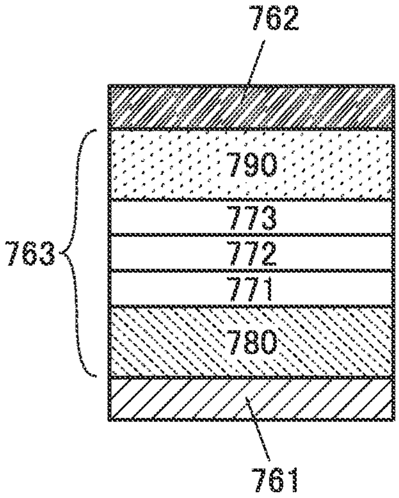
Figure 33D:
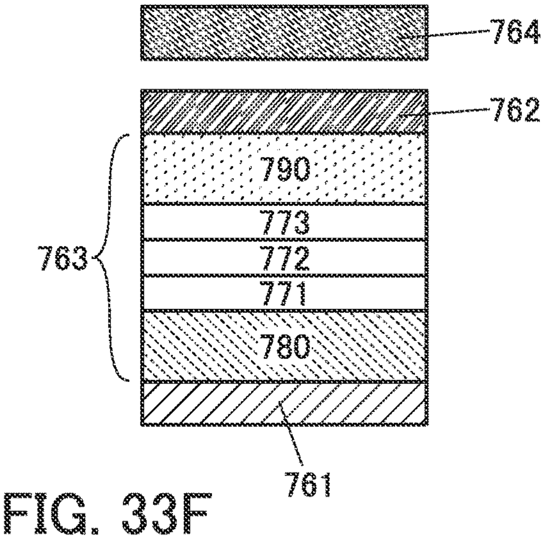

Note that structures in which a plurality of light-emitting layers (light-emitting layers 771, 772, and 773) are provided between the layer 780 and the layer 790 as illustrated in FIG. 33C and FIG. 33D are other variations of the single structure.

Figure 33E:
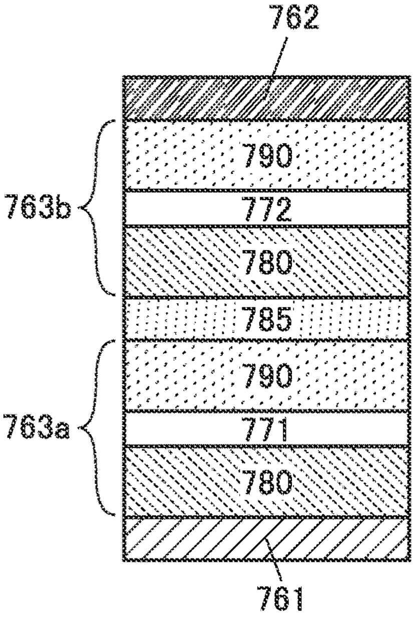
Figure 33F:
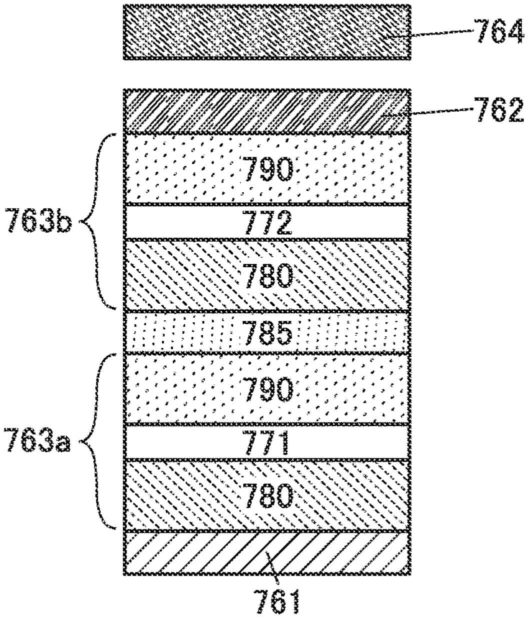

A structure where a plurality of light-emitting units (an EL layer 763*a* and an EL layer 763*b*) are connected in series with a charge-generation layer 785 therebetween as illustrated in FIG. 33E and FIG. 33F is referred to as a tandem structure in this specification. Note that a tandem structure may be referred to as a stack structure. The tandem structure enables a light-emitting device capable of high-luminance light emission.

In FIG. 33C to FIG. 33D, light-emitting substances emitting light of the same color or the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. A color conversion layer may be provided as a layer 764 illustrated in FIG. 33D.

Alternatively, light-emitting substances that emit light of different colors may be used for the light-emitting layer 771, the light-emitting layer 772, and the light-emitting layer 773. For example, to obtain white light emission by combining the emission colors of the light-emitting layer 771, the light-emitting layer 772, and the light-emitting layer 773, a light-emitting substance that emits red light, a light-emitting substance that emits blue light, and a light-emitting substance that emits green light can be used for the layers. A color filter (also referred to as a coloring layer) may be provided as the layer 764 illustrated in FIG. 33D. When white light passes through the color filter, light of a desired color can be obtained.

The light-emitting device that emits white light preferably contains two or more kinds of light-emitting substances. To obtain white light emission, two light-emitting substances may be selected such that their emission colors are complementary colors. For example, when an emission color of a first light-emitting layer and an emission color of a second light-emitting layer are complementary colors, the light-emitting device can emit white light as a whole. The same applies to a light-emitting device including three or more light-emitting layers.

In FIG. 33E and FIG. 33F, light-emitting substances emitting light of the same color or the same light-emitting substance may be used for the light-emitting layer 771 and the light-emitting layer 772. Alternatively, light-emitting substances emitting light of different colors may be used for the light-emitting layer 771 and the light-emitting layer 772. White light can be obtained when the light-emitting layer 771 and the light-emitting layer 772 emit light of complementary colors. FIG. 33F illustrates an example in which the layer 764 is further provided. One or both of a color conversion layer and a color filter (coloring layer) can be used as the layer 764.

Also in FIG. 33C, FIG. 33D, FIG. 33E, and FIG. 33F, each of the layer 780 and the layer 790 may independently have a stacked-layer structure of two or more layers as illustrated in FIG. 33B.

Next, materials that can be used for the light-emitting device will be described.

A conductive film transmitting visible light is used as the electrode through which light is extracted, which is either the lower electrode 761 or the upper electrode 762. A conductive film reflecting visible light is preferably used as the electrode through which light is not extracted. In the case where a display apparatus includes a light-emitting device emitting infrared light, a conductive film transmitting visible light and infrared light is used as the electrode through which light is extracted, and a conductive film reflecting visible light and infrared light is preferably used as the electrode through which light is not extracted.

A conductive film transmitting visible light may be used also for the electrode through which light is not extracted. In this case, this electrode is preferably provided between the reflective layer and the EL layer 763. In other words, light emitted from the EL layer 763 may be reflected by the reflective layer to be extracted from the display apparatus.

As a material that forms the pair of electrodes of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device preferably includes an electrode having properties of transmitting and reflecting visible light (a transflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a visible-light-transmitting property (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1\times10^{-2}$ Ωcm.

Either a low molecular compound or a high molecular compound can be used in the light-emitting device, and an inorganic compound may be included. Each layer included in the light-emitting device can be formed, for example, by an evaporation method (including a vacuum evaporation method), a transfer method, a printing method, an inkjet method, or a coating method.

The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As the one or more kinds of organic compounds, one or both of a substance having a high hole-transport property (a hole-transport material) and a substance having a high electron-transport property (an electron-transport material) can be used. Alternatively, as the one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 763 may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

The hole-injection layer is a layer injecting holes from the anode to the hole-transport layer, and a layer containing a material with a high hole-injection property. Examples of a material with a high hole-injection property include an aromatic amine compound and a composite material containing a hole-transport material and an acceptor material (electron-accepting material).

As the hole-transport material, it is possible to use a material with a high hole-transport property which can be used for the hole-transport layer and will be described later.

As the acceptor material, an oxide of a metal belonging to any of Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is especially preferable because it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can also be used. As the material with a high hole-injection property, a mixed material in which an oxide of a metal belonging to any of Group 4 to Group 8 of the periodic table (typically, a molybdenum oxide) and an organic material are mixed may be used.

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $10^{-6}$ $cm^2/Vs$ is preferable. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer is a layer transporting electrons, which are injected from the cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as the substances have an electron-transport property higher than a hole-transport property. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The hole-blocking layer is provided in contact with the light-emitting layer. The hole-blocking layer is a layer having an electron-transport property and containing a material that can block holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer is a layer injecting electrons from the cathode to the electron-transport layer and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

The difference between the LUMO level of the material having a high electron-injection property and the work function value of the material used for the cathode is preferably small (specifically, smaller than or equal to 0.5 eV).

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

In the case of manufacturing a light-emitting device having a tandem structure, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (electron-accepting material) can be used. For the charge-generation layer, a layer containing an electron-transport material and a donor material can be used. Forming such a charge-generation layer can inhibit an increase in the driving voltage in the case of stacking light-emitting units.

This embodiment can be combined with any of the other embodiments as appropriate.

Embodiment 6

In this embodiment, a light-receiving device that can be used for a display apparatus of one embodiment of the present invention, and a display apparatus having a light-emitting and light-receiving function will be described.

As the light-receiving device, a pn photodiode or a pin photodiode can be used, for example. It is particularly preferable to use an organic photodiode including a layer containing an organic compound as the light-receiving device.

[Light-Receiving Device]

Figure 34A:
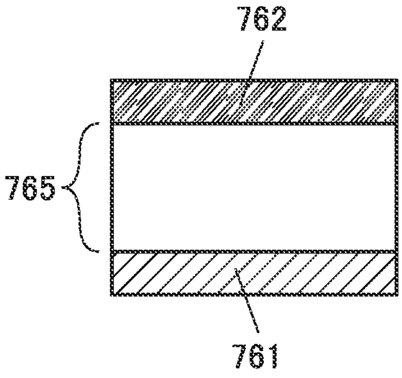
FIG. 34A and FIG. 34B are diagrams illustrating structure examples of a light-receiving device.

As illustrated in FIG. 34A, the light-receiving device includes a layer 765 between a pair of electrodes (the lower electrode 761 and the upper electrode 762). The layer 765 includes at least one active layer, and may further include another layer.

Figure 34B:
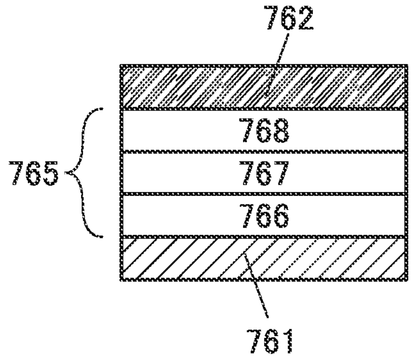

FIG. 34B is a variation example of the layer 765 included in the light-receiving device illustrated in FIG. 34A. Specifically, the light-receiving device illustrated in FIG. 34B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the structures of the layer 766 and the layer 768 are replaced with each other.

Here, the display apparatus of one embodiment of the present invention may include a layer shared by the light-receiving device and the light-emitting device (also referred to as a continuous layer included in the light-receiving device and the light-emitting device). Such a layer may have different functions in the light-emitting device and the light-receiving device in some cases. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-receiving device and the light-emitting device. The hole-transport layer functions as a hole-transport layer in both the light-emitting device and the light-receiving device, and the electron-transport layer functions as an electron-transport layer in both the light-emitting device and the light-receiving device.

Next, materials that can be used for the light-receiving device will be described.

Either a low molecular compound or a high molecular compound can be used for the light-receiving device, and an inorganic compound may also be contained. Each layer included in the light-receiving device can be formed, for example, by an evaporation method (including a vacuum evaporation method), a transfer method, a printing method, an inkjet method, or a coating method.

The active layer included in the light-receiving device contains a semiconductor. Examples of the semiconductor include an inorganic semiconductor such as silicon and an organic semiconductor including an organic compound. This embodiment describes an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Examples of fullerene derivatives include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di [1,4]methanonaphthaleno[1,2:2',3',56,60:2",3" ][5,6]fullerene-C60 (abbreviation: ICBA).

Examples of the n-type semiconductor material include perylenetetracarboxylic acid derivatives such as N,N-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene) dimalononitrile (abbreviation: FT2TDMN).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer is preferably formed by co-evaporation of an n-type semiconductor and a p-type semiconductor. Alternatively, the active layer may be formed by stacking an n-type semiconductor and a p-type semiconductor.

Three or more kinds of materials may be mixed for the active layer. A third material may be mixed with an n-type semiconductor material and a p-type semiconductor material in order to extend the absorption wavelength range. In this case, the third material may be a low molecular compound or a high molecular compound.

In addition to the active layer, the light-receiving device may further include a layer containing a substance having a high hole-transport property, a substance having a high electron-transport property, a substance having a bipolar property (a substance having a high electron- and hole-transport property), or the like. Without limitation to the above, the light-receiving device may further include a layer containing any of a substance with a high hole-injection property, a hole-blocking material, a material with a high electron-injection property, an electron-blocking material, and the like. Layers other than the active layer in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (abbreviation: PEDOT/PSS), or an inorganic compound such as a molybdenum oxide or copper iodide (CuI) can be used. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

[Display Apparatus Having Light Detection Function]

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light at the display portion, an image can be captured or the approach or contact of an object (e.g., a finger, a hand, or a stylus) can be detected.

Furthermore, in the display apparatus of one embodiment of the present invention, the light-emitting devices can be used as a light source of the sensor. In the display apparatus of one embodiment of the present invention, when an object reflects (or scatters) light emitted from the light-emitting device included in the display portion, the light-receiving device can detect the reflected light (or the scattered light); thus, image capturing or touch detecting is possible even in a dark place.

Accordingly, a light-receiving portion and a light source do not need to be provided separately from the display apparatus; hence, the number of components of an electronic device can be reduced. For example, a biometric authentication device provided in the electronic device, a capacitive touch panel for scroll operation, or the like is not necessarily provided separately. Thus, with the use of the display apparatus of one embodiment of the present invention, the electronic device can be provided at lower manufacturing costs.

Specifically, the display apparatus of one embodiment of the present invention includes a light-emitting device and a light-receiving device in a pixel. In the display apparatus of one embodiment of the present invention, organic EL devices are used as the light-emitting devices, and organic photodiodes are used as the light-receiving devices. The organic EL device and the organic photodiode can be formed over one substrate. Thus, the organic photodiode can be incorporated in the display apparatus including the organic EL device.

In the display apparatus including a light-emitting device and a light-receiving device in a pixel, the pixel has a light-receiving function; thus, the display apparatus can detect a contact or approach of an object while displaying an image. For example, an image can be displayed by using all the subpixels included in a display apparatus; or light can be emitted by some of the subpixels as a light source, and an image can be displayed by using the remaining subpixels.

When the light-receiving device is used as an image sensor, the display apparatus can capture an image with the use of the light-receiving device. For example, the display apparatus of this embodiment can be used as a scanner.

For example, image capturing for personal authentication with the use of a fingerprint, a palm print, the iris, the shape of a blood vessel (including the shape of a vein and the shape of an artery), a face, or the like is possible by using the image sensor.

For example, an image of the periphery of an eye, the surface of the eye, or the inside (fundus or the like) of the eye of a user of a wearable device can be captured with the use of the image sensor. Therefore, the wearable device can have a function of detecting one or more selected from blinking, movement of an iris, and movement of an eyelid of the user.

Moreover, the light-receiving device can be used in a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect an approach or contact of an object (e.g., a finger, a hand, or a stylus).

The touch sensor can detect the object when the display apparatus and the object come in direct contact with each other. Furthermore, the near touch sensor can detect the object even when the object is not in contact with the display apparatus. For example, the display apparatus is preferably capable of detecting an object when the distance between the display apparatus and the object is greater than or equal to 0.1 mm and less than or equal to 300 mm, preferably greater than or equal to 3 mm and less than or equal to 50 mm. This structure enables the display apparatus to be operated without direct contact of an object; in other words, the display apparatus can be operated in a contactless (touchless) manner. With the above-described structure, the display apparatus can be operated with a reduced risk of being dirty or damaged, or can be operated without the object directly touching a dirt (e.g., dust, or a virus) attached to the display apparatus.

The refresh rate of the display apparatus of one embodiment of the present invention can be variable. For example, the refresh rate is adjusted (in the range from 1 Hz to 240 Hz, for example) in accordance with contents displayed on the display apparatus, whereby power consumption can be reduced. The driving frequency of the touch sensor or the near touch sensor may be changed in accordance with the refresh rate. In the case where the refresh rate of the display apparatus is 120 Hz, for example, the driving frequency of a touch sensor or a near touch sensor can be higher than 120 Hz (typically 240 Hz). With this structure, low power consumption can be achieved, and the response speed of the touch sensor or the near touch sensor can be increased.

In the display apparatus of one embodiment of the present invention, a lens can be provided over the light-receiving device. The lens having a larger diameter than an effective area of a light-receiving portion can improve light condensing capability, and accordingly the light-receiving device can have improved sensitivity to light.

Figure 34C:
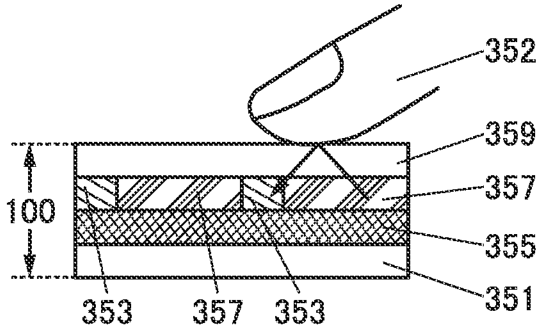
FIG. 34C to FIG. 34E are diagrams illustrating structure examples of a display apparatus.
Figure 34D:
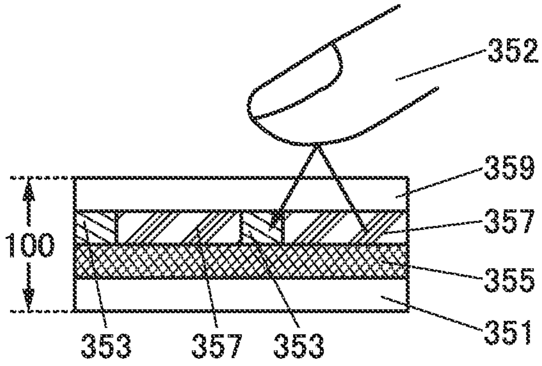
Figure 34E:
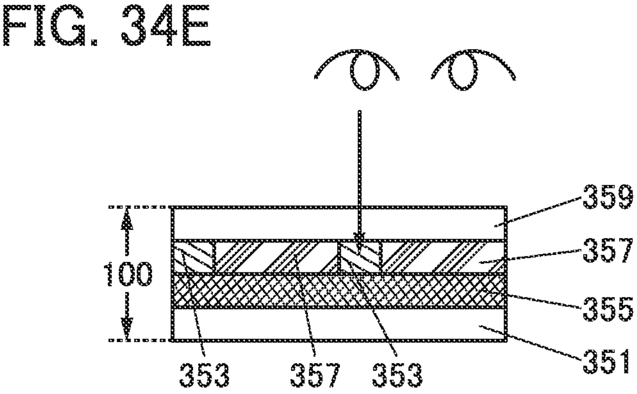

The display apparatus 100 illustrated in FIG. 34C to FIG. 34E includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch or a transistor may be employed.

For example, after light emitted from the light-emitting device in the layer 357 including light-emitting devices is reflected by a finger 352 that touches the display apparatus 100 as illustrated in FIG. 34C, the light-receiving device in the layer 353 including light-receiving devices detects the reflected light. Thus, the touch of the finger 352 on the display apparatus 100 can be detected.

The display apparatus may have a function of detecting an object that is approaching (but is not touching) the display apparatus or capturing an image of such an object, as illustrated in FIG. 34D and FIG. 34E. FIG. 34D illustrates an example where a human finger is detected, and FIG. 34E illustrates an example where information on the periphery, surface, or inside of the human eye (e.g., the number of blinks, the movement of an eyeball, and the movement of an eyelid) is detected.

This embodiment can be combined with any of the other embodiments as appropriate.

Embodiment 7

In this embodiment, electronic devices of embodiments of the present invention will be described with reference to FIG. 35 to FIG. 37.

Electronic devices of this embodiment are each provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have a high resolution, and thus can be favorably used for an electronic device having a relatively small display portion. Examples of such an electronic device include wristwatch-type and bracelet-type information terminal devices (wearable devices); a wearable device that can be worn on a head, such as a device for VR such as a head-mounted display, a glasses-type device for AR, or a device for MR; and the like.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. Furthermore, the pixel density (resolution) of the display apparatus of one embodiment of the present invention is preferably higher than or equal to 100 ppi, further preferably higher than or equal to 300 ppi, still further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the use of such a display apparatus with one or both of high resolution and high definition, an electronic device for personal use such as portable use or home use can have higher realistic sensation, sense of depth, and the like. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 35A to FIG. 35D. The wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a high sense of immersion.

Figure 35A:
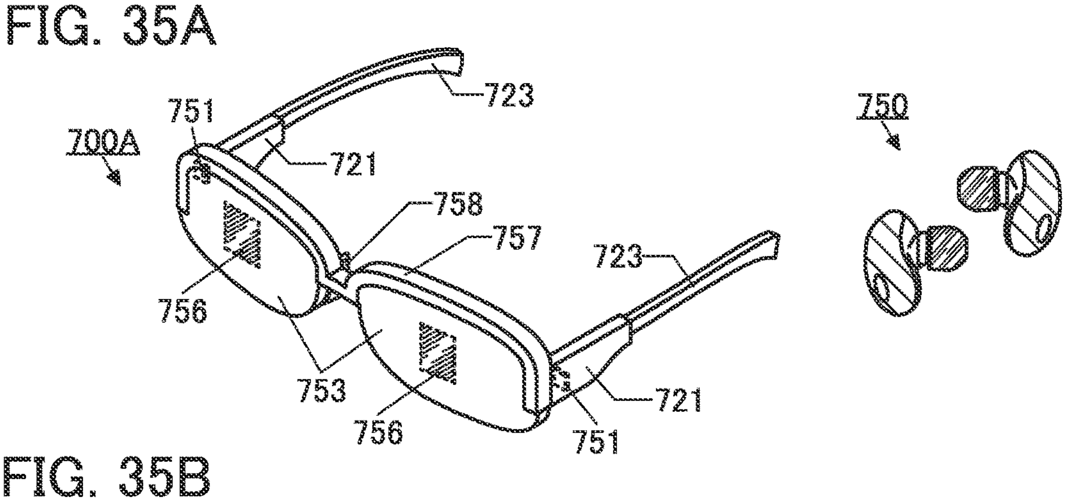
FIG. 35A to FIG. 35D are diagrams illustrating examples of electronic devices.
Figure 35B:
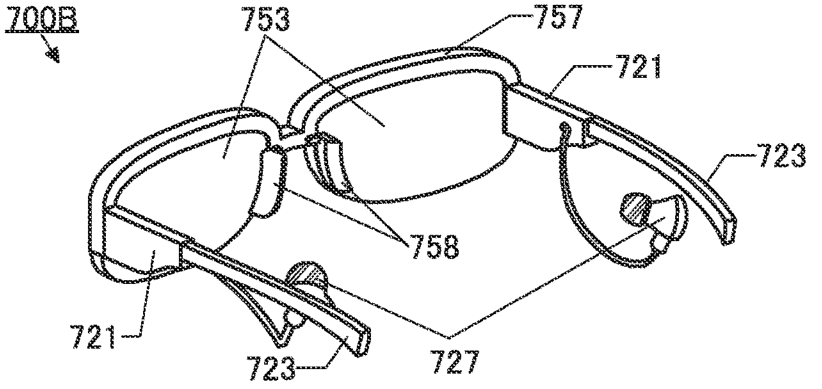

An electronic device 700A illustrated in FIG. 35A and an electronic device 700B illustrated in FIG. 35B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices are capable of performing ultrahigh-resolution display. In the display apparatus of one embodiment of the present invention, light emitted from the light-emitting portion is extracted through a lens; thus, high light extraction efficiency can be achieved and an extremely bright image can be displayed. Thus, in the case where the display apparatus of one embodiment of the present invention is used as an electronic device capable of AR display, even when external light is intense, an image with high visibility can be displayed.

In the case where the display apparatus includes a light-receiving device, iris authentication can be performed by capturing an image of eyes with the light-receiving device. In addition, eye tracking can also be performed with the light-receiving device. With eye tracking, an object or location at which a user looks can be specified, so that selection of the functions of the electronic device, execution of software, and the like can be performed.

The electronic device 700A and the electronic device 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. When the touch sensor module is provided in each of the two housings 721, the range of the operation can be increased.

Various touch sensors can be applied to the touch sensor module. For example, any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (photoelectric conversion element) can be used as a light-receiving device. One or both of an inorganic semiconductor and an organic semiconductor can be used for an active layer of the photoelectric conversion device.

Figure 35C:
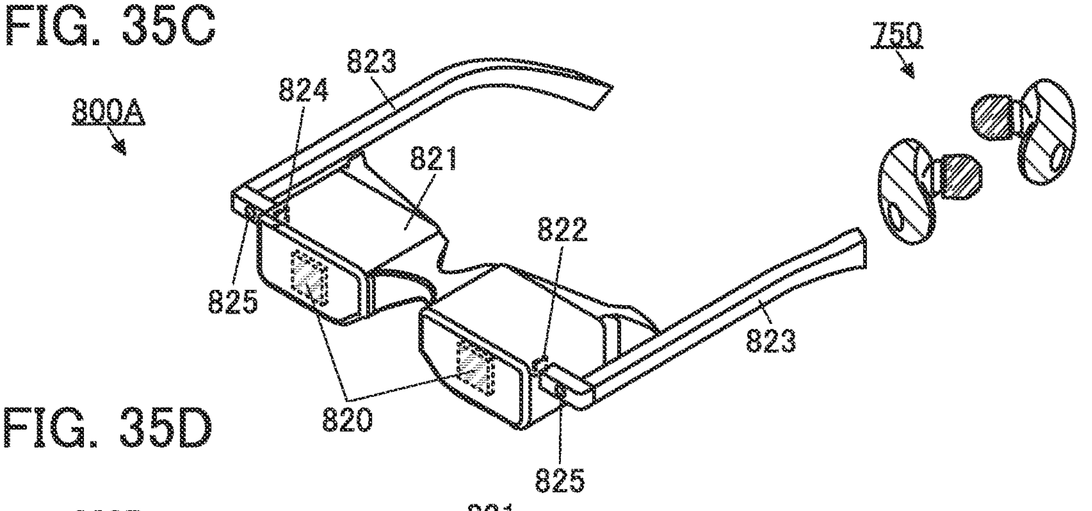
Figure 35D:
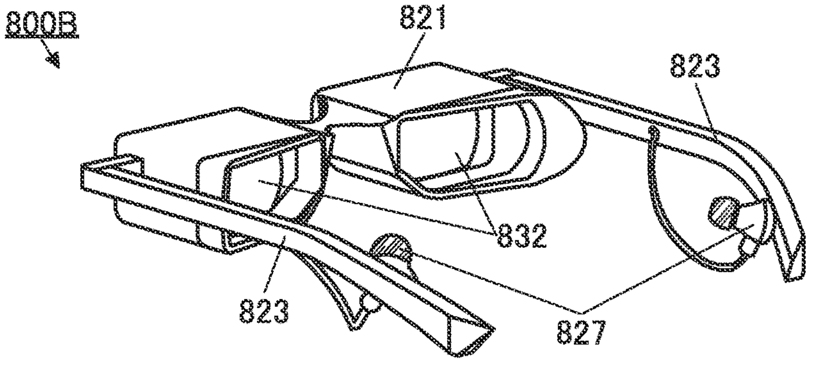

An electronic device 800A illustrated in FIG. 35C and an electronic device 800B illustrated in FIG. 35D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide a high sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions

823. FIG. 35C and the like illustrate examples where the wearing portion 823 has a shape like a temple of glasses; however, the shape of the wearing portion 823 is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. In other words, the image capturing portion 825 is one embodiment of the sensing portion. As the sensing portion, an image sensor or a range image sensor such as a light detection and ranging (LIDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, any one or more of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 35A has a function of transmitting information to the earphones 750 with the wireless communication function. As another example, the electronic device 800A in FIG. 35C has a function of transmitting information to the earphones 750 with the wireless communication function.

The electronic device may include an earphone portion. The electronic device 700B in FIG. 35B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 35D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 36A:
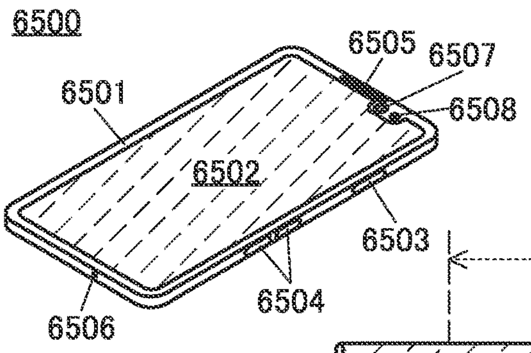
FIG. 36A to FIG. 36F are diagrams illustrating examples of electronic devices.

An electronic device 6500 illustrated in FIG. 36A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502. In the display apparatus of one embodiment of the present invention, light emitted from the light-emitting portion is extracted through a lens; thus, high light extraction efficiency can be achieved and an extremely bright image can be displayed.

Figure 36B:
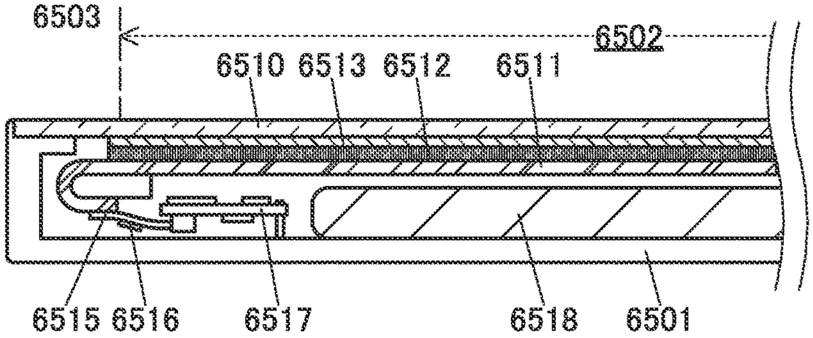

FIG. 36B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated). The light-receiving device of the display apparatus of one embodiment of the present invention can have the function of the touch sensor panel. The light-receiving device of the display apparatus of one embodiment of the present invention is configured to detect light through a lens, has high sensitivity to light, and excels in detecting a touched position. Moreover, an image for fingerprint authentication can be obtained with the use of the light-receiving device.

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. An electronic device with a narrow frame can be obtained when part of the display panel 6511 is folded back so that the portion connected to the FPC 6515 is positioned on the rear side of a pixel portion.

Figure 36C:
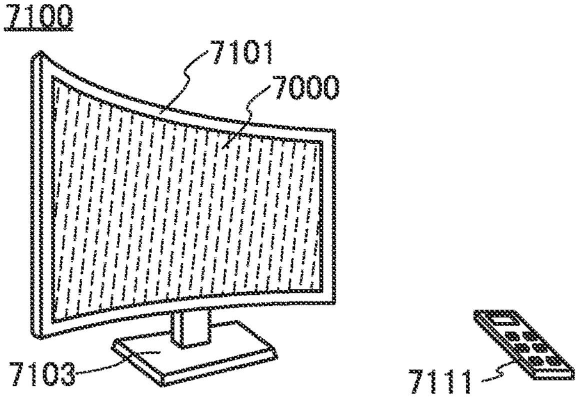

FIG. 36C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000. In the display apparatus of one embodiment of the present invention, light emitted from the light-emitting portion is extracted through a lens; thus, high light extraction efficiency can be achieved and an extremely bright image can be displayed.

Operation of the television device 7100 illustrated in FIG. 36C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network by wire or wirelessly via the modem, one-way (from a transmitter to a receiver) or two-way (between a transmitter and a receiver or between receivers, for example) information communication can be performed.

Figure 36D:
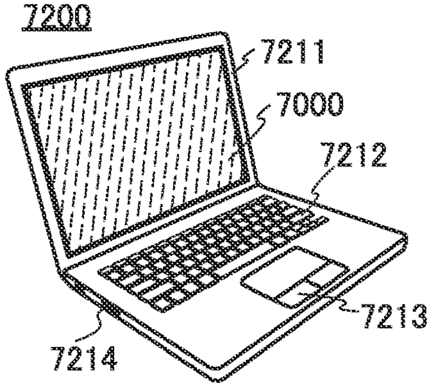

FIG. 36D illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000. In the display apparatus of one embodiment of the present invention, light emitted from the light-emitting portion is extracted through a lens; thus, high light extraction efficiency can be achieved and an extremely bright image can be displayed.

Figure 36E:
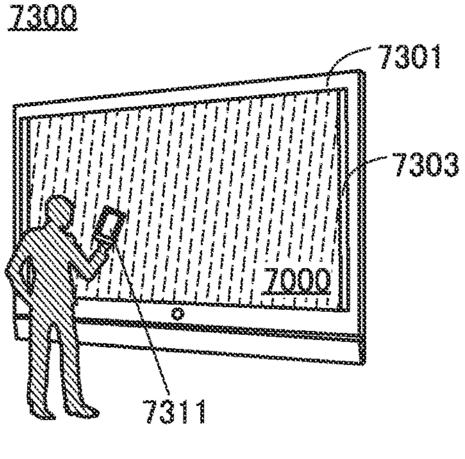
Figure 36F:
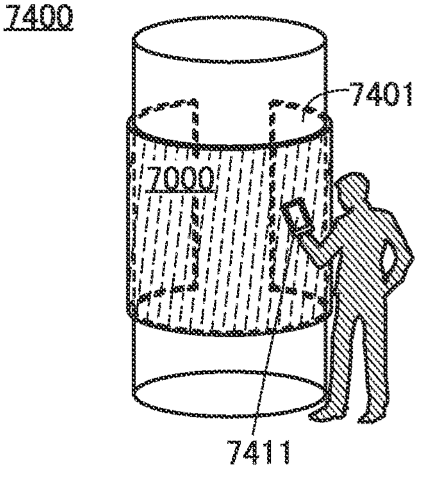

FIG. 36E and FIG. 36F illustrate examples of digital signage.

Digital signage 7300 illustrated in FIG. 36E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 36F illustrates digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 illustrated in each of FIG. 36E and FIG. 36F. In the display apparatus of one embodiment of the present invention, light emitted from the light-emitting portion is extracted through a lens; thus, high light extraction efficiency can be achieved and an extremely bright image can be displayed.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation. The touch panel can include the light-receiving device of the display apparatus of one embodiment of the present invention. The light-receiving device of the display apparatus of one embodiment of the present invention is configured to detect light through a lens and has high sensitivity to light. Thus, the touch panel can have high sensitivity and excel in detecting a touched position.

As illustrated in FIG. 36E and FIG. 36F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 37A to FIG. 37G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 37A to FIG. 37G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of capturing a still image or a moving image and storing the captured image in a recording medium (an external recording medium or a recording medium incorporated in the camera), a function of displaying the captured image on the display portion, or the like.

The electronic devices in FIG. 37A to FIG. 37G will be described in detail below. Note that the display apparatus of one embodiment of the present invention can be applied to these electronic devices. In the display apparatus of one embodiment of the present invention, light emitted from the light-emitting portion is extracted through a lens; thus, high light extraction efficiency can be achieved and an extremely bright image can be displayed. These electronic devices can each have a function of a touch sensor panel. The light-receiving device of the display apparatus of one embodiment of the present invention can have the function of the touch panel. The light-receiving device of the display apparatus of one embodiment of the present invention is configured to detect light through a lens, has high sensitivity to light, and excels in detecting a touched position. Moreover, an image for fingerprint authentication can be obtained with the use of the light-receiving device.

Figure 37A:
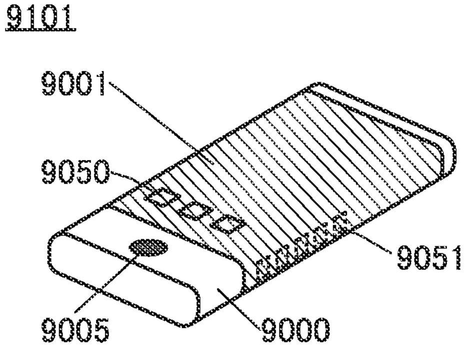
FIG. 37A to FIG. 37G are diagrams illustrating examples of electronic devices.

FIG. 37A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 37A illustrates an example where three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the radio field intensity. Alternatively, the icon 9050 or the like may be displayed at the position where the information 9051 is displayed.

Figure 37B:
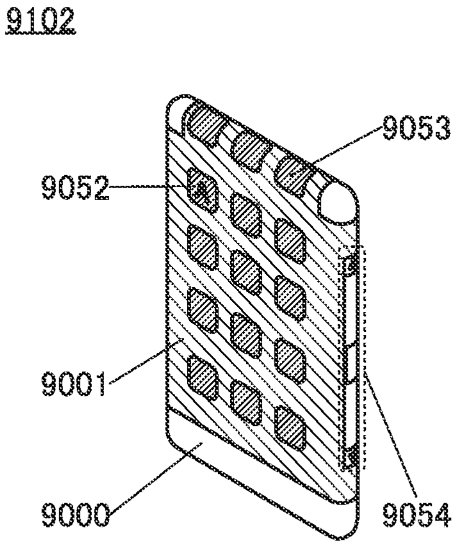

FIG. 37B is a perspective view of a portable information terminal 9102. The portable information terminal 9102 has a function of displaying information on three or more surfaces of the display portion 9001. Here, an example is illustrated in which information 9052, information 9053, and information 9054 are displayed on different surfaces. The user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call.

Figure 37C:
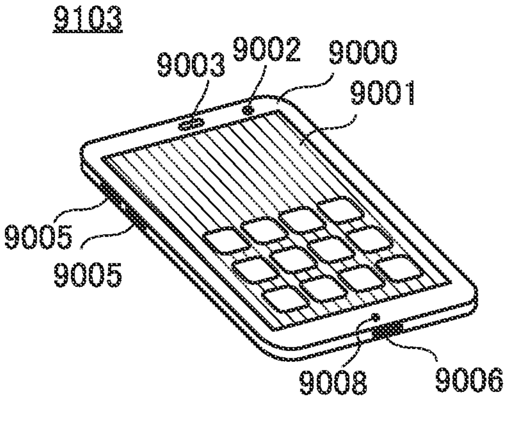

FIG. 37C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 37D:
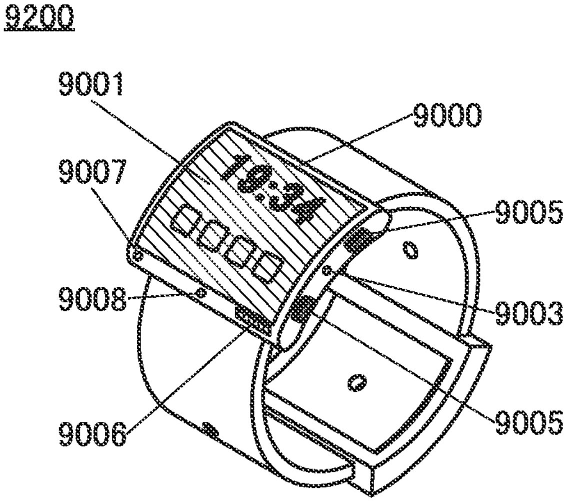

FIG. 37D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 37E:
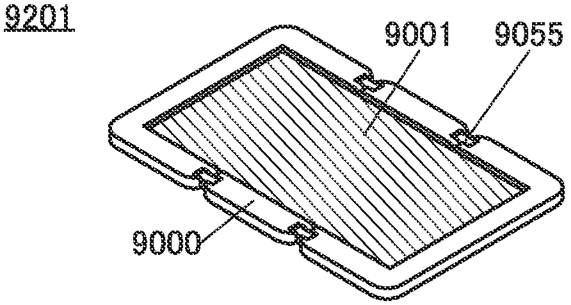
Figure 37F:
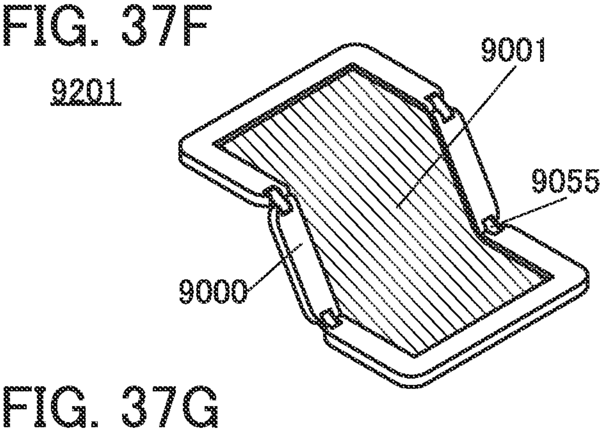
Figure 37G:
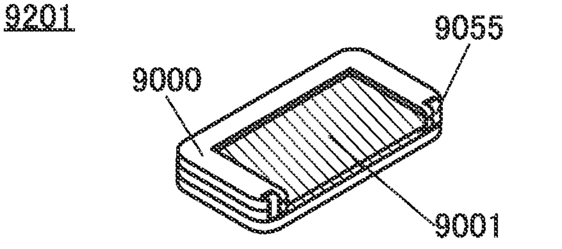

FIG. 37E to FIG. 37G are perspective views of a foldable portable information terminal 9201. FIG. 37E is a perspective view of an opened state of the portable information terminal 9201, FIG. 37G is a perspective view of a folded state thereof, and FIG. 37F is a perspective view of a state in the middle of change from one of FIG. 37E and FIG. 37G to the other. The portable information terminal 9201 is highly portable when folded. The portable information terminal 9201 is highly portable in the folded state and is highly browsable in the opened state because of a seamless large display region. The display portion 9001 of the portable information terminal 9201 is supported by the three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

REFERENCE NUMERALS

100A: display apparatus, 100B: display apparatus, 100C: display apparatus, 100D: display apparatus, 100E: display apparatus, 100F: display apparatus, 100G: display apparatus, 100J: display apparatus, 100: display apparatus, 101: layer, 103: region, 110*a*: subpixel, 110*b*: subpixel, 110*c*: subpixel, 110*d*: subpixel, 110*e*: subpixel, 110: pixel, 111*a*: pixel electrode, 111*b*: pixel electrode, 111*c*: pixel electrode, 111*d*: pixel electrode, 112*a*: conductive layer, 112*b*: conductive layer, 112*c*: conductive layer, 112*d*: conductive layer, 113*a*: first layer, 113A: film, 113*b*: second layer, 113B: film, 113*c*: third layer, 113C: film, 113*d*: fourth layer, 114: common layer, 115: common electrode, 117: light-blocking layer, 118*a*: mask layer, 118A: mask film, 118*b*: mask layer, 118B: mask film, 118*c*: mask layer, 118C: mask film, 118*d*: mask layer, 118: mask layer, 119*a*: mask layer, 119A: mask film, 119*b*: mask layer, 119B: mask film, 119*c*: mask layer, 119C: mask film, 120: substrate, 122: resin layer, 123: conductive layer, 124*a*: pixel, 124*b*: pixel, 125A: insulating film, 125: insulating layer, 126*a*: conductive layer, 126*b*: conductive layer, 126*c*: conductive layer, 126*d*: conductive layer, 127*a*: insulating film, 127*b*: insulating layer, 127: insulating layer, 128: layer, 129*a*: conductive layer, 129*b*: conductive layer, 129*c*: conductive layer, 129*d*: conductive layer, 130*a*: light-emitting device, 130B: light-emitting device, 130*b*: light-emitting device, 130*c*: light-emitting device, 130G: light-emitting device, 130R: light-emitting device, 131: protective layer, 132: mask, 133*a*: insulating film, 133*b*: insulating layer, 133: lens, 134: insulating layer, 140: connection portion, 142: adhesive layer, 150: light-receiving device, 151: substrate, 152: substrate, 162: display portion, 164: circuit, 165: wiring, 166: conductive layer, 172: FPC, 173: IC, 190*a*: resist mask, 190*b*: resist mask, 190*c*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*:

conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 700A: electronic device, 700B: electronic device, 721: housing, 723: wearing portion, 727: earphone portion, 750: earphone, 751: display panel, 753: optical member, 756: display region, 757: frame, 758: nose pad, 761: lower electrode, 762: upper electrode, 763*a*: EL layer, 763*b*: EL layer, 763: EL layer, 764: layer, 765: layer, 766: layer, 767: active layer, 768: layer, 771: light-emitting layer, 772: light-emitting layer, 773: light-emitting layer, 780: layer, 781: layer, 782: layer, 785: charge-generation layer, 790: layer, 791: layer, 792: layer, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal This application is based on Japanese Patent Application Serial No. 2021-129082 filed on Aug. 5, 2021; the entire contents are hereby incorporated herein by reference.

The invention claimed is:

1. A display apparatus comprising:

a first light-emitting device;

a second light-emitting device;

a first lens; and a second lens, wherein the first light-emitting device and the second light-emitting device are provided adjacent to each other, wherein an organic insulating layer is provided in a region comprising a space between the first light-emitting device and the second light-emitting device, wherein the first light-emitting device and the first lens comprise a region where the first light-emitting device and the first lens overlap with each other, wherein the second light-emitting device and the second lens comprise a region where the second light-emitting device and the second lens overlap with each other, wherein the first light-emitting device and the second light-emitting device each comprise a pair of electrodes and an organic compound provided between the pair of electrodes, wherein one of the pair of electrodes is a common electrode formed over the organic compound and the organic insulating layer, and is a conductive film having a light-transmitting property with respect to visible light, wherein the first lens and the second lens are provided in contact with the conductive film, wherein refractive indices of the first lens and the second lens are greater than a refractive index of the conductive film, and wherein the organic insulating layer, the first lens, and the second lens are formed using the same material.

2. A display apparatus comprising:

a light-emitting device;

a light-receiving device;

a first lens; and a second lens, wherein the light-emitting device and the light-receiving device are provided adjacent to each other, wherein an organic insulating layer is provided in a region comprising a space between the light-emitting device and the light-receiving device, wherein the light-emitting device and the first lens comprise a region where the light-emitting device and the first lens overlap with each other, wherein the light-receiving device and the second lens comprise a region where the light-receiving device and the second lens overlap with each other, wherein the light-emitting device and the light-receiving device each comprise a pair of electrodes and an organic compound provided between the pair of electrodes, wherein one of the pair of electrodes is a common electrode formed over the organic compound and the organic insulating layer, and is a conductive film having a light-transmitting property with respect to visible light, wherein the first lens and the second lens are provided in contact with the conductive film, and wherein refractive indices of the first lens and the second lens are greater than a refractive index of the conductive film.

3. The display apparatus according to claim 1, wherein the first lens and the second lens are each a plano-convex lens and provided so that a surface opposite to a convex surface is in contact with the conductive film.

4. The display apparatus according to claim 1, wherein an inorganic insulating layer is provided between the organic compound and the organic insulating layer.

5. The display apparatus according to claim 1, wherein a top surface of the organic insulating layer has a convex curved shape.

6. An electronic device comprising:

the display apparatus according to claim 1; and an optical member, wherein the display apparatus can project display on the optical member, wherein the optical member can transmit light, and wherein viewing the optical member allows visual recognition of an image obtained by overlapping the display and an image transmitted through the optical member.

7. The display apparatus according to claim 2, wherein the organic insulating layer, the first lens, and the second lens are formed using the same material.

8. The display apparatus according to claim 2, wherein the first lens and the second lens are each a plano-convex lens and provided so that a surface opposite to a convex surface is in contact with the conductive film.

9. The display apparatus according to claim 2, wherein an inorganic insulating layer is provided between the organic compound and the organic insulating layer.

10. The display apparatus according to claim 2, wherein a top surface of the organic insulating layer has a convex curved shape.

11. An electronic device comprising:

the display apparatus according to claim 1; and an optical member, wherein the display apparatus can project display on the optical member, wherein the optical member can transmit light, and wherein viewing the optical member allows visual recognition of an image obtained by overlapping the display and an image transmitted through the optical member.

12. An electronic device comprising:

the display apparatus according to claim 2; and an optical member, wherein the display apparatus can project display on the optical member, wherein the optical member can transmit light, and wherein viewing the optical member allows visual recognition of an image obtained by overlapping the display and an image transmitted through the optical member.

* * * * *